(12) United States Patent
Kooiman et al.

(10) Patent No.: US 12,332,573 B2
(45) Date of Patent: Jun. 17, 2025

(54) METHOD FOR DETERMINING DEFECTIVENESS OF PATTERN BASED ON AFTER DEVELOPMENT IMAGE

(71) Applicant: ASML Netherlands B.V., Veldhoven (NL)

(72) Inventors: Marleen Kooiman, Eindhoven (NL); Maxim Pisarenco, Son en Breugel (NL); Abraham Slachter, Waalre (NL); Mark John Maslow, Eindhoven (NL); Bernardo Andres Oyarzun Rivera, Rotterdam (NL); Wim Tjibbo Tel, Helmond (NL); Ruben Cornelis Maas, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 642 days.

(21) Appl. No.: 17/640,792

(22) PCT Filed: Sep. 3, 2020

(86) PCT No.: PCT/EP2020/074663
§ 371 (c)(1),
(2) Date: Mar. 4, 2022

(87) PCT Pub. No.: WO2021/043936
PCT Pub. Date: Mar. 11, 2021

(65) Prior Publication Data
US 2022/0342316 A1    Oct. 27, 2022

(30) Foreign Application Priority Data

Sep. 5, 2019  (EP) .................................. 19195527
Sep. 10, 2019 (EP) .................................. 19196323
(Continued)

(51) Int. Cl.
G06T 7/33    (2017.01)
G03F 7/00    (2006.01)
G06T 7/00    (2017.01)

(52) U.S. Cl.
CPC ............ G03F 7/7065 (2013.01); G03F 7/705 (2013.01); G03F 7/70625 (2013.01);
(Continued)

(58) Field of Classification Search
CPC .... G03F 7/7065; G03F 7/705; G03F 7/70625; G03F 7/70616; G06T 7/001; G06T 7/33;
(Continued)

(56) References Cited

U.S. PATENT DOCUMENTS

| 2002/0107650 A1 | 8/2002 | Wack et al. |
| 2007/0061772 A1 | 3/2007 | Ye et al. |

(Continued)

FOREIGN PATENT DOCUMENTS

| CN | 107728589 A | 2/2018 |
| EP | 3462240 A1 | 4/2019 |

(Continued)

OTHER PUBLICATIONS

Seiro Miyoshi et al: "Novel prediction methodology for etched hole patterning failure", Proceedings of SPIE, vol. 8324, Mar. 9, 2012 (Mar. 9, 2012), p. 83241J, XP055673753, 1000 20th St. Bellingham WA 98225-6705 USA ISSN: 0277-786X, DOI: 10.1117/12.916029 ISBN: 978-1-5106-3927-0 (Year: 2012).*

(Continued)

*Primary Examiner* — Charlotte M Baker
(74) *Attorney, Agent, or Firm* — FINNEGAN, HENDERSON, FARABOW, GARRETT & DUNNER LLP

(57) ABSTRACT

Described herein is a method of training a model configured to predict whether a feature associated with an imaged
(Continued)

substrate will be defective after etching of the imaged substrate and determining etch conditions based on the trained model. The method includes obtaining, via a metrology tool, (i) an after development image of the imaged substrate at a given location, the after development image including a plurality of features, and (ii) an after etch image of the imaged substrate at the given location; and training, using the after development image and the after etch image, the model configured to determine defectiveness of a given feature of the plurality of features in the after development image. In an embodiment, the determining of defectiveness is based on comparing the given feature in the after development image with a corresponding etch feature in the after etch image.

15 Claims, 43 Drawing Sheets

(30) Foreign Application Priority Data

| | | |
|---|---|---|
| Dec. 19, 2019 | (EP) | 19218296 |
| Apr. 10, 2020 | (EP) | 20169181 |
| May 25, 2020 | (EP) | 20176236 |
| Aug. 6, 2020 | (EP) | 20189952 |

(52) U.S. Cl.
CPC ............... *G06T 7/001* (2013.01); *G06T 7/33* (2017.01); *G06T 2207/10061* (2013.01); *G06T 2207/20081* (2013.01); *G06T 2207/20084* (2013.01); *G06T 2207/30148* (2013.01)

(58) Field of Classification Search
CPC . G06T 2207/10061; G06T 2207/20081; G06T 2207/20084; G06T 2207/30148; G06T 7/0008; G06T 2207/20076; G06T 2207/20224
USPC ......................................................... 382/144
See application file for complete search history.

(56) References Cited

U.S. PATENT DOCUMENTS

| | | |
|---|---|---|
| 2009/0157360 A1 | 6/2009 | Ye et al. |
| 2018/0164792 A1 | 6/2018 | Lin et al. |
| 2018/0275523 A1 | 9/2018 | Biafore et al. |
| 2019/0005357 A1* | 1/2019 | Bhaviripudi ...... G06F 18/24133 |

FOREIGN PATENT DOCUMENTS

| | | |
|---|---|---|
| TW | 201843533 A | 12/2018 |
| TW | 201905588 A | 2/2019 |
| TW | 201928528 A | 7/2019 |
| WO | WO 2018/125219 A1 | 7/2018 |
| WO | WO 2019/162346 A1 | 8/2019 |

OTHER PUBLICATIONS

Office Action of the intellectual Property Office of Taiwan issued in related Taiwanese Patent Application No. 111136792; mailed Aug. 4, 2023 (18 pgs.).
International Search Report and Written Opinion issued by the International Searching Authority in related International Application No. PCT/EP2020/074663, mailed Feb. 9, 2021 (14 pgs.).
Office Action issued by the Intellectual Property Office (IPO) in related ROC (Taiwan) Patent Application No. 109130441, issued Nov. 12, 2021 (15 pgs.).
https://en.wikipedia.org/wiki/Generalized_extreme_value_distribution.
https://en.wikipedia.org/wiki/Truncated_normal_distribution.
G. Andrew et al., "Deep Canonical Correlation Analysis," Proceedings of the 30$^{th}$ International Conference on Machine Learning, Atlanta, Georgia, USA, 2013. JMLR: W&CP vol. 28. Copyright 2013 by the author(s).
A. Kraskov et al., "Estimating mutual information". The American Physical Society, Physical Review E 69, 066138 (2004).
O. Inoue et al., "Review of scanning electron microscope-based overlay measurement beyond 3-nm node device", J. Micro/Nanolithography, MEMS MOEMS 18(2), 021206 (Apr.-Jun. 2019).
M. J. Maslow et al., "Impact of Local Variability on Defect-Aware Process Windows," Proceedings of SPIE 10957, Extreme Ultraviolet (EUV) Lithography X, 109570H (Mar. 26, 2019).
P. De Bisschop et al., "Stochastic effects in EUV Lithography," Proceedings of SPIE 10583, Extreme Ultraviolet (EUV) Lithography IX, 105831K (Mar. 19, 2018); doi: 10.1117/12.2300541.
S. Miyoshi et al., "Novel prediction methodology for etched hole patterning failure", SPIE—International Society for Optical Engineering. Proceedings, vol. 8324, Mar. 9, 2012, p. 843, 83241J, XP055673753, US.

* cited by examiner

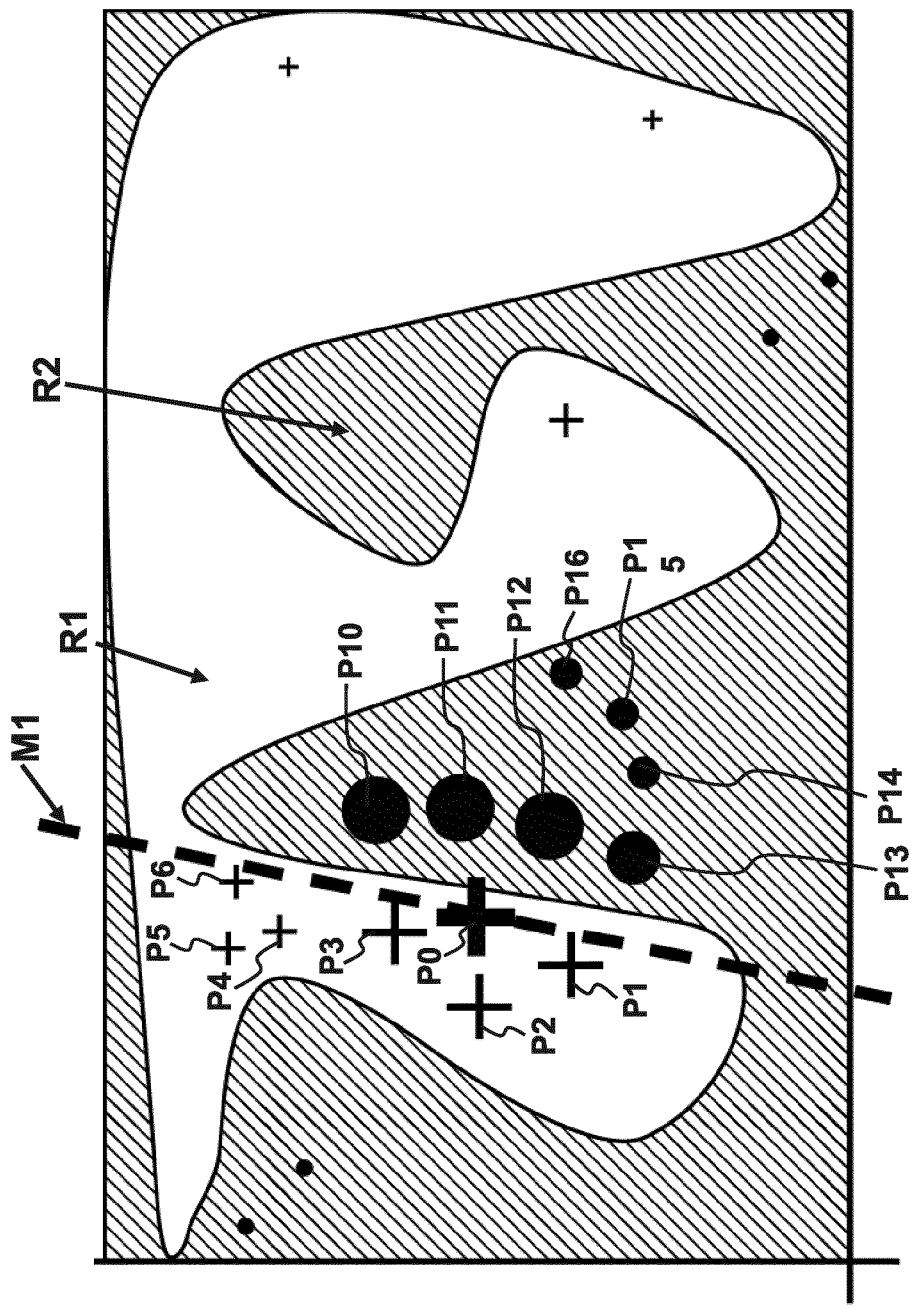

METHOD FOR DETERMINING DEFECTIVENESS OF PATTERN BASED ON AFTER DEVELOPMENT IMAGE

CROSS-REFERENCE TO RELATED APPLICATIONS

This application claims priority to International Application No. PCT/EP2020/074663, filed Sep. 3, 2020, and published as WO 2021/043936 A1, which claims priority of EP Application Serial No. 19195527.7, which was filed on Sep. 5, 2019 ; and EP Application Serial No. 19196323.0, which was filed on Sep. 10, 2019; and EP Application Serial No. 19218296.2, which was filed on Dec. 19, 2019; and EP Application Serial No. 20169181.3, which was filed on Apr. 10, 2020; and EP Application Serial No. 20176236.6, which was filed on May 25, 2020; and EP Application Serial No. 20189952.3 which was filed on Aug. 6, 2020, and EP Application Serial No. 20192283.8 which was filed on Aug. 21, 2020 . The contents of these applications are incorporated herein by reference in their entireties.

FIELD

The present disclosure relates to techniques of improving determination of a defective pattern to further improve a device manufacturing process. The techniques may be used in connection with a lithographic apparatus.

BACKGROUND

Manufacturing semiconductor devices typically involves processing a substrate (e.g., a semiconductor wafer) using a number of fabrication processes to form various features and multiple layers of the semiconductor device. Such layers and features are typically manufactured and processed using, e.g., deposition, lithography, etch, chemical-mechanical polishing, and ion implantation. Multiple devices may be fabricated on different locations on a substrate and then separated into individual devices. This device manufacturing process may be considered a patterning process. A patterning process can include a patterning step to transfer a pattern from a patterning device to the substrate. Also, there can then be one or more related pattern processing steps, such as resist development by a development apparatus, baking of the substrate using a bake tool, etching the pattern onto the substrate using an etch apparatus, measurement/inspection of the transferred circuit pattern, etc. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate.

SUMMARY

In an embodiment, there is provided a method of training a model configured to predict whether a feature associated with an imaged substrate will be defective after etching of the imaged substrate. The method includes obtaining, via a metrology tool, (i) an after development image of the imaged substrate at a given location, the after development image including a plurality of features, and (ii) an after etch image of the imaged substrate at the given location, the after etch image including etched features corresponding to the plurality of features; and training, using the after development image and the after etch image, the model configured to determine defectiveness of a given feature of the plurality of features in the after development image. In an embodiment, the determining of defectiveness is based on comparing the given feature in the after development image with a corresponding etch feature in the after etch image.

Furthermore, there is provided a method for determining etch conditions for an imaged substrate. The method includes obtaining an after development image of the imaged substrate, and initial etch conditions to be used for etching the imaged substrate; determining, via a trained model using the after development image and the initial etch conditions, a failure rate of a feature associated with the imaged substrate, the failure rate being indicative of the feature being defective after etching of the imaged substrate; and modifying, based on the failure rate, the initial etch conditions such that chances of the feature being defective after etching is reduced.

Furthermore, there is provided a method of determining an etch characteristic associated with an etch process. The method includes obtaining, via a metrology tool, (i) an after development image (ADI) of an imaged pattern at a given location of a substrate, the imaged pattern includes a feature of interest and neighboring features adjacent to the feature of interest, and (ii) an after etch image (AEI) of the imaged pattern at the given location of the substrate, the AEI includes an etched feature corresponding to the feature of interest in the ADI; and determining, using the ADI and the AEI, a correlation between the etched feature and the neighboring features associated with the feature of interest in the ADI, the correlation characterizes the etch characteristic associated with the etching process.

Furthermore, there is provided a method of determining an etch condition associated with an etch process. The method includes obtaining a correlation between an etched feature of interest in an after etch image (AEI) and a neighboring feature associated with the etched feature of interest in an after development image (ADI); and determining, based on the correlation, the etch condition associated with the etch process so that the correlation remains within a target range.

Furthermore, in an embodiment, there is provided a method of developing an interpretation model configured to interpret a prediction generated by a trained model. The method includes obtaining, via executing the trained model, a data set, the data set comprising a plurality of predictions associated with a plurality of features in an after development image (ADI), the ADI including a feature of interest, each prediction of the plurality of predictions being made by the trained model; determining distances between each location of the plurality of features and the feature of interest; assigning, based on the distances, weights to each prediction of the plurality of predictions; and determining, based on the weighted predictions, model parameter values of the interpretation model so that a difference between an output of the interpretation model and the weighted predictions is reduced. In an embodiment, the model parameter values indicate contributions of each pixel of the ADI towards the prediction related to the feature of interest.

Furthermore, in an embodiment, there is provided a method for identifying contributions of pixels of an after development image towards a prediction generated by a trained model. The method includes obtaining (i) the after development image (ADI) including a feature of interest using a metrology tool, and (ii) an interpretation model configured to interpret a prediction related to the feature of interest, the prediction being generated via the trained model; and applying the interpretation model to the ADI image to generate an interpretation map, the interpretation map comprising pixel values that quantify contributions of each pixel of the ADI image towards the prediction of the feature of interest.

Furthermore, in an embodiment, there is provided a computer program product comprising a non-transitory computer readable medium having instructions recorded thereon, the instructions when executed by a computer system implementing the aforementioned methods.

Furthermore, in an embodiment, there is provided a method of developing a model for determining failure rates of features in an after development image. The method includes obtaining the after development image (ADI) of a substrate, the ADI comprising a plurality of features; generating a first part of the model based on physical characteristic values related to a subset of features of the ADI; and generating a second part of the model based upon the first part of the model and the physical characteristic values related to all the features of the plurality of features of the ADI, wherein the subset of features of the ADI are differentiated from other features of the ADI.

Furthermore, in an embodiment, there is provided a system for determining a fraction of features that will fail after etching. The system includes a metrology tool for capturing an after development image (ADI) of a substrate at a given location, the after development image including a plurality of features; and a processor configured to: execute a model for determining failure rates of the plurality of features of ADI that will fail after etching. The model is a combination of (i) a first probability distribution function configured to estimate distribution of the physical characteristic values for non-failing holes, and (ii) a second probability distribution function configured to determine failure rates based on physical characteristic values of all the plurality of features of the ADI.

Furthermore, in an embodiment, there is provided a non-transitory computer-readable media comprising instructions that, when executed by one or more processors, cause operations comprising: obtaining the after development image (ADI) of a substrate, the ADI comprising a plurality of features; generating a first part of the model based on physical characteristic values related to a subset of features of the ADI; and generating a second part of the model based upon the first part of the model and the physical characteristic values related to all the features of the plurality of features of the ADI, wherein the subset of features of the ADI are differentiated from other features of the ADI.

Furthermore, in an embodiment, there is provided a method of training a model configured to determine an after etch image (AEI) feature based on an after development image (ADI) feature, the method including: obtaining (i) a measurement of an ADI feature imaged on a substrate, and (ii) a measurement of an after etch image (AEI) feature, corresponding to the measured ADI feature, on the substrate subjected to an etch process; assigning a first set of variables to characterize the measured ADI feature and a second set of variables to characterize the measured AEI feature; determining a correlation between a combination of the first set of variables of the measured ADI feature and a combination of the second set of variables of the measured AEI feature; and training, based on the correlation, the model by including one or more sub-combinations of the first set of variables that have correlation values within a specified correlation threshold, the model being used to determine an AEI feature for an input ADI feature.

Furthermore, in an embodiment, there is provided a metrology tool including a beam generator configured to measure an ADI feature after imaging a substrate and an AEI feature after etching the substrate; and a processor. The processor is configured to: obtain a correlation between the measured ADI feature, and the measured AEI feature corresponding to the measured ADI feature printed on a substrate subjected to an etch process, the correlation being based on a combination of variables characterizing how the measured ADI feature transforms to the AEI feature; and adjust, based on the correlation, the settings of the metrology tool to cause the correlation to improve, the settings being determined based on a derivative of the correlation with respect to each setting, the derivative indicative of an improvement in the correlation per setting of the metrology tool.

Furthermore, in an embodiment, there is provided a method of training a model configured to determine an after etch image (AEI) based on an after development image (ADI), the method including obtaining (i) an ADI of an imaged substrate, and (ii) an after etch image (AEI) after etching the imaged substrate; determining a correlation between a combination of a first set of variables of the ADI and a combination of a second set of variables of AEI, the first set and the second set of variables being grey scale values of the ADI and AEI, respectively; and training, based on the correlation, the model by including one or more sub-combinations of the first set of variables that have correlation values within a specified correlation threshold, the model being used to determine an AEI for an input ADI.

Furthermore, in an embodiment, there is provided a method for determining an after etch image (AEI) based on an after development image (ADI). The method includes obtaining an ADI of a substrate; and determining, via a trained model, an AEI by inputting the ADI to the trained model and outputting the ADI, the trained model being trained based on a correlation between a combination of a first set of variables of a measured ADI and a combination of a second set of variables of a measured AEI, the correlation being within a specified correlation threshold.

Furthermore, in an embodiment, there is provided a non-transitory computer-readable media comprising instructions that, when executed by one or more processors, cause operations to determine an after etch image (AEI) feature based on an after development image (ADI) feature. The operations comprising: obtaining an ADI of a substrate; and determining, via a trained model, an AEI by inputting the ADI to the trained model and outputting the ADI, the trained model being trained based on a correlation between a combination of a first set of variables of a measured ADI and a combination of a second set of variables of a measured AEI, the correlation being within a specified correlation threshold.

Furthermore, in an embodiment, there is provided a non-transitory computer-readable media comprising instructions that, when executed by one or more processors, cause operations to train a model configured to determine an after etch image (AEI) feature based on an after development image (ADI) feature, the operations including: obtaining (i) a measurement of an ADI feature imaged on a substrate, and (ii) a measurement of an after etch image (AEI) feature, corresponding to the measured ADI feature, on the substrate subjected to an etch process; assigning a first set of variables to characterize the measured ADI feature and a second set of variables to characterize the measured AEI feature; determining a correlation between a combination of the first set of variables of the measured ADI feature and a combination of the second set of variables of the measured AEI feature; and training, based on the correlation, the model by including one or more sub-combinations of the first set of variables that have correlation values within a specified correlation threshold, the model being used to determine an AEI feature for an input ADI feature.

Furthermore, in an embodiment, there is provided a non-transitory computer-readable media comprising instructions that, when executed by one or more processors, cause operations to train a model configured to determine an after etch image (AEI) based on an after development image (ADI), the operations including obtaining (i) an ADI of an imaged substrate, and (ii) an after etch image (AEI) after etching the imaged substrate; determining a correlation between a combination of a first set of variables of the ADI and a combination of a second set of variables of AEI, the first set and the second set of variables being grey scale values of the ADI and AEI, respectively; and training, based on the correlation, the model by including one or more sub-combinations of the first set of variables that have correlation values within a specified correlation threshold, the model being used to determine an AEI for an input ADI.

BRIEF DESCRIPTION OF THE DRAWINGS

Embodiments will now be described, by way of example only, with reference to the accompanying drawings in which:

FIG. 13 illustrates a decision data set (obtained using trained model of FIG. 4A) used to train an example interpretation model, according to an embodiment;

DETAILED DESCRIPTION

Figure 1:
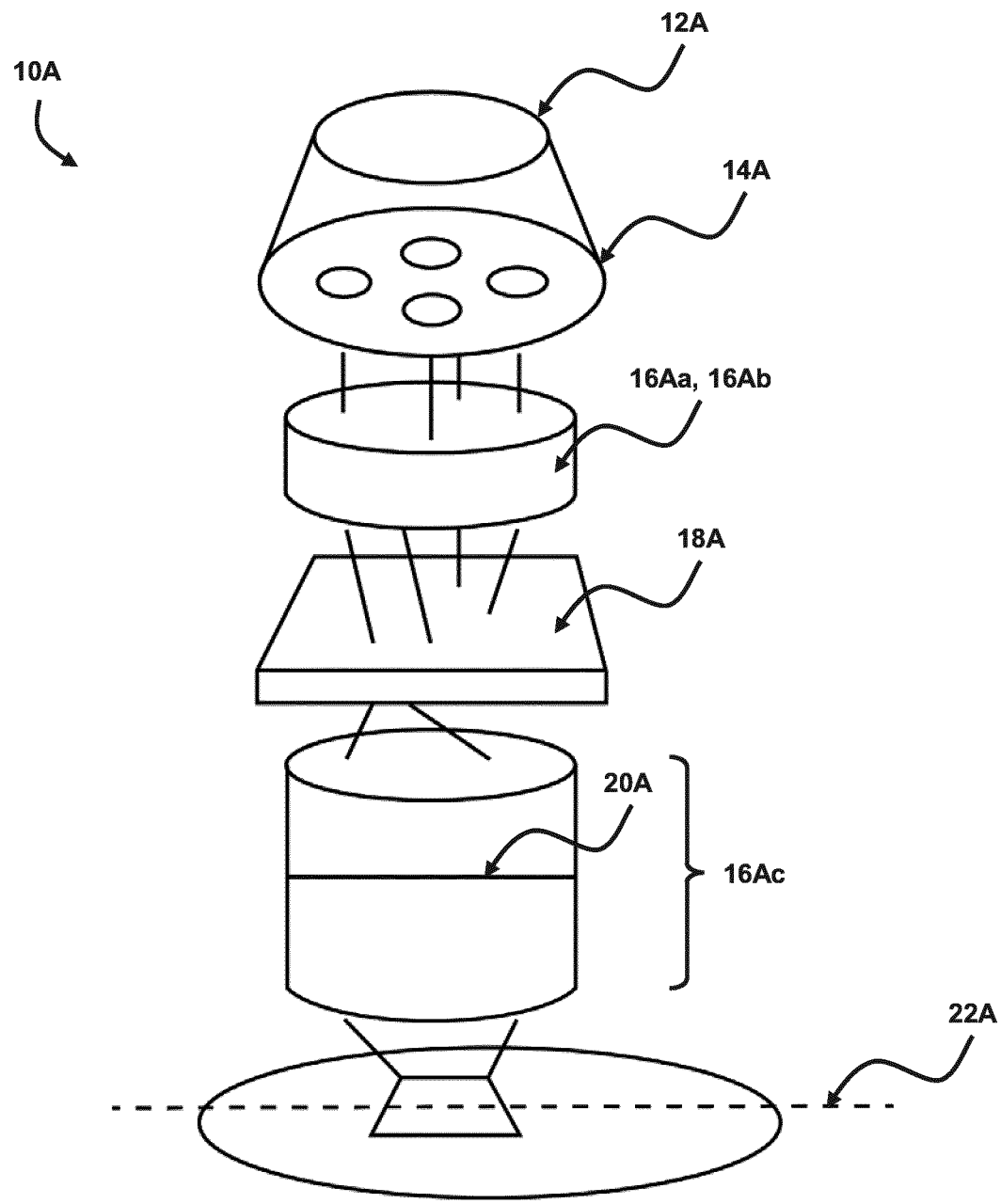
FIG. 1 shows a block diagram of various subsystems of a lithography system, according to an embodiment.

Computing power of electronic devices has followed a pattern of increased power and reduced physical size over the years. This has been achieved by increasing the number of circuit components (transistors, capacitors, diodes, etc.) on each integrated circuit (IC) chip. For example, an IC chip in a smart phone, can be as small as a person's thumbnail, and may include over 2 billion transistors, the size of each transistor being less than 1/1000th the size of a human hair.

Making an IC is a complex and time-consuming process, with circuit components in different layers and including hundreds of individual steps. Errors in even one step have the potential to result in problems with the final IC. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

A corresponding difficulty that is in conflict with high yield is the goal of maintaining a fast production schedule (known as throughput, or the number of wafers processed per hour, for example). High process yield and high wafer throughput can be impacted by the presence of defects, especially if operator intervention is required for reviewing the defects. Thus, high throughput detection and identification of tiny defects by inspection tools (such as an optical or electron microscope (SEM)) is essential for maintaining high yield and low cost.

Because the microscopes used for defect detection can only see a small part of the wafer at a time, defect detection can be very time consuming, reducing overall throughput. For example, if every location on a wafer had to be inspected to find defects, wafer throughput could be significantly reduced, as the time it would take to inspect every location on every IC on a wafer would be very long. One approach to this problem is to make use of techniques that predict a defect location based on information obtained from a photolithography system, which is a system used in the manufacture of IC chips. In an example, defect inspection may be performed after imaging or post-process such as after etch. In an example, rather than inspecting every location on a wafer after etch to find defects, prediction may be made of possible defects based on after development process. In an example, a better model may be configured to more accurately predict possible failures after etch based on a process output prior to the etching process. For example, the model includes a first part specifically related to non-failing holes, and a second part specifically related to failing holes. In an embodiment, the model is determined based on measurements of same structure at least twice (e.g., using SEM metrology tool). The difference between the two SEM measurements can be used to develop the model or classify failure of the features, before etching process. Advantages of such defect prediction are the etching conditions may be adjusted, or a significantly reduced number of locations may be inspected, enabling a corresponding reduction in inspection time and increase in wafer throughput. In another example, a correlation between, e.g., after development and after etch may be established, so that etching process can be controlled based on such correlation. An advantage of such correlation-based process control will effectively be used to reduce defects after etching thereby improving the yield of the patterning process.

FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin(Θmax), wherein n is the refractive index of the media between the substrate and the last element of the projection optics, and Θmax is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

Figure 3:
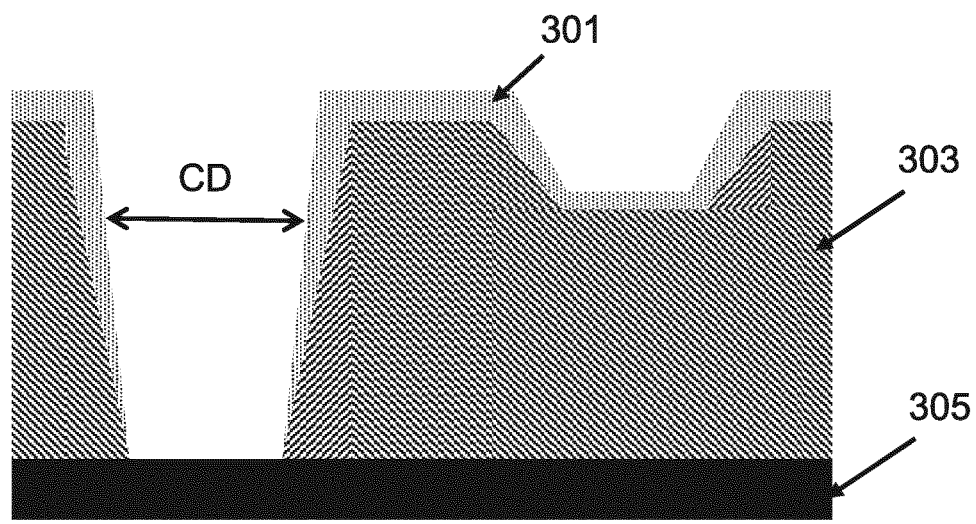
FIG. 3 illustrates an after SEM damage of a substrate, according to an embodiment.

In an embodiment, assist features (sub resolution assist features and/or printable resolution assist features) may be placed into the design layout based on how the design layout optimized according to the methods of the present disclosure. For example, in an embodiment, the methods employ a machine learning based model to determine a patterning device pattern. The machine learning model may be a neural network such as a convolution neural network that can be trained in a certain way (e.g., as discussed in FIG. 3) to obtain accurate predictions at a fast rate, thus enabling a full-chip simulation of the patterning process.

A neural network may be trained (i.e., whose parameters are determined) using a set of training data. The training data may comprise or consist of a set of training samples. Each sample may be a pair comprising or consisting of an input object (typically a vector, which may be called a feature vector) and a desired output value (also called the supervisory signal). A training algorithm analyzes the training data and adjusts the behavior of the neural network by adjusting the parameters (e.g., weights of one or more layers) of the neural network based on the training data. The neural network after training can be used for mapping new samples.

In the context of determining a patterning device pattern, the feature vector may include one or more characteristics (e.g., shape, arrangement, size, etc.) of the design layout comprised or formed by the patterning device, one or more characteristics (e.g., one or more physical properties such as a dimension, a refractive index, material composition, etc.) of the patterning device, and one or more characteristics (e.g., the wavelength) of the illumination used in the lithographic process. The supervisory signal may include one or more characteristics of the patterning device pattern (e.g., critical dimension (CD), contour, etc. of the patterning device pattern).

Given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network g: X→Y, where X is the input space and Y is the output space. A feature vector is an n-dimensional vector of numerical features that represent some object. The vector space associated with these vectors is often called the feature space. It is sometimes convenient to represent g using a scoring function f: X×Y→$\mathbb{R}$ such that g is defined as returning the y value that gives the highest score:

$$g(x) = \arg\max_y f(x, y).$$

Let F denote the space of scoring functions.

The neural network may be probabilistic where g takes the form of a conditional probability model g(x)=P(y|x), or f takes the form of a joint probability model f(x, y)=P(x, y).

There are two basic approaches to choosing for g: empirical risk minimization and structural risk minimization. Empirical risk minimization seeks the neural network that best fits the training data. Structural risk minimization includes a penalty function that controls the bias/variance tradeoff. For example, in an embodiment, the penalty function may be based on a cost function, which may be a squared error, number of defects, edge placement error (EPE), etc. The functions (or weights within the function) may be modified so that the variance is reduced or minimized.

In both cases, it is assumed that the training set comprises or consists of one or more samples of independent and identically distributed pairs $(x_i, y_i)$. In an embodiment, in order to measure how well a function fits the training data, a loss function L: Y×Y→$\mathbb{R}^{\geq 0}$ is defined. For training sample $(x_i, y_i)$, the loss of predicting the value $\hat{y}$ is $L(y_i, \hat{y})$.

The risk R(g) of function g is defined as the expected loss of g. This can be estimated from the training data as $$R_{emp}(g) = \frac{1}{N}\sum_i L(y_i, g(x_i)).$$

In an embodiment, machine learning models of the patterning process can be trained to predict, for example, contours, patterns, CDs for a mask pattern, and/or contours, CDs, edge placement (e.g., edge placement error), etc. in the resist and/or etched image on a wafer. An objective of the training is to enable accurate prediction of, for example, contours, aerial image intensity slope, and/or CD, etc. of the printed pattern on a wafer. The intended design (e.g., a wafer target layout to be printed on a wafer) is generally defined as a pre-OPC design layout which can be provided in a standardized digital file format such as GDSII or OASIS or other file format.

Figure 2:
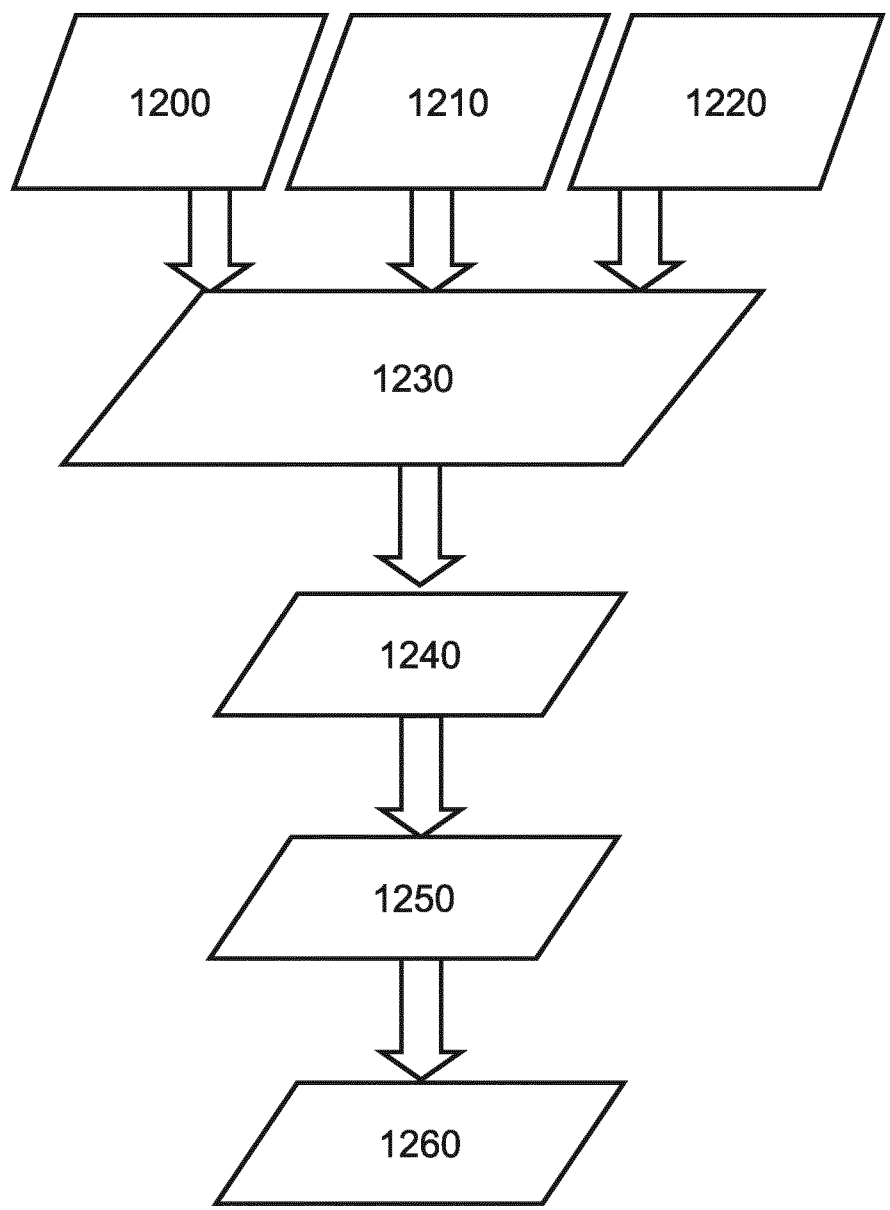
FIG. 2 depicts an example flow chart for modeling or simulating at least part of a patterning process, according to an embodiment.

An exemplary flow chart for modelling and/or simulating parts of a patterning process is illustrated in FIG. 2. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

In patterning processes, like photolithography, electron beam lithography, directed self-assembly, etc., an energy sensitive material (e.g., photoresist) deposited on the substrate typically undergoes a pattern transfer step (e.g., via light exposure). Following the pattern transfer step, various post steps such as resist baking, and subtractive processes such as resist development, etches, etc., are applied. These post-exposure steps or processes exert various effects on the substrate that cause the patterned layer or etches to have structures having dimensions different from targeted dimensions.

Computational analysis of the patterning processes employ a prediction model that, when properly calibrated, can produce accurate prediction of dimensions output from the patterning processes. A model of post-exposure processes is typically calibrated based on empirical measurements. The calibration process includes running a test wafer with different process parameters, measuring resulting critical dimensions after post-exposure processes, and calibrating the model to the measured results. In practice, well calibrated models, making fast and make accurate predictions of dimensions, serve to improve device performance or yield, enhance process windows or increase design choices. In an example, use of deep convolutional neural networks (CNNs) for modeling post-exposure processes yields model accuracy comparable or superior to that produced with traditional techniques, which often involve modeling with physical term expressions or closed form equations. Compared to the traditional modelling techniques, deep learning convolutional neural networks alleviate the demand of knowledge of process in order for model development, and lifts dependence on an engineer's personal experience on model tuning. Briefly, a deep CNN model for post-exposure processes consists of an input and an output layer, as well as multiple hidden layers, such as convolutional layers, normalization layers, and pooling layers. The parameters of the hidden layers are optimized to give a minimum value of a loss function. In embodiment, CNN models may be trained to model the behavior of any process, or a combination of processes related to the patterning process.

Random, stochastic failures of structures (also referred as features) on a substrate are considered a undesirable in lithography printing (e.g., EUV lithography). Failures of the structures can be identified either after lithographic imaging of the structures on the substrate, or after etching of the imaged substrate on the substrate. Benefits of identifying and classifying failures after etch is that it is easier to interpret images of the substrate as it provides a direct correlation to a performance (e.g., yield) of the patterning process. However, identifying failures after the lithographic step is a more direct measurement of the lithographic performance.

There is a number of algorithms that classify failures of structures (e.g., contact holes) after development in SEM pictures. For example, Fractilia software measures what is on the substrate not what is on the SEM image. In another example, Stochalis software analyzes CD-SEM images based on brightness of pixels. CD-SEM refer to Critical Dimension Scanning Electron Microscope, which is a dedicated system for measuring the dimensions of the fine patterns formed on a semiconductor substrate. However, criteria for defect classification do not depend on etch conditions used during etching, rather are based on common sense based interpreting of SEM images. For example, error criteria may be SEM contrast or critical dimension (CD) after development of an imaged substrate.

Apart from that, CD may be measured using after development image (ADI) or after etch image (AEI) with the CD-SEM, and a transfer of the CD can be measured. However, an ADI SEM measurement damages the resist, which affects the CD after etch. Therefore, the CD based on ADI and AEI are measured at a different location, and only an average CD, Local CD Uniformity (LCDU, a standard deviation of CD) or a CD distribution may be compared.

The disadvantages of the current failure (or defect) classification after lithography is that the defect classification does not depend on the process conditions or the etch conditions, while a final defect (or failure) rate associated with the substrate does depend on such conditions. The defect classification is calibrated based on either the capture rate of programmed defects or by comparing defect rates before and after etch. However, it has been shown that programmed defects are statistically different from random defects see publication P. De Bisschop, E. Hendrickx, "Stochastic effects in EUV lithography," Proc. SPIE 10583, Extreme Ultraviolet (EUV) Lithography IX, 105831K (19 Mar. 2018); doi: 10.1117/12.2300541. Therefore, a good capture rate of programmed defects does not guarantee an accurate result. Furthermore, it has been reported that the defect rate before and after etch do not generally match. For example, the reference P. De Bisschop & E. Hendrickx, "Stochastic effects in EUV lithography," SPIE 2018 shows in FIG. 9 that the ADI and AEI failure rates can be a factor 0.1 to 1000 different.

As mentioned earlier and now referring to FIG. 3, an after-litho SEM metrology damages a resist layer 301/303 e.g., placed on an oxide layer 305. For example, the resist layer 301 before SEM measurement shrinks to the layer 303 after SEM measurement. In another case, carbon can be redeposited due to illumination with the SEM on the resist 301. Thus, measuring SEM twice at the same location may affect the CD as measured by the SEM after lithographic step and after etch step.

In an embodiment, missing contact hole defects after etch are caused by a layer of remaining resist inside the contact hole. However, in the present application it was realized that the resist shrinks during SEM, but that the SEM electrons cannot completely remove a remaining layer of resist in a contact hole, see FIG. 3. Also, it is realized that the carbon redeposition does not fill the full hole such that it closes. Hence, such finding is contrary to conventional belief. Thus, SEM damage may affect the CD but not a failure rate of the structures associated with a pattern. As such, the method of present embodiment enables determination of failure rates more accurately, where the determination is based on one-to-one feature comparison between ADI and AEI rather than using an average CD based determination of failure rate.

Figure 4A:
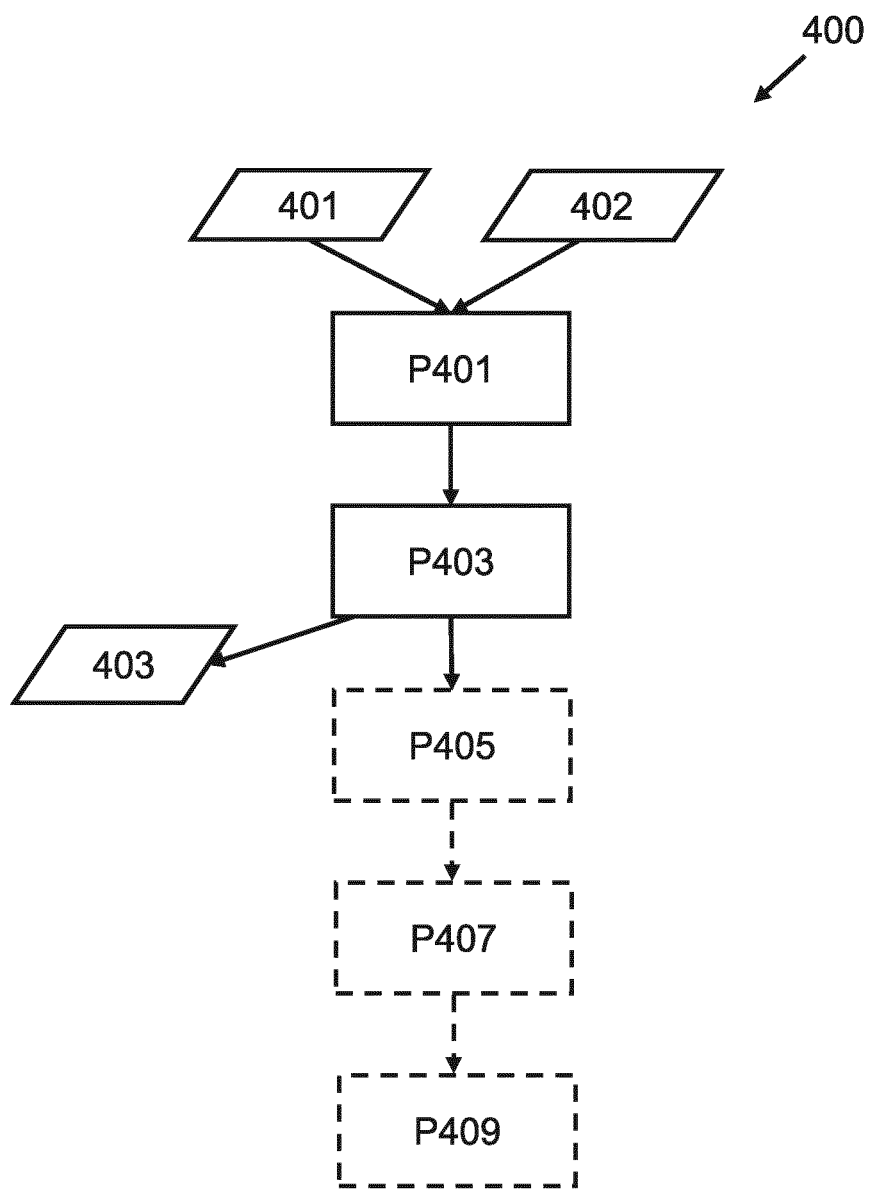
FIGS. 4A and 4B is a flow chart of a method for training a model configured to predict whether a feature associated with an imaged substrate will be defective after etching of the imaged substrate, according to an embodiment.
Figure 4B:
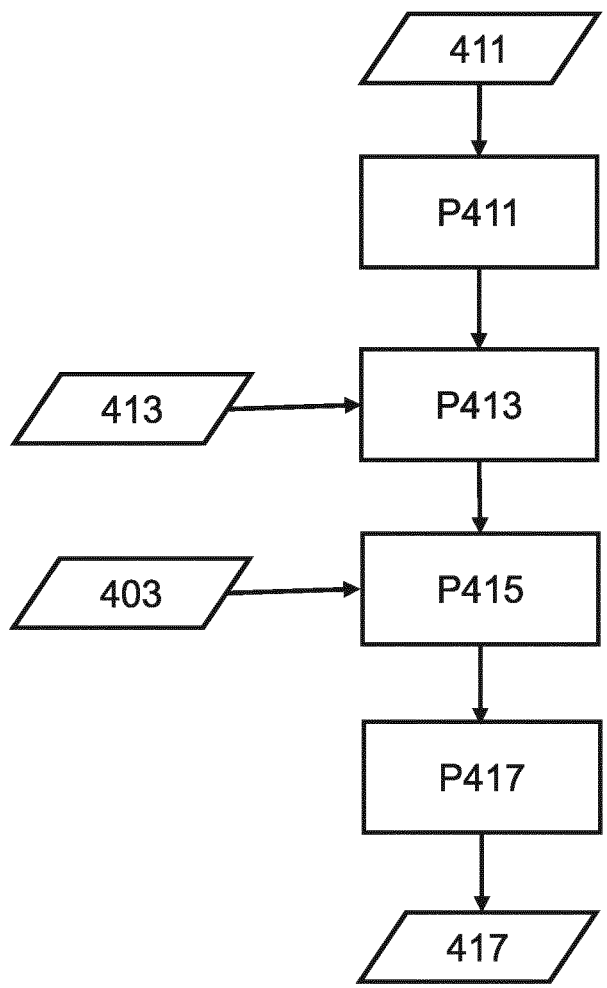

FIGS. 4A and 4B is a flow chart of a method for training a model configured to predict whether a feature associated with an imaged substrate will be defective after etching of the imaged substrate.

Procedure P401 involves obtaining, via a metrology tool, (i) an after development image 401 of the imaged substrate at a given location, the after development image including a plurality of features, and (ii) an after etch image 402 of the imaged substrate at the given location, the after etch image including etched features corresponding to the plurality of features.

Figure 6:
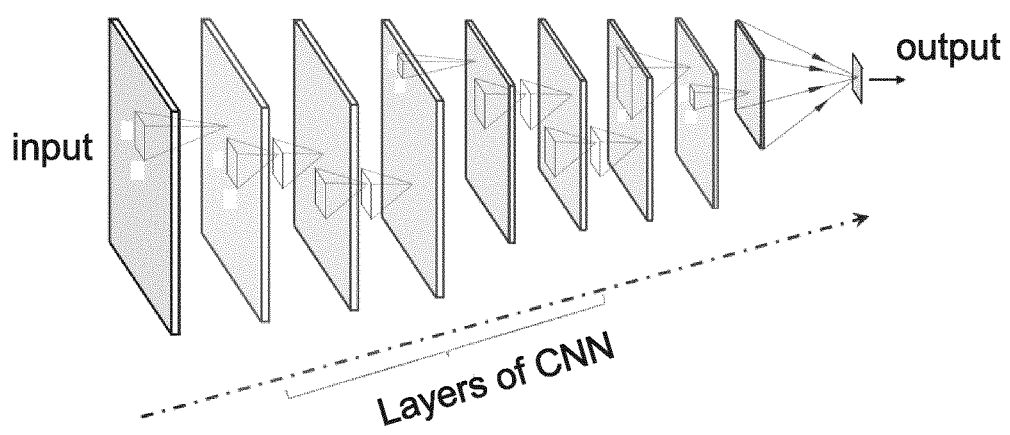
FIG. 6 illustrates an example of a machine learning model having multiple layers used for training according to the method in FIG. 4A, according to an embodiment.

In an embodiment, the model is an empirical model or a machine learning model. In an embodiment, the empirical model is a function of a physical characteristic of the feature associated with the imaged substrate (e.g., after development). An example of training based on empirical model is illustrates in FIG. 7A-7C where a physical characteristic such as CD of the feature after development process is used as a model variable. In an embodiment, the model is trained to identify a CD threshold (e.g., 16 nm) that can classify more than 90% of the potentially defective features, based on ADI, correctly. In other words, features classified as defective in ADI will have high likelihood of failure after etch compared to features that were not classified as defective. In another example, grey scale values of the ADI are used to define the model. For example training the model to identify a grey scale value threshold that can classify more than 90% of the potentially defective features, based on ADI, correctly. In an embodiment, FIG. 6 illustrate training a CNN model. The example training based on CD, grey scale values and CNN model is discussed later in the disclosure.

In an embodiment, the obtaining of the after development image involves imaging, via a patterning apparatus, a mask pattern on a substrate; obtaining a developed substrate (e.g., resist development) of the imaged substrate; aligning the metrology tool (e.g., SEM) to the developed substrate at the given location; and capturing an image of the developed substrate. In an embodiment, the after development image is a pixelated image, where an intensity value of the pixel is indicative of presence or absence of a feature on the substrate. For example, an intensity value of a pixel is a metric for a number of secondary electrons on the substrate. The secondary electrons may depend on: (i) secondary electron yield of a material (e.g., higher yield for resist than for an underlayer on the substrate), and (ii) geometry that shadows the intensity in the hole such that it is darker and gives higher yield at the edges of the hole than at the center. For example, a white band around the hole may be seen.

In an embodiment, the metrology tool is an optical tool or an electron beam microscope. In an embodiment, the metrology tool is a SEM (e.g., FIG. 28) and the ADI and the AEI images are SEM images. In an embodiment, the aligning of the SEM with imaged or after etch substrate is based on addressing features outside FOV of SEM. For example, the SEM may be configured to have a built-in option to align on addressing features, where the addressing features are associated with locations at which scanning should be performed. In another example, a unit cell of a pattern is larger than an uncertainty of the SEM positioning system (e.g. for a logic device), so alignment may also be based on the features that are in the image, such that the pattern itself is used as a location mark. In an embodiment, for alignment purposes, including extra location mark inside the FOV of the SEM is undesired as it affects the lithographic image, which makes the features around it non-representative. In addition, it is not desired to adjust the mask pattern in a functional area of the substrate for metrology.

In an embodiment, the obtaining of the after etch image involves etching, via an etch process with specified etch conditions, the imaged substrate; aligning the metrology tool to the etched substrate at the given location; and capturing the after etch image of the etched substrate. In an embodiment, the etch conditions include etchant composition, plasma gas parameters, etching rate, electro-magnetic fields, a plasma potential, an inductive or a capacitive type of etching, a temperature of the substrate, ion energy distribution, ion angular distribution, sputtering and redeposition rates, or a combination thereof.

In an embodiment, the alignment is never perfect, so a correlation between ADI and AEI images is used to make sure that the alignment was correct. However, one problem is that an addressing feature used for alignment gets damaged or shifted due to the etching process, which affects the addressing. Hence, according to present embodiment, the AEI image is digitally shifted over a discrete number of pitches in all symmetry directions with respect to the ADI image, and check for which one the correlation between ADI and AEI CD is maximum. In an embodiment, there is a clear maximum due to a small shift (e.g., shift by 1 or 2 pitches).

Procedure P403 involves training, using the after development image 401 and the after etch image 402, the model configured to determine defectiveness of a given feature of the plurality of features in the after development image, where the determining of defectiveness is based on comparing the given feature in the after development image with a corresponding etch feature in the after etch image. In an embodiment, the defectiveness is characterized by at least one of: a binary determination of defective or not defective; or a probability of the given feature being defective.

In an embodiment, the training involves aligning, based on the plurality of features, the after development image and the after etch image; comparing (e.g., shown in FIG. 5) each of the features of the plurality of features in the after development image with a corresponding feature of the etched features in the after etch image; determining, based on the comparison, whether a given etched feature in the after etch image satisfy a defect condition; responsive to not satisfying the defect condition, classifying the identified feature as defective; and adjusting model parameter value of the model based on the defectiveness of the identified feature. In an embodiment, the adjusting of the model parameter value includes adjusting values of a plurality of model parameters. In an embodiment, the defect condition refers to a desired limit associated with a physical characteristic of the structure, where if the limit is not satisfied the structure is considered defective.

Figure 5:
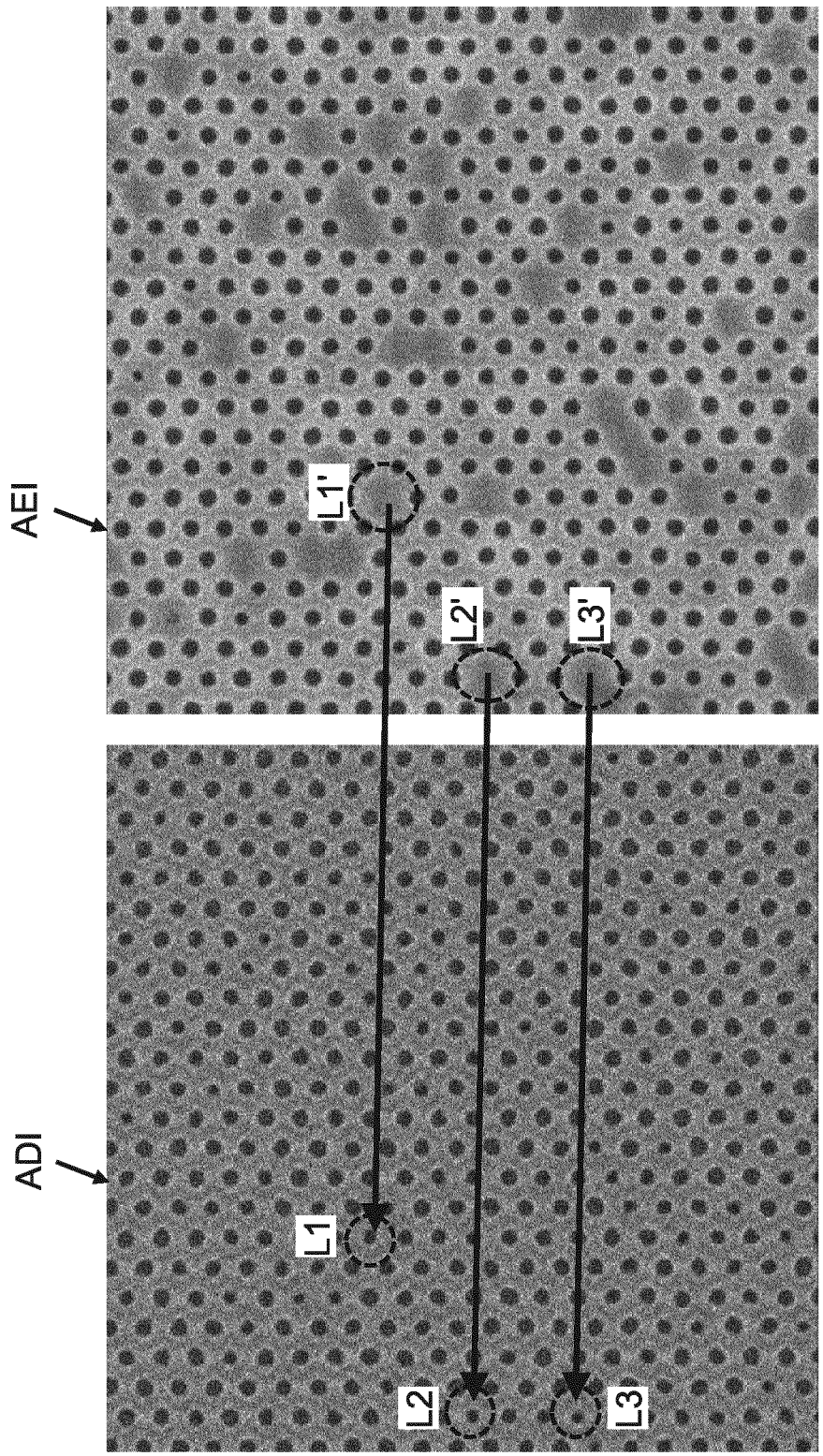
FIG. 5 shows an example of determination of defective feature of a substrate based on comparison between ADI and AEI.

Referring to FIG. 5, an example of determination of defective feature of a substrate based on comparison between ADI and AEI is shown. In an embodiment, the ADI and AEI are obtained, via a metrology tool (e.g., SEM in FIG. 28 or inspection tool in FIG. 29). The ADI is an after development image of the substrate obtained after imaging (e.g., pattern transfer step), via a patterning apparatus (e.g., lithographic apparatus) the substrate and further performing a development process post imaging. The example ADI includes an array of contact holes, for example, holes at locations L1, L2, and L3. The AEI is an after etch image comprising array of holes corresponding to the contact holes of the ADI. In the present example, comparing of the holes in the AEI and the ADI shows missing holes in the AEI. For example, the ADI includes holes (present without any defects) at locations L1, L2, and L3. However, after etching process, the AEI image shows missing holes at locations L1', L2' and L3' corresponding to locations L1-L3, respectively, thereby indicating failure of contact holes. In other words, holes at L1-L3 in ADI have chances of being defective after etching the substrate. Hence, the holes in ADI at locations L1, L2, L3 are classified as defective.

Thus, present disclosure compares holes at one location of the substrate after development with holes at the same location of the substrate after etch. In contrast, the existing technology compares holes at different locations on the substrate after development step and after etch step thereby preventing a one-to-one comparison of features. Thereby, the present disclosure generates more accurate data related to defects associated with structures of the substrate. Hence, a model trained based on such data can predict defective features more accurately and appropriate adjustments to patterning process (e.g., an etch process) may be performed to improve the yield of the patterning process. In an embodiment, the adjustments may involve changing the focus or dose of the lithographic apparatus, or adjusting the chemical composition of the resist.

In an embodiment, the model may be an empirical model trained based on a defective condition. In an embodiment, the defective condition is at least one of: grey scale values in an enclosed contour within the after etch image; or a physical characteristic of the given etched feature in the after etch image. In an embodiment, wherein the physical characteristic is at least one of: a critical dimension of the given etched feature; or a displacement of the given etched feature with respect to the given feature of the after development image.

Figures 7A, 7B, 7C:
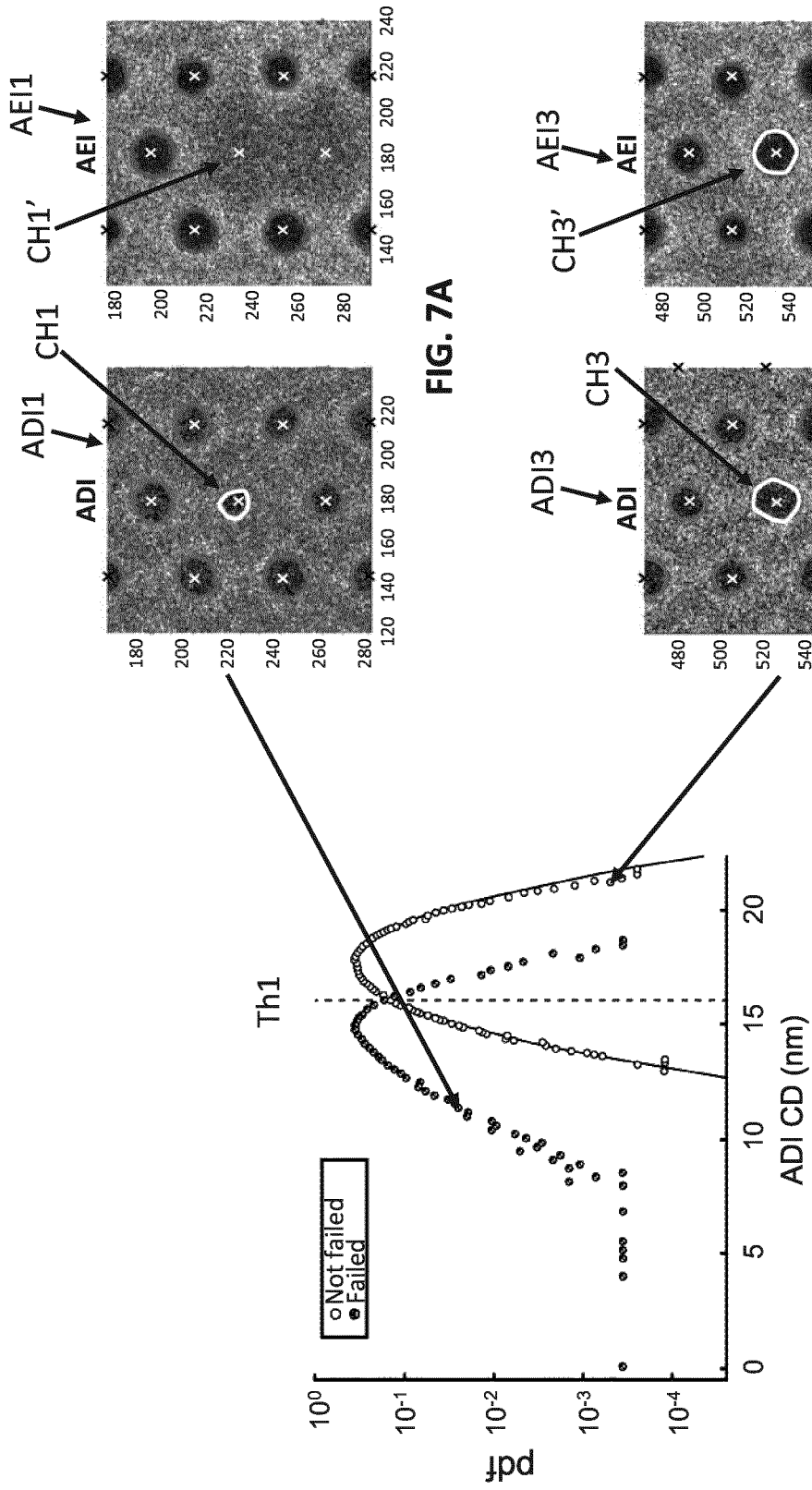
FIGS. 7A and 7B are examples of ADI and AEI showing defective and non-defective contact holes, according to an embodiment.
FIG. 7C is an example critical dimension (CD) distribution associated with defectiveness of a feature, according to an embodiment.

FIG. 7A-7C illustrates example of CD-based defect classification. In an embodiment, the empirical model is based on CD-thresholding, where the CD threshold determines whether a feature may be defective. FIG. 7C shows CD distribution of contact holes in ADI and corresponding contact holes AEI that may be defective (e.g., failure prone or not). The distribution shows CD values of the contact holes in ADI, CD values of contact holes not failed after etching, and CD values of failed holes after etch. In FIG. 7A, comparing ADI1 and AEI1 shows hole CH1 is classified as failed which is accurate as CH1' is missing in AEI1. Further, in FIG. 7B, comparing ADI3 and AEI3 shows hole CH3 is classified as not failed which is also correct as CH3' is not missing in AEI3.

In an embodiment, failing holes (e.g., missing in AEI) are generally smaller in size relative to desired size. For classification, a CD threshold may be employed on the ADI, where contact holes breaching are classified as potential defect in AEI. For example, a CD threshold Th1 is approximately 16 nm, so holes smaller than Th1 (e.g., 16 nm) can be classified as defective. In an embodiment, 91.3% holes were classified correctly.

In an embodiment, the model is a machine learning model such as a convolution neural network. Then, the model parameters are weights, bias or a combination thereof associated with one or more layers of the machine learning model (e.g., CNN).

FIG. 6 illustrates an example CNN trained using ADI and AEI data (e.g., ADI and AEI images of FIG. 5) as input. Based on the input, a defect classification of the features may be based on the comparison between ADI and AEI as discussed herein. Then, the defect classification can be an output of the CNN. In an embodiment, ADI and AEI may be feature vectors provided to the CNN.

In an embodiment, the trained model (e.g., CNN (e.g., FIG. 5), a CD-based threshold model (e.g., discussed in FIGS. 7A-7C) is further configured to predict a failure rate associated with the given pattern of the after development image, the failure rate being indicative of a defect occurrence when the imaged substrate is etched using the specified etch conditions. For example, based on the defect classification of the features and the total number of features, a failure rate associated with the feature after etching may be determined. For example, the failure rate of a feature (e.g., contact holes) is a ratio of a total defective instance of the feature and total number of the features.

In an embodiment, the further configuring of the training model involve following procedures. For example, procedure P405 involves classifying the plurality of patterns associated with a pattern of interest as defective or not defective; procedure P407 involves determining a total number of defective patterns associated with the pattern of interest; and procedure P409 involves computing the failure rate of the pattern of interest as ratio of the total number of defective pattern and a total number of patterns in the plurality of patterns.

In an embodiment, the method 400 may further comprise adjusting an etching conditions. An example implementation involves execution procedures in FIG. 4B. Procedure P411 involves imaging, via a patterning apparatus, a desired pattern 411 on a substrate. The imaged substrate may be further developed (e.g., resist development) and post-processed (e.g., etching). Procedure P413 involves obtaining an after development image of the imaged pattern. Furthermore, an initial etch conditions 413 may be obtained. Procedure P415 involves executing the training model 403 using the after development image to classify whether the desired pattern will be defective after etching. Procedure P417 involves adjusting (or determining), based on the classified defective pattern, an etching condition 417 such that imaged pattern will not be defective after etching.

Figure 8:
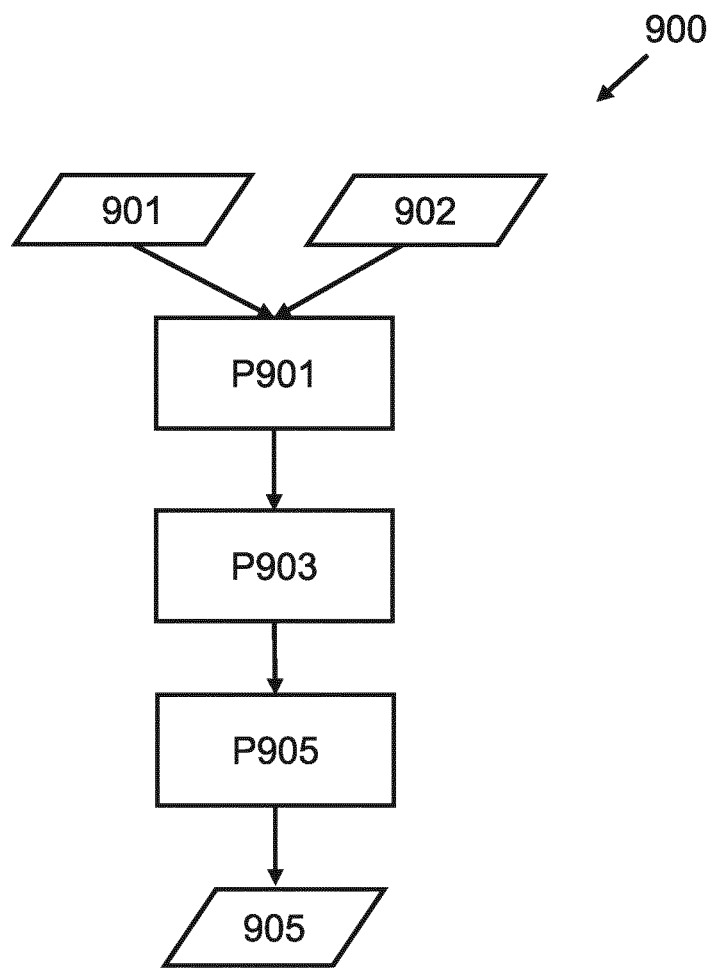
FIG. 8 is a flow chart of a method for determining etch conditions for an imaged substrate based on a failure rate associated with an imaged pattern.

FIG. 8 is a flow chart of a method for determining an etch condition or a plurality of etch conditions for an imaged substrate based on a failure rate associated with an imaged pattern. Procedure P901 involves obtaining an after development image 901 of the imaged substrate, and initial etch conditions 902 to be used for etching the imaged substrate. In an embodiment, the etch conditions comprise at least one of an etchant composition, plasma gas parameters, an etching rate, electro-magnetic fields, a plasma potential, an inductive or a capacitive type of etching, a temperature of the substrate, ion energy distribution, ion angular distribution, sputtering and redeposition rates, or a combination thereof.

Procedure P903 involves determining, via a trained model (e.g., the trained model 403) using the after development image 901 and the initial etch conditions 902, a failure rate of a feature associated with the imaged substrate, the failure rate being indicative of the feature being defective after etching of the imaged substrate. Thus, the trained model provides failure predictions before actual failure that may occur after etching.

Procedure P905 involves modifying, based on the failure rate, the initial etch conditions 902 such that chances of the feature being defective after etching is reduced. The modified etch conditions 905 can be further used to etch the imaged substrate thereby improving the yield (e.g., reduced failure of features/structures on the substrate) of the patterning process.

In an embodiment, the modifying the etch conditions is an iterative process. An iteration involves obtaining a relationship between a given etch condition and a given failure rate associated with a given feature; determining, via executing an etch model using the after development image and the etch conditions, an after etch image associated with the imaged substrate; determining, based on the after etch image, whether the given feature satisfies a defect condition; and responsive to not satisfying the defect condition, identifying, based on the relationship, another etch conditions associated with a lower failure rate as compared to the given failure rate.

In an embodiment, the defect condition of the feature at least one of: an omission of the feature; a displacement range associated with the feature; or a tolerance range associated with critical dimension of the feature.

In a lithography process, the structures printed in resist on a substrate should be etched into a layer underneath to make a functional chip. The etching process/step can be used to smoothen out local variations in CD of the features, such that the local CD uniformity (LCDU) is reduced after etch. One of the underlying mechanisms by which the etch step reduces the LCDU, is by loading effects.

The effect of loading is relationship between an etch rate and how populated an area on the substrate is with structures. In an embodiment, the effect of loading is that in a densely populated area of the substrate (e.g., a region having high percentage of structures within a defined area compared to other regions on the substrate), the etch rate is lower than in areas that are less populated or relatively more empty (e.g., less area is covered with structures). So if a hole or its neighbors have large ADI holes (e.g., because of local fluctuations), for example, 1 nm larger than the average holes, the etch will be slower. The slower etch may cause the AEI holes to be less than 1 nm larger than the average hole AEI. The physical origin of loading effects is shortage of etchant, inhibition of the etch by by-products of the etch, or both.

Three example parameters related to the etch loading are: (i) an extent of the loading effects—that is a distance (e.g., in nm) up to which features impact each other. For example, a value between 40 and 100 nm. In an embodiment, the extent is represented by radius "R" in the equation of the etch rate equation below); (ii) a change in etch bias per change in mean CD of the neighbors in the relevant area. The value of parameter (ii) depends on the mean pattern density. The unit can be nm/nm, and example values, according to present disclosure may be between 0 and 0.75 nm/nm; and (iii) a correlation coefficient between the size of neighboring holes in ADI and the size of the etched hole in AEI. Example values of the correlation can be between 0 and 0.2.

In an embodiment, the etch loading depends on the pattern density and has various length scales, ranging from a wafer-scale to a portion of wafer or a sub resolution. In an embodiment, the pattern density is a fraction of area occupied by structures in a given area around the structure or feature of interest. In an embodiment, the loading effect may be on a length scale between 40 and 100 nm (e.g., 1 to 2 pitches). However, the present disclosure is not limited by such range. In an embodiment, the loading effect ranging from a sub-resolution (e.g. 10 nm) to an OPC-ambit region (e.g., a region having approximately 300 nm-1 μm radius) may be optimized during an etch optimization for a specific structure to ensure a desired yield for the resist by tuning a target-CD's and the desired yield during a pattern transfer. Existing etch optimization process is a long and tedious procedure. For example, a manual optimization involves tuning knobs of an etch apparatus so that a desired yield of the die is achieved.

In an embodiment, the loading effect is a type of saturation. Loading effect (also called loading behaviour) may be different for each of the etch cycles. Specific etch techniques cycle between very small differences in loading effects to reduce, for example, line edge roughness (LER) or line width roughness (LWR), or improve local CD uniformity. The loading effect, in addition to balancing the sputter, etch, and redeposition rates, has both a spatial component and an angular component to create preferential etches for features of varying CD/Pitch/Duty cycles in the X or Y orientation, for example. The angular component is governed by an electro-magnetic (EM) field, gas flow design, or both. Once an etch cycle has consumed the preferential material at the spatial frequency and orientation based on the loading effect, the cycle would effectively saturate. Such saturation may be detected by a spectrometer.

In an embodiment, data from an on-board optical spectrometer that can be used to determine a constituency of materials in the plasma as a means for endpoint detection per cycle. This could be used to trigger the next cycle. In an embodiment, data from spectrometer can be supplemented/replaced by data from an on-board laser interferometer that can determine thickness of a material being etched at a specific location/angle on the substrate.

The present disclosure is related to quantification of an etch characteristic such as a short-range etch loading effect or micro loading. Currently, the etch loading is characterized before the etch optimization process by analyzing test structures, and by modeling in (OPC) software suites (e.g., Tachyon, Synopsis, Coventor, etc.). To this end, features with variable pitch and CD are printed and etched, and an etch rate is fitted with an empirical formula that accounts for an open area within a defined region (e.g., circle of particular radius) around a point of interest. For example, the empirical model for etch rate ER may be defined as:

ER=ER=$ER_{nom}$+τ·OA(R)

In the above ER model, ER is an etch rate associated with an etching process, $ER_{nom}$ is the nominal etch rate associated with the etching process, τ is a sensitivity to the pattern density, and OA(R) is the open area in a circle with radius R. The parameters R, τ and $ER_{nom}$ are fit parameters of the model. In advanced models, multiple radii can be used additively, different convolution-filters applied can be applied, or a directional dependency can be incorporated.

In an embodiment, the etch rate ER may be used to simulated (e.g., using conventor software) an etch bias (e.g., a difference between ADI CD and AEI CD). Further, a relationship between an etch bias, sensitivity to the pattern density, and open area may be modelled. The ADI CD and AEI CD refers to CD of features in ADI and AEI.

In an embodiment, a pattern transfer process may be comprise a combination of an etching and (re-)deposition. An example etching process involves physical sputtering of material and chemical etching. The sputtered material, added gas constituents, or a combination thereof also ensure (re)deposition. In such process, a set sheath voltage influences an ion-angle of the sputtering process and a μ-wave power density of the plasma/sputtering-speed. The sputter-rate of a material is dependent on the incidence angle, ion-velocity and material composition which allows tweaking of profiles. For example, a Fluor gas pressure determines the redeposition during the etching process.

In an etch optimization process, the desired etch loading and redeposition is not tuned based on expected dependencies that are initially simulated, but mostly by physical intuition & experimental testing on sweeps of many different etch-parameters that impact some of the above effects.

However, there are several disadvantages to the existing approaches for estimating the micro-loading effect. For example, measurements are not on product's structures essential for functionality of the chip, rather on test structures. According to present disclosure, micro-loading effects strongly depend on the pattern density, thus characterization of such loading effect on the structure of interest is more appropriate. Another example disadvantage is short-range loading effects depend on a condition in a focus-exposure matrix (FEM). Such dependence cannot yet be quantified by existing methods.

Figure 9:
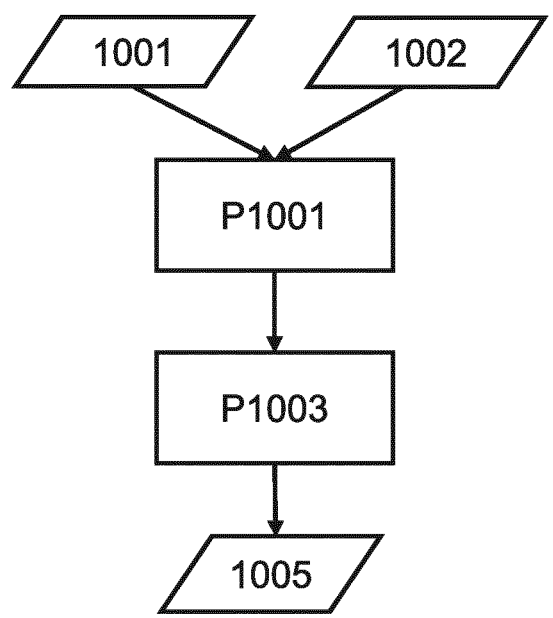
FIG. 9 is a flow chart of a method of determining etch characteristic associated with an etch process, according to an embodiment.

FIG. 9 is a flow chart of a method of determining etch characteristic associated with an etch process. In an embodiment, the etch characteristic is associated with uniformity of etching an imaged substrate. For example, an etch characteristic indicates substrate etches faster at the edge and slower at the center. In another example, an etch characteristic indicates micro-loading effect refers to an etch rate that depends on local pattern density. In an embodiment, etch rate refers to an etched depth per unit time, e.g., 100 to 1000 angstroms per minute. The etch rate may be further used to (via simulation using conventor software) determine etch bias (e.g., a difference between ADI CD and AEI CD). For example, an etch loading refers to a difference between etch rate associated with a given feature located in an area of high density compared to the same feature in an area of low density (isolated) on the same chip. An example reason being associated with a local depletion of reactant. In order to compensate for the etching characteristic such as loading effect, pressure, diffusion rate, etchant flux, etc. may be adjusted. The method of FIG. 9 is further discussed in detail below.

In an example, measurements (e.g., AEI CD) may be performed half-way the etch process (if you have an iterative etch procedure), or after Sequential Infiltration Synthesis (SIS), a step that can be applied before etch.

Note that after development image and after etch image are used as examples of different processes of a patterning process. However, the present disclosure is not limited to after development and after etch. A person skilled in the art can apply the methods herein to other processes related to the patterning process. For example, a correlation may be established between a first layer (e.g., resist layer) and a subsequent layer on which a different process (e.g., etch) may be performed after processing of the first layer. The principle described herein works with any etch and combination of layers (e.g., a first resist, a second resist layer, etc.) of the substrate being patterned.

Procedure P1001 involves obtaining, via a metrology tool, (i) an after development image 1001 (ADI) of an imaged pattern at a given location of a substrate, the imaged pattern including feature of interest and neighboring features adjacent to the feature of interest, and (ii) an after etch image 1002 (AEI) of the imaged pattern at the given location of the substrate, the AEI includes an etched feature corresponding to the feature of interest in the ADI. For example, the imaged pattern may be of an array of contact holes at a center of the substrate. Within the array of the contact holes is the feature of interest may be a contact hole at a particular coordinate (e.g., GDS coordinate).

In an embodiment, the feature of interest is at least one of a contact hole; a line; a line end; or a critical features or a portion thereof. In an embodiment, the neighboring features are at least one of: a plurality of contact holes at a defined orientation with respect to the feature of interest (e.g., see FIG. 10); or a plurality of lines with a defined pitch. In an example, a neighbor can be a line segment of the same line at a distance from the line segment of interest.

In some embodiment, multiple instances of a feature of interest (or multiple different features) in one image and their neighbors can be used to established a correlation between the feature of interest and corresponding etch feature of interest. In some embodiment, one feature of interest in multiple images (e.g., obtained at different locations such as center, edge, or other radial distance on a substrate) may be used to establish the correlation coefficient. In another example, from a lithographic apparatus point of view, multiple images at a small distance from each other may be obtained. For example, multiple images at least in the same die. The CD may be a bit different on different wafer locations, and that will then dominate the correlation coefficient. An example distance between images can be 1 um.

Figure 10:
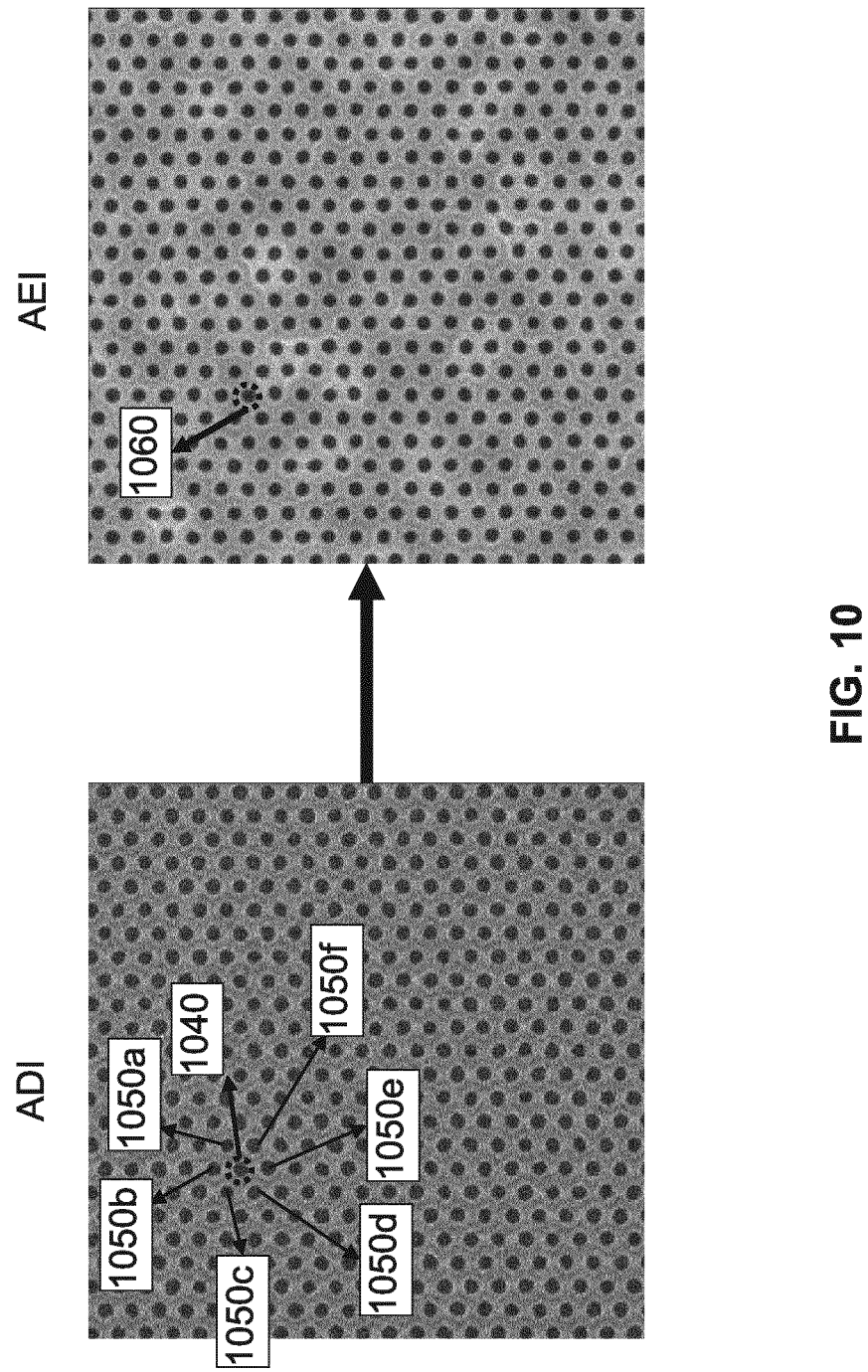
FIG. 10 illustrates example ADI including a feature of interest and neighboring features, and an AEI image including an etched feature of interest, according to an embodiment.

FIG. 10 illustrates example ADI including a feature of interest 1040 and neighboring features 1050a-1050f and an AEI image including an etched feature of interest 1060 corresponding to the feature of interest 1040, only etched. In other words, both 1040 and 1060 are at the same contact holes at different point (e.g., after image and after etch) in the patterning process. In an embodiment, the neighboring features 1050a-1050f are adjacent to the feature of interest 1040. The neighboring features 1050a-1050f are located at a specified distance from the feature of interest 1040. In an embodiment, the specified distance also affects the etch characteristics. For example, closer the neighboring features to the feature of interest higher the etch loading effect.

In an embodiment, a fraction of area occupied by the neighboring features 1050a-1050f around the feature of interest define a pattern density. The higher the surface area covered by the neighboring features, the greater the pattern density. As mentioned earlier, the pattern density affects etch characteristic (e.g., etch loading effect) of an etch process.

Procedure P1003 involves determining, using the ADI and the AEI, a correlation 1005 between the etched feature and the neighboring features associated with the feature of interest in the ADI, the correlation characterizing the etch characteristic associated with the etching process.

In an embodiment, the determining of the correlation involves using multiple ADI images having one feature of interest. Accordingly, the determining of the correlation may involves obtaining (i) a plurality of ADI at a plurality of given locations of the substrate, each ADI having a same feature of interest (e.g., a contact hole having CD of approximately 21 nm), and (ii) a plurality of AEI at the plurality of the given locations, each AEI having the etched feature (e.g., an etched contact hole of CD 20 nm) of interest corresponding to the feature of interest. In an embodiment, an ADI CD is larger than the AEI CD of the feature of interest, for example, ADI CD may be 21 nm and the AEI CD may be 20 nm. Then, the correlation can be established between the neighboring features of the feature of interest in each ADI and the etched feature of interest in each of the AEI. An example function of correlation using CD is explained below, however, similar function may be established using other physical characteristics (e.g., quantifiable measurements) related to the feature of interest.

In an embodiment, the correlation is a function of the average pattern density of the neighboring features adjacent to the feature of interest. In an embodiment, the correlation between the etched feature and the neighboring features in the ADI depends on at least one of: a geometric shape of the feature of interest or the neighboring features; a geometric shape of assist features or bias associated with the feature of interest; a distance between the feature of interest and the neighboring features; a distance along a line feature; a critical dimension of the at least one feature; coordinates on the substrate associated with the feature of interest, the neighboring features, and the etched feature of interest; assist features or lack of assist features around the feature of interest (e.g., around the feature of interest refers to an end of an array of features including the feature of interest); or a random variation of an edge position from its expected position associated with the feature of interest. In an embodiment, the expected position of an edge (e.g., a feature contour) refers to a GDS location (e.g., in a design layout) or an averaging of similar features.

In an embodiment, the correlation may be computed indirectly based on patterning process parameters such as dose and focus of a scanner, an etch temperature, plasma gas parameters, etchant composition, electro-magnetic fields, plasma potential, inductive or capacitive etching, temperature, ion energy distribution, ion angular distribution, parameters associated with sputtering and redeposition rates. For example, the indirect determining of the correlation involves via tuning or simulating the patterning process by adjusting one or more of the aforementioned patterning process parameters.

In an embodiment, a geometric shape of the feature can be a hole or a line. The correlation coefficient associated with a contact hole will be different from a line. For example, if a feature of interest is surrounded by a line, the loading effect may decrease along a length of the line. Also, a L shaped feature may have different correlation compared to a line, since L-shape has a corner and thus affected by neighboring feature differently than a line. In an embodiment, the correlation also depends on a critical dimension of the neighboring features. For example, larger the critical dimension of the neighboring features larger the loading effect (see FIG. 11A).

In an embodiment, the correlation is computed using following equation:

$$R_{neighbors}^2 = \vec{c}^T \cdot Q^{-1} \cdot \vec{c}$$

In the above equation, $\vec{c} = (r_{CDAEI,CDADI_1}, \ldots, r_{CDAEI,CDADI_j})$ is a vector of correlations, where CDAEI is the AEI CD of the feature of interest; $CDADI_i$ is the ADI CD of the $i^{th}$ neighbor, and r is the correlation coefficient, and $Q_{i,j} = r_{CDADI_i, CDADI_j}$ is a correlation matrix. The above equation is an example and does not limit the correlation based on CD. As mentioned earlier, the correlation may be computed based on other physical characteristics (e.g., a geometric shape, a distance, assist features, etc., as mentioned earlier) associated with the feature of interest and the neighboring features.

In an example experiment, referring to FIG. 10, a metrology tool (e.g., SEM) measured $10^5$ contact holes that were exposed at 7 conditions according to a focus-exposure matrix (FEM). The contact holes were on a hexagonal grid, and thus each contact hole (e.g., 1040) had 6 neighbors (e.g., 1050a-1050f). Then, an etch recipe (e.g., IMEC TITAN VIA etch) was used for etching the exposed substrate. Further, the CD values of the contact holes before and after etch were determined for example, using a MATLAB script configured to organize data for further use. Assuming a simple linear relation between the CD of the hole ADI and AEI correlation between ADI and AEI can be established. For example, a part of the variance of AEI CD explained by the ADI CD of the contact hole 1040 is then simply a square of a correlation coefficient ($R^2$) given below:

$$R_{self}^2 = \left(\frac{Cov(CD_{AEI}, CD_{ADI})}{std(CD_{AEI}) \cdot std(CD_{ADI})}\right)^2$$

For the part of the variance of AEI CD explained by the ADI CD of the neighboring contact holes 1050a-1050f, a vector of correlations is used. An example vector of correlation C is given by:

$$\vec{c} = (r_{CDAEI,CDADI_1}, \ldots, r_{CDAEI,CDADI_6})^T$$

Then $R_{neighbors}^2$ can be computed using:

$$R_{neighbors}^2 = \vec{c}^T \cdot Q^{-1} \cdot \vec{c}$$

Figure 11A:
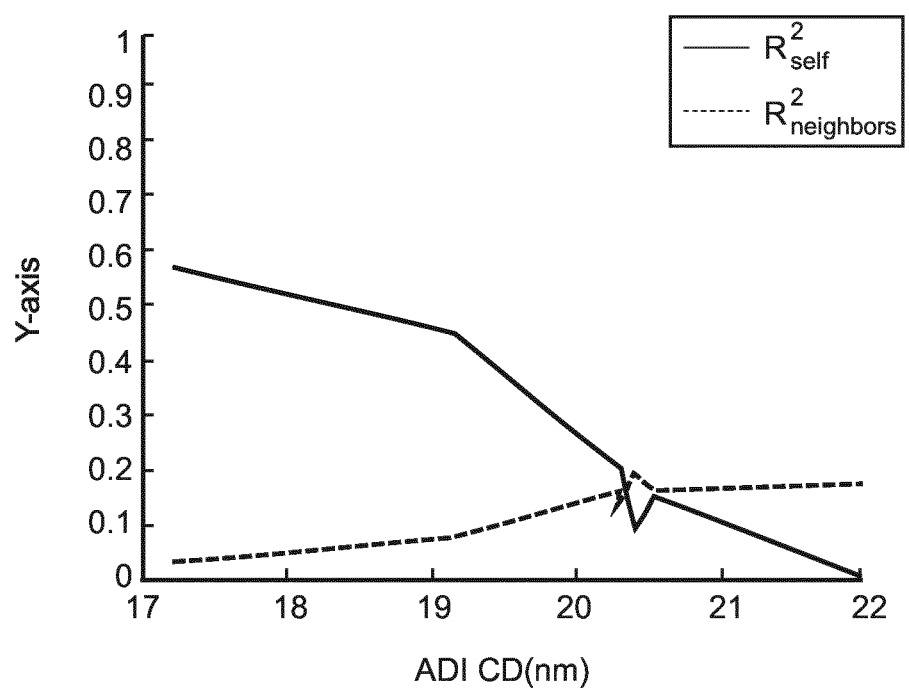
FIG. 11A shows an example correlation ADI and AEI based on a physical characteristic (e.g., CD) of a feature of interest, according to an embodiment.
Figure 11B:
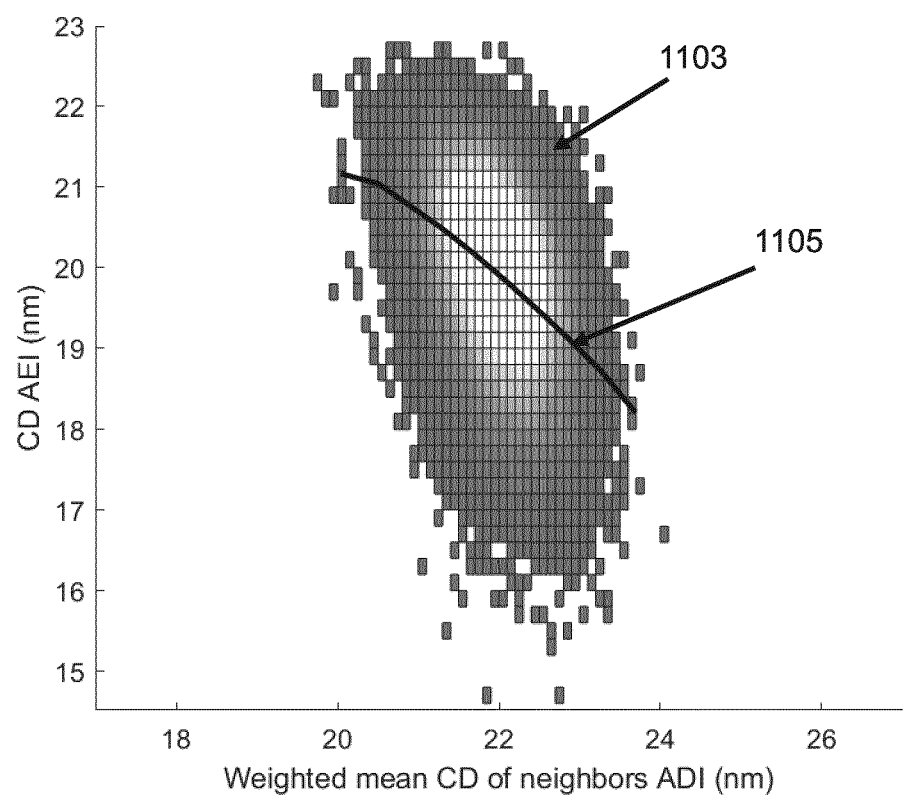
FIG. 11B shows an example relationship (e.g., based on CD) between neighboring features around a feature of interest in ADI and an etched feature of interest in AEI for a given dose-focus matrix, according to an embodiment.

An example correlation is illustrated in FIGS. 11A and 11B. For the 7 conditions in the FEM, a correlation plot (in FIG. 11A) shows the $R_{self}^2$ and $R_{neighbors}^2$ against the mean CD of the holes. The y-axis indicates a fraction of variation in AEI CD that is explained by either the ADI CD of the feature of interest itself or ADI CD of its neighbors. The y-axis can be a dimensionless quantity, or a percent if you multiply by 100). The correlation plot indicates that a short-range etch loading effect is strongest for the largest CD, and substantially lower for the relatively smaller CD. A short-range may be, for example, within an FOV of the SEM. Hence, the short-range etch loading does depend on the pattern density. In addition, FIG. 11B shows a negative correlation indicating the etch loading effect also depends on FEM conditions.

In the present example of FIG. 11B, the AEI CD (Y axis) is plotted against a weighted mean of the ADI CD of the neighbors (X axis) for the condition with the largest mean CD in FIG. 11A. The variations in CD represented by a grey region 1103 is due to random fluctuations in the patterning process and a line 1105 shows a moving average of CD of the feature of interest. The line 1105 shows a negative correlation between AEI CD and ADI CD of neighbors. A negative correlation indicates that the correlation between the etched feature and the neighboring features of the ADI is relatively high for the shown FEM condition, which prints at a relatively large average CD. To clarify, the relatively large average CD is not randomly larger CD's within the imaged pattern, but the CD associated with conditions or patterns that have a large pattern density because an average CD of that condition or pattern is large (e.g. if the scanner dose used is high or a mask design is such that the CD is large).

In an embodiment, the method involves determining, based on the correlation and at a given radial distance between the center of the substrate and the edge of the substrate, etch conditions associated with the imaged pattern so that the correlation remains within a target range. In an embodiment, the etch conditions depends on at least one of: a location of the substrate being etched, the location being the radial distance between the center of the substrate and the edge of the substrate (e.g., a center or an edge of the substrate or other distance to region of interest on the substrate); an etch cycle; an etch chamber; a sequence of the etching cycle and deposition step; or tuning parameters associated with the etch chamber, the tuning being based on a sensitivity of correlation to a change in the tuning parameter.

In an embodiment, determining, based on the correlation, etch conditions for the imaged pattern located at a center of a substrate so that the correlation is within the target range. In an embodiment, the method involves determining, based on the correlation, etch conditions for the imaged pattern located at an edge of the substrate so that the correlation remains within the target range. In general, even if a pattern density is same, different etch conditions may be needed at different locations on the substrate due to a thickness profile of the substrate, drifts associated with etching apparatus, etc.

In an embodiment, the etch conditions include etchant composition, plasma gas parameters, etching rate, electromagnetic fields, a plasma potential, an inductive or a capacitive type of etching, a temperature of the substrate, ion energy distribution, ion angular distribution, parameters associated with sputtering and redeposition rates, an etch cycle parameter based on a saturation effect, or a combination thereof. In an embodiment, the saturation effect is a loading effect that can be used to determine the constituency of materials in the plasma as a means for endpoint detection per cycle. This could be used to trigger the next cycle.

In an embodiment, the etch conditions can be adjusted in comparison to an ideal etch condition. For example, an ideal etch condition can either be tweaked within an existing etch apparatus (e.g., adjusting parameters such as the etchant composition, plasma gas parameters, etching rate, etc.) or in a design tool used for determining an etch conditions, the design tool allows for adjusting parameters such as electromagnetic fields, capacitive or inductive type etching, etc. such that the correlation remains within a desired target range.

In an embodiment, the method further includes generating, based on the correlation between the AEI CD and ADI CD, a power spectral density of the correlation (e.g., a correlation established using a line as feature). The power spectral density is indicative of a magnitude of the etch characteristic effect (e.g., loading effect) and a range of the loading effect. In an embodiment, the power spectral density may be computed in a spatial domain (e.g., along a length of a line feature). For example, the power spectral density is computed by taking a Fourier transform of the correlation in the spatial domain, where the correlation is as a continuous function of the distance between two points. An example power density of the correlation for a line may indicate that the correlation is relatively higher at small spacing between the line segments, and gradually decreases for larger spacing between the line segments. Further, based on the power spectral density appropriate etching conditions may be determined. For example, an etch recipe may be defined based on the magnitude of the loading effect along the line such that the correlation between the ADI of the line and the AEI of the line is remains within a target range during the etching process.

In an embodiment, the correlation can be used for monitoring and controlling a performance of a patterning process, for example, by controlling an etch recipe and etch conditions (e.g., tuning parameters) such that the correlation remains in a target range.

For example, etch process chambers are monitored based on a critical dimension uniformity across an entire substrate, or a CD difference between different features at different radius across the substrate.

In an example, controlling involves determining an impact on CD not only based on selectable etch knobs, e.g. gas-pressure, power, DC, temperature, etc., but also the correlation. Then, a desired performance (e.g., whether the correlation remains in a target range) can be monitored. The benefit is that more dies of the substrate will be within the specification at the final yield test. Furthermore, the benefit of correlation based monitoring is that it may not be necessary to check a final yield again on e.g., e-test vehicles or die-hard inspection of millions of features.

Figure 12:
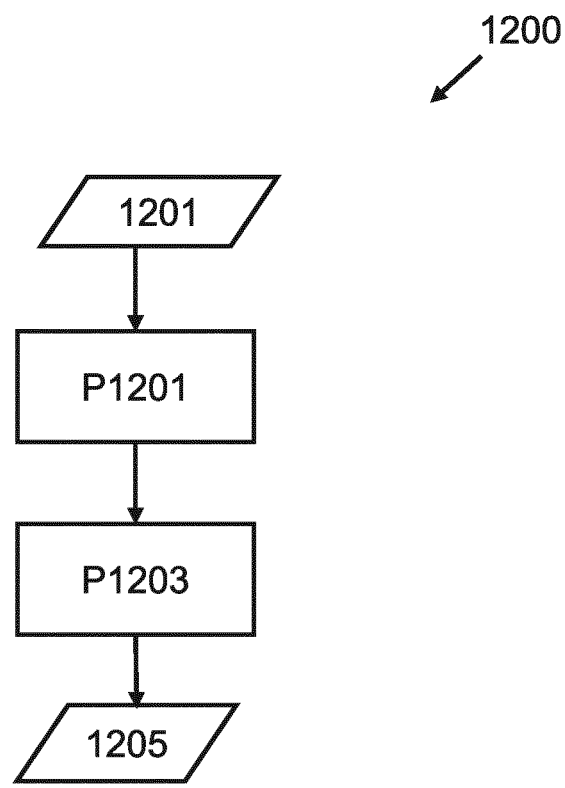
FIG. 12 is a flow chart of a method for determining etch conditions based on a correlation (e.g., determined using method of FIG. 9), according to an embodiment.

FIG. 12 is a flow chart of a method 1200 of determining an etch condition or a plurality of etch conditions associated with an etch process based on the correlation (discussed above) between an etched feature of interest and a neighboring feature in ADI. The method 1200 is used for monitoring and controlling an etching process based on a target range of the correlation. In an embodiment, a correlation target range (e.g., 0-0.4) may be defined and etch conditions can be defined such that the target range is met during or after etching process. The target range may be constant across the substrate being etched, but the etch conditions may vary at, e.g., the center and the edge of the substrate. The method 1200 is further discussed in detail below.

In an embodiment, the etch condition are determined such that ranges a plurality of parameters (e.g., including correlation) related to loading effects are within a desired specification. For example, an impact of density fluctuations and the fraction of variance explained by ADI neighbors are also within the desired specification. For example, an extent of the loading effects: less than 100 nm; an impact density range: between 0.3 and 0.35 nm/nm; and an example fraction of variance explained: between 0.15 and 0.17.

Procedure P1201 involves obtaining a correlation 1201 between an etched feature of interest in an after etch image (AEI) and a neighboring feature associated with the etched feature of interest in an after development image (ADI). In an embodiment, the obtaining of the correlation between the etched feature and the neighboring feature includes obtaining the correlation between the etched feature and a plurality of neighboring features. In an embodiment, the obtaining of the correlation is according to method of FIG. 9. For example, the obtaining of the correlation involves obtaining, via a metrology tool, (i) the after development image (ADI) of the imaged pattern at a given location, an imaged pattern including a feature of interest and a neighboring feature adjacent to the feature of interest, and (ii) the after etch image (AEI) of the imaged pattern at the given location, the AEI including the etched feature of interest corresponding to the feature of interest in the ADI; and determining, using the ADI and the AEI, the correlation between the etched feature and the neighboring feature associated with the feature of interest in the ADI.

Procedure P1203 involves determining, based on the correlation, etch conditions 1205 associated with the etch process so that the correlation remains within a target range.

In an embodiment, the determining of the etch condition depends on at least one of a location of the substrate being etched, the location being a center or an edge of the substrate; an etch cycle of the etch process; an etch chamber used in the etch process; a sequence of the etching cycle and deposition step; or a tuning parameter associated with the etch chamber, the tuning being based on a sensitivity of correlation to a change in the tuning parameter. In an embodiment, the tuning parameter includes a plurality of tuning parameters.

In an embodiment, the determining of the etch conditions involve monitoring CDU across the substrate or a CD difference between instances of an etched feature of interest at different radius. For example, the etch conditions may be determined by changing selectable etch knobs, e.g. gas-pressure, power, DC, temperature, etc. and evaluating impact on CD as well as the correlation. An advantage of determining the etch condition based on the correlation is that more dies of the substrate will be within the specification at the final yield test compared to existing methods.

In an embodiment, an etch condition or an etch recipe can be described as having a beginning stage, middle stage(s) and an end stage. Each stage of the etch can be made up of one or more 'mini' etch recipes, which when taken altogether represent the etch recipe. In an embodiment, these 'mini' etch recipes are used to finely tune results (e.g., characterized by CD of etched feature of interest or yield) of the etch process. Accordingly, different 'mini' etch recipes that have slightly different behaviors such as, but not limited to, different amounts of loading, may be applied so that a desired end result (e.g., CD or yield) is achieved. In an embodiment, these fine tuning of etch recipes are achieved via tuning different plasma gas parameters, power settings, gas flow settings, etc.

Note that although 'mini' etch recipes can be defined, the etch process development is typically done based on a whole etch result and not on pieces that could be represented as the beginning, middle, end of the etch process. For example, an entire etch process may be executed without interruption or stopping at the beginning, middle or end of the etch process.

In an embodiment, when there are multiple materials on a substrate that are being etched, it is possible to have them all etched in a combined etch process in a single chamber where the etch recipe for a first material would be comprised of multiple steps and then followed by another etch recipe for a second material which may be comprised of a different set of multiple steps (also including changes to gases, etc). For multi-material etches, there can be different degrees of anisotropy desired for each material, such that a profile of the etched pattern is not a perfect copy from one material to the next. These differences could result in different correlation results. It is possible (but also uncommon) to stop an etch between layers to observe the individual profile of a multi-profile etch. In an embodiment, an etch profile may be characterized by geometry of the etched feature such as a height, an angle, a width associated with the etched feature.

In an embodiment, the determining of the etch conditions involves adjusting values of the tuning parameters associated with a given etch chamber such that the correlation associated with the given imaged pattern remains within the target range.

The measurements (e.g., ADI CD and AEI CD) according to present disclosure help understanding the etch process, which can speed up an etch optimization process, even if manual. For example, optimization based on the correlation obtained from method of FIG. 3. As the measurements are performed on product structures, the resulting etch is better optimized for the most critical structures thereby increasing the yield of the patterning process.

Machine learning models (e.g., neural nets, CNN, DCNN, etc.) are mostly black boxes. Such black box models, even if trained using supervised learning (e.g., via human), make predictions that may not be easily interpretable to take actions, e.g., adjusting process parameters (e.g., dose/focus, etch recipe) to improve patterning process. Hence, understanding reasons behind predictions made by the trained model is desired in assessing action based on a prediction, or when choosing whether to deploy a new model.

In an embodiment, the white box model of a patterning process may have lower accuracy compared to black box models of the patterning process. For example, a white box model may predict with 91.3% accuracy, but a prediction made by the model may be easy to explain. For example, a model classifying features as defective or not defective based on CD value of features in ADI image can be easily understood by looking at the CD of the features. On the other hand, a black box model (e.g., CNN) may predict with higher accuracy (e.g., 95.8%) than the white box model. However, the decisions of the black box model are difficult to explain. For example, the prediction of a feature being defective may not be readily conceived based on the predicted results. Hence, in an embodiment, users may choose to sacrifice accuracy for the sake of interpretability.

A criterion for improving explanation of predictions of a black box model is interpretability that provide a relationship between input variables and the predictions of the black box model. For example, the relationship provides a qualitative/quantitative understanding of the predicted results (e.g., an ADI feature will be defective or not as mentioned earlier) based on the input variables (e.g., pixel values of the ADI image)

Figure 15A:
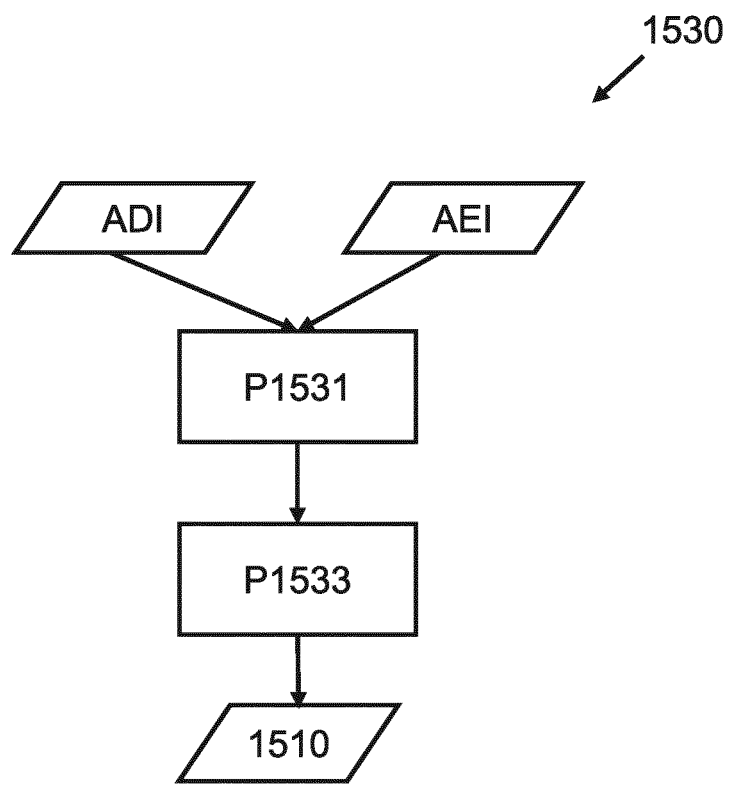
FIG. 15A is a flow chart of a method for determining an interpretation model associated with a feature of interest, according to an embodiment.

In the present disclosure, the relationship between input variables (e.g., features in ADI) may be explained via an interpretation model associated with a feature of interest. In an embodiment, the interpretation model assists in explaining defectiveness of a particular feature. For example, the interpretation model can identify portions of an ADI image that explains the defectiveness of the feature. In an embodiment, an interpretation model can be determined using different approaches such as Local Interpretable Model-agnostic Explanation (LIME), a Principal Component Analysis (PCA), or discriminant analysis such as Linear Discriminant Analysis (LDA) or Quadratic Discriminant Analysis (QDA). FIG. 15A illustrate example flowchart of determining an interpretation model configured to identify relevant features of ADI that explains the defectiveness classification of any input ADI.

Referring to FIG. 15A, the method 1530 includes procedures P1531 and P1533 discussed in detail as follows. Procedure P1531 includes obtaining, via a metrology tool, (i) the after development image (ADI) of the imaged substrate at a given location, and (ii) an after etch image (AEI) of the imaged substrate at the given location. Procedure P1533 includes determining, based on the ADI and AEI, an interpretation model 1510 configured to identify portions of the ADI that explain a defectiveness of a feature in an input ADI. In an embodiment, the interpretation model is determined by employing a local interpretable model-agnostic explanation approach configured to generate with the interpretation model, the interpretation model configured to generate an interpretation map that explains classification of the input ADI. An example of LIME approach is discussed with respect to FIG. 15B below.

In an embodiment, the determining the interpretation model 1510 includes determining correlation data between the ADI and AEI; and performing, using the correlation data, a principal component analysis, or discriminant analysis to determine eigenvectors whose eigenvalues are above a specified threshold. Further, the determining includes projecting, the input ADI, on the eigenvectors to compute a classification value; and responsive to the classification value exceeds a specified threshold, identifying the portion of the input ADI as explaining the defectiveness of the feature within the input ADI. An example of PCA method is further discussed in detail below.

In an embodiment, the PCA (and similarly LDA or QDA) can be performed based on a correlation between variables of an ADI image. In an embodiment, the correlation can be determined using pixel intensities of the ADI image. For example, (and similarly LDA or QDA) can be performed as follows. In the present example, greyscale values or intensities of pixels in an ADI image (e.g., ADI10, ADI20, or ADI30 in FIGS. 14A-14C) may be represented as a vector $\vec{x}$. For example, the ADI image can be a crop of size 51×51 pixels, resulting in a vector of length $51^2=2601$. Based on the vector $\vec{x}$, a correlation matrix $\overline{R}$ can be computed of all the ADI images (e.g., ADI10, ADI20, and ADI30 in FIGS. 14A-14C) as follows:

$$R_{ij} = \frac{\langle (x_i - \langle x_i \rangle)(x_j - \langle x_j \rangle) \rangle}{\sigma_i \sigma_j}$$

In the above equation, $\langle x_i \rangle$ is an average values of the vector $x_i$ over all crops (e.g., ADI10, ADI20, and ADI30), and $\sigma_i \sigma_j$ is the covariance between two pixels of the image.

On the correlation matrix $R_{ij}$ data, PCA, LDA or QDA can be performed. In PCA, eigenvalues and eigenvectors of the matrix $\overline{R}$ is computed. These eigenvalues can be significantly larger than 1, approximately 1, and a few eigenvalues that are much smaller than 1. The higher eigenvalues indicate the corresponding a set of variables that are highly correlated. For example, referring to ADI10 (FIG. 14A), the correlation matrix can indicate that the pixels (darker portion) related to contact hole F10 may be highly correlated. Thus, the correlation matrix can indicate a contact hole being present. On the other hand, for ADI30 (FIG. 14B), the correlation matrix may show a relatively low correlation between pixels of the contact hole F30 that can be indicative of a failing contact hole.

The eigenvectors corresponding to large eigenvalues (e.g., greater than 1) indicates that the greyscale value of these pixels varies together, which can be indicative of a failing contact hole or printing hole. These eigenvectors corresponding to large eigenvalues can be used employed in the interpretation model 1510. For example, project all instances of crops on the few eigenvectors with large eigenvalues, and check whether in one of these directions, there is strong clustering of printing and failing holes. The eigenvectors for which is the direction having strong clustering is observed are relevant features for defect classification. By transforming these eigenvectors back into the form of a 51×51 crop, interpretations of relevant features within the input ADI can be made, as failing or printing.

In another example, the LDA/QDA also identified eigenvectors that can automatically find the projection direction that best discriminates the printing from failing holes.

Figure 15B:
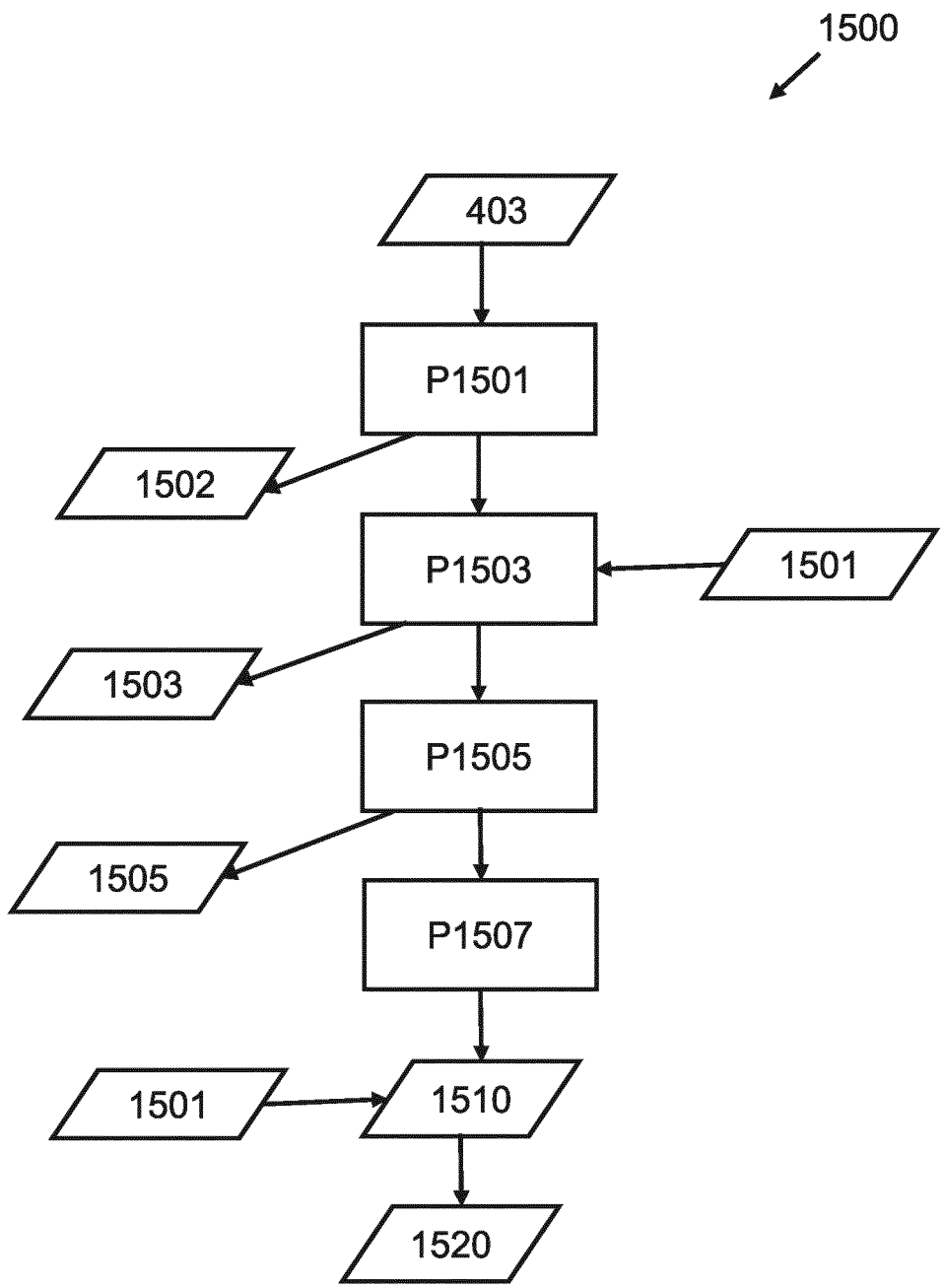
FIG. 15B is a flow chart of an example approach for determining an interpretation model associated with a feature of interest, according to an embodiment.

In an embodiment, the interpretation model may be determined using LIME approach, e.g. a method 1500 discussed with respect to FIG. 15B. LIME is an explanation technique that explains the predictions of any classifier in an interpretable manner, by learning an interpretable model locally around the prediction. An example of determining the interpretable model is discussed in FIG. 13, discussed below.

FIG. 13 illustrates a decision data set used to train an example interpretation model. The decision data set can be obtained from a trained model (e.g., CNN model of FIG. 4A). For example, the trained model 403 uses ADI image including a plurality of features to predict defectiveness of the plurality of features after etching. For example, whether the ADI feature will print with defect or without defect after etching using a particular etch recipe.

In FIG. 13, a trained machine learning model's complex decision function (unknown to an interpretation model) is represented by prediction regions R1 and R2. In an embodiment, the decision refers to predictions by the trained model 403. Accordingly, the prediction regions R1 and R2 correspond to whether features in a given ADI image will be defective or not defective after etching. In an embodiment, such prediction regions R1 and R2 are separated by non-linear boundary, which cannot be approximated well by a single linear model. Hence, a set of model may be defined, where each model can locally (e.g., around a selected point) explain why a particular prediction was made.

In an embodiment, a point P0 (bold cross) is an instance to be explained by an interpretation model. For example, the point P0 represents a feature of interest in ADI image. According to an embodiment, an interpretation model that explains the prediction associated with the point P0 is explained using fitted line, where the fitting is based on data in the vicinity of the point P0. The data in the vicinity of the point P0 comprises two types of category, which is represented by region R1 and R2. For example, a first set of points P1, P2, P3, P4, P6 represent decision of the trained machine learning model that features will be defective after etching. While a second set of points P10, P11, P12, P13, . . . , P20 represent decision of the trained machine learning model that features will be not be defective after etching.

In an embodiment, a method used to determine the interpretation model includes sampling instances (e.g., P1-P20), obtaining predictions using the trained machine learning model (e.g., 403), and weighing (e.g., represented here by size of points P1-P20) the predictions by a proximity of a sample to the instance P0 being explained (e.g., the feature of interest). Then, a model is fitted based on the weighted predictions by employing a fitting method. For example, a least square error based fitting method may be used. The fitted model is referred as the trained interpretation model, according to an embodiment.

In an embodiment, a dashed line M1 represents a trained interpretation model that provides explanation, about the point P0, locally (but not globally). For example, local refers to points in a vicinity of the instance being explained. The dashed line M1 can also be referred as a trained interpretation model M1. In other words, the trained interpretation model M1 provides a linear approximation of the non-linear boundary around the line M1 based on the data points in the vicinity of the point P0 and the non-linear boundary B 1. In an embodiment, the interpretation model M1 can be trained so that a cost function, e.g., a function of a difference between the interpretation model M1's output and the predictions in the vicinity of the point P0 are reduced (e.g., minimized). The present disclosure is not limited to a particular fitting method. Other data fitting methods such as least squares method, Gaussian fitting, least deviation, etc. may be employed.

The example in FIG. 13 shows binary decisions for explaining the concepts. However, the decision may be binary categorization, or include multiple categories (e.g., probability based, where multiple ranges of probability correspond to multiple categories). The scope of the present disclosure is not limited to binary decisions.

Figure 14A:
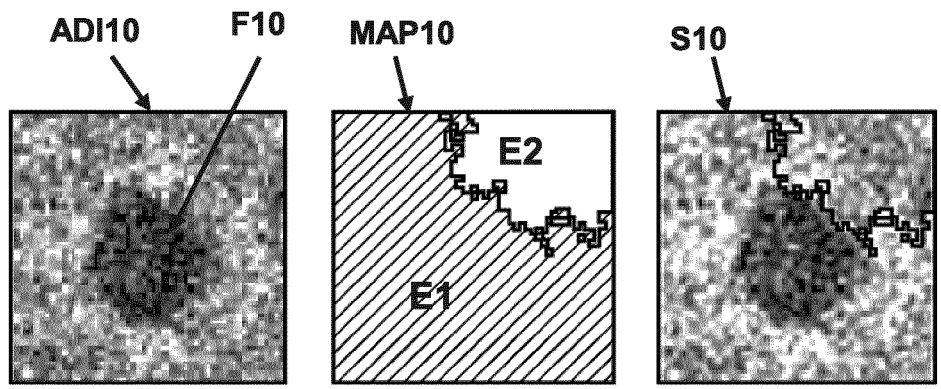
FIG. 14A shows an example of a first feature in an ADI image and a first interpretation map for a prediction associated with the first feature, according to an embodiment.
Figure 14B:
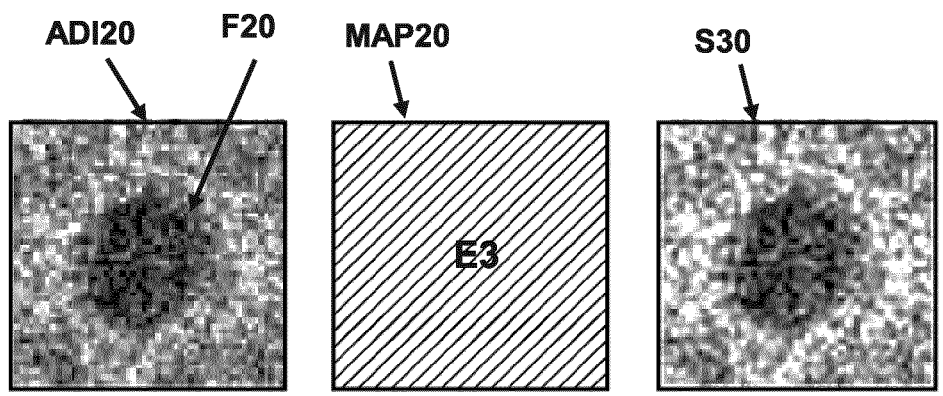
FIG. 14B shows an example of a second feature in an ADI image and a second interpretation map for a prediction associated with the second feature, according to an embodiment.
Figure 14C:
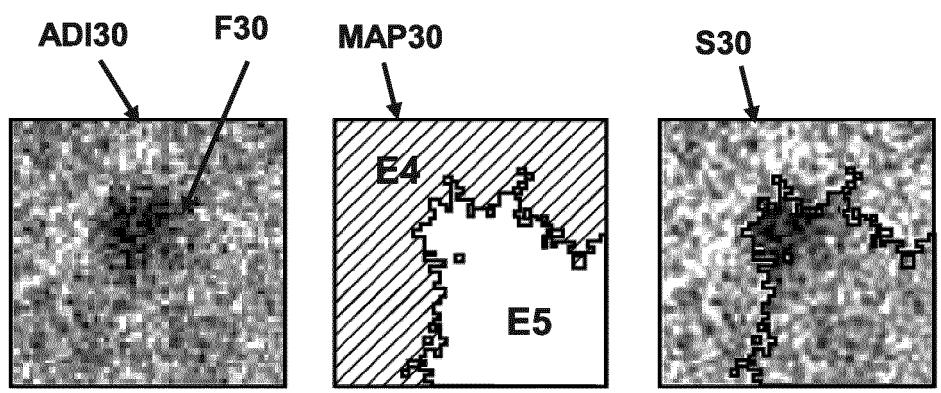
FIG. 14C shows an example of a third feature in an ADI image and a third interpretation map for a prediction associated with the third feature, according to an embodiment.

FIG. 14A-14C illustrate an example result of applying the interpretation model (e.g., M1) to ADI images including a feature of interest. In the present example, ADI images ADI10, ADI20, and ADI30 includes features of interest F10, F20, and F30, respectively. In an embodiment, the trained model (e.g., 403) associated with a process (e.g., an etch process) predicts whether a particular feature in an ADI will print with or without defect after etching.

FIGS. 14A and 14B illustrate examples of features F10 and F20 in ADI images ADI10 and ADI20, respectively, that are predicted to print without a defect. For example, the trained model (e.g., model 403 trained according to the method of FIG. 4A) predicts that features in the images ADI10 and ADI20 will print without defect. FIG. 14C illustrates an example of feature F30 in ADI image ADI30 that is predicted to print with a defect. For example, the trained model (e.g., model 403 trained according to the method of FIG. 4A) predicts that features in the images ADI10 and ADI20 will print without defect.

However, as discussed earlier, the trained model 403 may be a machine learning model (e.g., CNN or DNN) that comprises a network of neurons that are weighted, distributed across a multiple layers, and connect to one another. Hence, a rational behind the prediction is not available.

The rational or explanation behind such prediction can be obtained via the trained interpretation model (also referred as an interpretation model). For example, for each feature of interest an interpretation model can be trained according to FIG. 13. For example, a first interpretation model M10 is trained to explain a prediction related to the feature of interest F10 in ADI10. Similarly, a second interpretation model M20 is trained to explain a prediction related to the feature of interest in ADI20, and a third interpretation model M30 is trained to explain a prediction related to the feature of interest in ADI30.

In an embodiment, the interpretation models M10, M20, and M30 generate interpretation maps MAP10, MAP20, and MAP30, respectively, as shown in FIGS. 14A-14C. An interpretation map (e.g., MAP10, MAP20, and MAP30) show patches that explain contribution of each pixel at and around the feature of interest (e.g., F10, F20, and F30) towards making a prediction (e.g., defective or not defective) related to the feature of interest. In an embodiment, the patches may have intensity values indicative of an influence of neighboring features (e.g., corresponding to points P1-P20 in FIG. 13) on the decision that the feature of interest will be defective or not defective after etching.

For example, in the interpretation map MAP10, patch E1 (e.g., positive pixel values) contributes towards making the decision that the feature F10 (in ADI10) will not defective after etching, while patch E2 (e.g., negative pixel values) contributes towards making the decision that the feature F10 (in ADI10) will be defective after etching. Similarly, in the interpretation map MAP20, patch E3 (e.g., positive pixel values) contributes towards making the decision that the feature F20 (in ADI20) will not defective after etching. Finally, in the interpretation map MAP30, patch E4 contributes towards making the decision that the feature F30 (in ADI30) will not defective after etching, while patch E5 (e.g., negative pixel values) contributes towards making the decision that the feature F30 (in ADI30) will be defective after etching. The interpretation map or the pixel values therein can be further used to take actions such as adjusting a patterning process recipe (e.g., etch recipe) to improve yield of the patterning process.

In an embodiment, optionally, the ADI image and a corresponding interpretation map may be superimposed to generate a superimposed image. For example, ADI10 and MAP10 may be superimposed to generate a superimposed image S10. Similarly, ADI20 and MAP20, and ADI30 and MAP30 may be superimposed to generate a superimposed image S20 and S30, respectively. In an embodiment, the superimposed image or pixel values therein can be further used to take actions such as determining recipes for certain portions of an imaged substrate.

FIG. 15B is a flow chart of a method 1500 for determining an interpretation model associated with a feature of interest. The interpretation model is configured to explain a prediction related to the feature of interest. For example, if there are N number of features of interest, then N number of interpretation models can be determined—one for each feature of interest. As discussed in FIGS. 13 and 14A-14C, the interpretation model can generate an interpretation map for a feature of interest, such that the interpretation map can explain contributions of a vicinity of the feature of interest towards making a prediction associated with the feature of interest. Further, based on the interpretation map, actions related to improve a patterning process (e.g., etch process) may be taken. For example, if the interpretation map includes a patch which has relatively high contribution towards making a prediction that the feature will be defective, then an etch recipe may be adjusted for that particular patch.

According to the present disclosure, the method 1500 can be performed after a model (e.g., 403) related to a patterning process is trained to predict a future characteristic of any feature in, e.g., an after development image. The future characteristic (also referred as the prediction) can be, for example, CD or defectiveness of features. For example, the trained model 403 can predict whether features in the ADI image will print with defect or without a defect after etching using an etching recipe. The present method 1500 is not limited to a particular prediction or classification associated with a feature. In the following procedures of the method 1500, an example of prediction is defectiveness of a feature. As discussed earlier, defectiveness can represent a probability of failure of a feature after etching. In an example, for explaining the concepts of the present method, the defectiveness can be visualized as binary, e.g., defective or not defective.

Procedure P1501 includes obtaining, for example, via executing a trained model 403 associated with a patterning process (e.g., an etch process), training data set. In an embodiment, the training data set includes a plurality of predictions 1502 associated with a plurality of features in a vicinity of a feature of interest 1501 in an after development image (ADI), each prediction of the plurality of predictions being made by the trained model 403. In an embodiment, for training purposes, the vicinity of the feature of interest refers to location of features around the feature of interest 1501. For example, referring to FIG. 13, the points P1-P20 are in the vicinity of the point of interest P0.

In an embodiment, the obtaining of the plurality of predictions 1502 includes executing the trained model to predict a characteristic of each feature of the plurality of features in the vicinity of the feature of interest 1501. In an embodiment, similar to the procedure P403 discussed earlier, the obtaining of the after development image involves imaging, via a patterning apparatus, a mask pattern on a substrate; obtaining a developed substrate (e.g., resist development) of the imaged substrate; aligning the metrology tool (e.g., SEM in FIGS. 28 and 29) to the developed substrate at a given location (e.g., location of feature of interest); and capturing an image of the developed substrate. In an embodiment, the after development image may be obtained from a database (e.g., of a computer system in FIG. 30) that stores metrology data (e.g., SEM images) of a substrate.

In an embodiment, the ADI image including the plurality of features is provided as input to the trained model 403. The trained model then predicts, e.g., a defectiveness of the plurality of features. In an embodiment, the prediction 1502 is a defectiveness of the feature in the ADI, wherein the defectiveness indicates a probability that the feature will be defective after etching. In an embodiment, the prediction 1502 is whether the feature of interest in the ADI will print with defect or no defect after etching.

Procedure P1503 includes determining distances 1503 between each location of the plurality of features and the feature of interest. In an embodiment, a distance 1503 is a linear distance between two locations, particularly, a location L1 of the feature of interest 1501 and a location L2 of a neighboring feature. For example, referring to FIG. 13, a distance D1 (not marked) between P0 and P1, a distance D2, between P0 and P2, and so on.

Referring back to FIG. 15B, procedure P1505 includes assigning, based on the distances 1503, weights to each prediction of the plurality of predictions. In an embodiment, the assigning of the weights to each prediction includes assigning a relatively higher weight to a prediction of the plurality of predictions if the distance associated therewith is relatively small. In an embodiment, the weights may be integer values or normalized values between 0 and 1 such that the sum of weights is 1.

For example referring to FIG. 13, higher weights are assigned to points P1, P2, P3, P10, P11, P12, and P13 compared to points P4, P5, P14, P15 and P16. In other words, the points in the vicinity of the point of interest P0 is considered to contribute more towards making a particular prediction related to the point of interest P0. For example, features corresponding to points P1, P2, P3, P10, P11 and P12 are assigned a weight of 0.9, while features corresponding to points P4, P5, P15 and P16 may be assigned a weight of 0.1. Accordingly, higher weights are assigned to predictions associated with features at locations close to the feature of interest 1501 compared to features further away from the feature of interest 1501. In an embodiment, the weights may be assigned according to an exponential function e.g., $e^{f(D)}$, where $f(D)$ is a function of the distance 1503.

Referring back to FIG. 15B, procedure P1507 includes determining, via fitting based on the weighted predictions 1505, model parameter values of the interpretation model 1510 so that a difference between output of the interpretation model 1510 and the weighted predictions 1505 is reduced. In an embodiment, the model parameter values explain contributions of each pixel of the ADI towards making the prediction related to the feature of interest.

In an embodiment, the determining of the model parameter values of the interpretation model is an iterative process including obtaining initial model parameter values and the weighted predictions; executing the interpretation model using the initial model parameter values to generate an initial output; and determining a difference between the weighted predictions and the initial output; adjusting, based on the difference, the initial model parameter values so that the difference is minimized.

In an embodiment, the interpretation model 1510 receives the ADI including the feature of interest 1501 as input and generates an interpretation map 1520 as output. In an embodiment, the interpretation map 1520 indicates contributions of a vicinity of the feature of interest 1501 towards making the prediction associated with the feature of interest 1501.

In an embodiment, the interpretation model 1510 is a linear model associated with the feature of interest in the ADI. In an embodiment, the linear model is fitted to the plurality of predictions using a linear regression employing a least squares error. FIG. 13 illustrates example of the interpretation model M1.

In an embodiment, the interpretation map 1520 is a pixelated image (e.g., MAP10, MAP20, and MAP30 in FIGS. 14A-14C) and the model parameter values are weights or values assigned to each pixel of the pixelated image. In an embodiment, the interpretation map is a binary map, wherein each pixel is assigned a value of either 0 or 1. In an embodiment, the binary map is generated by assigning each pixel a value of either 0 or 1 based on a pixel value breaching a threshold value, where 0 indicates the feature of interest will print with defect after etching and 1 indicates the feature interest will print with no defect after etching. In an embodiment, the threshold value is a value above which the contribution are considered positive or in favor of a prediction or vice-versa.

In an embodiment, the interpretation map 1520 is a colored imaged, where a particular color (e.g., RGB values) are assigned based on the model parameter values.

After training the interpretation model 1510, it can be used for understanding predictions associated with the feature of interest. For example, as shown in FIG. 14A, the ADI image ADI10 including the feature of interest F10 can be input to the interpretation model 1510. Then, the interpretation model generates the interpretation map e.g., MAP10. The interpretation map MAP10 includes the patches E1 and E2 that visually explains what portions of region around the feature F10 contributes towards prediction that the feature F10 will print with no defect after etching. For example, an area of patch E1 is substantially greater than E2, hence an interpretation can be made that E1 has a higher contribution.

In an embodiment, the interpretation model can be optimized, for example, by modifying metrology setting and determining portions within the ADI that best explain the quality of defectiveness classification. For example, an initial eigenvector provides 92% classification accuracy, while after optimization two eigenvectors may be identified that improves the classification accuracy to 94%, or after optimization six eigenvectors can improve the classification accuracy to 99%. An example optimization process for determining optimum parameters (e.g., relevant eigenvectors) is discussed as follows. In an embodiment, during optimization process, changes can be made to a metrology tool settings, a number of eigenvectors to take into account or other settings. The optimized parameters (e.g., eigenvectors) are explainable classification that can be applied to any input ADI.

Figure 16:
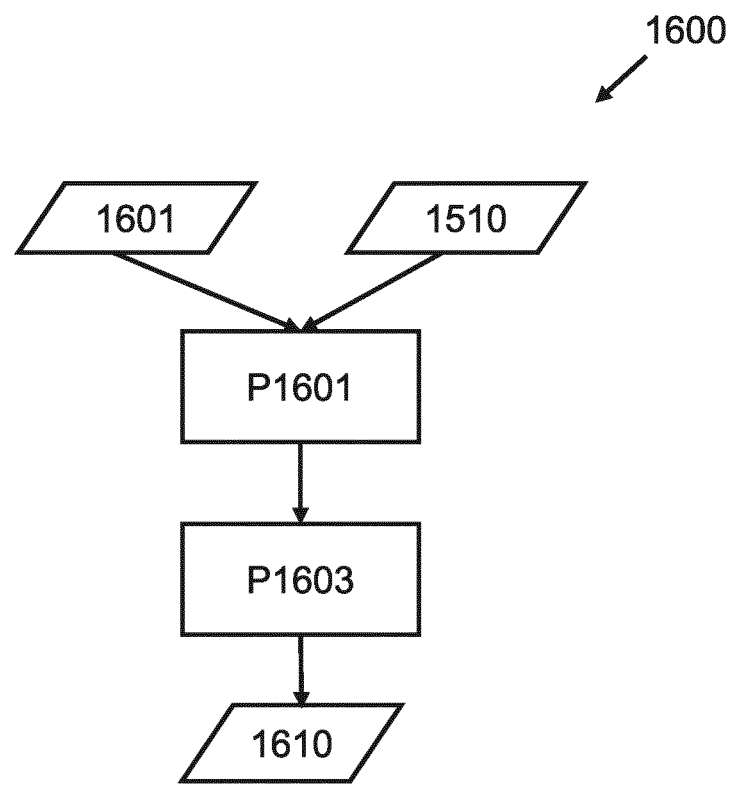
FIG. 16 is a flow chart of a method for identifying contributions of a vicinity of a feature of interest towards classifying a defectiveness of the feature of interest, according to an embodiment.

In an embodiment, a method of applying the interpretation model 1510 is discussed with respect to FIG. 16. FIG. 16 is a flow chart of a method 1600 for identifying contributions of a vicinity of a feature of interest towards classifying a defectiveness of the feature of interest. The method 1600 includes procedures as discussed below.

Procedure P1601 includes obtaining an after development image 1601 (e.g., ADI10, ADI20, ADI30 in FIGS. 14A-14C) including the feature of interest (e.g., features F10, F20, and F30), and an interpretation model (e.g., 1510 of FIG. 15B) associated with the feature of interest. Procedure P1603 includes applying the interpretation model 1510 to the ADI 1601 to generate an interpretation map 1610. In an embodiment, the interpretation map 1610 comprises pixel values that quantify contributions of each pixel of the ADI 1601 towards classifying the defectiveness of the feature of interest.

As mentioned herein, in an embodiment, the interpretation model 1510 is a linear model associated with the feature of interest in the ADI 1601. In an embodiment, the interpretation map 1610 is a pixelated image, where each pixel has a weight indicative of an amount of contribution of the each pixel towards classifying the defectiveness of the feature of interest. In an embodiment, the interpretation map 1610 may be a binary map, where each pixel is assigned a value of either 0 or 1.

In the above method, the after development image and the after etch image are used as examples to explain concepts of the present disclosure. However, the methods discussed herein are not limited to such ADI image and AEI image. A person skilled in art can perform the above methods using any images obtained before and after a particular process (e.g., OPC, optical process, resist process, etching, chemical mechanical polishing, etc.) or a combination of processes related to the patterning process. The model then establishes are relationship between using such images to determine contribution of a process recipe (e.g., optical process recipe, resist process recipe, etch recipe, etc.) towards probability of failure after the process is performed.

As mentioned earlier, there are a number of algorithms that classify failures of contact holes after development based on SEM images. The criteria for error classification can be based on common sense in interpreting SEM images. For example, error criteria could be low SEM contrast or small critical dimension (CD). Furthermore, attempts have been made to estimate the failure rate from CD distribution of the contact holes based on certain criteria. For example, the criteria can be (i) contact hole fails below a certain focus-dependent critical CD, (ii) fraction of failures that is a function of mean CD minus three standard deviations of CD, or variants of this including skew and kurtosis, also referred as 'tail CD'. The prediction by tail CD may be empirical, which could depend on a process used for patterning. Moreover, deviations from predictions may be dependent on the focus.

In the present disclosure, AEI failing and non-failing contact holes are considered to have a different characteristics in ADI measurements. Hence, as discussed in an example, ADI CD distribution can be decomposed in two independent distributions accounting for AEI measured failing and non-failing contact holes. The relative contribution of these ADI CD distributions determines the fraction of failing holes after etch.

In an embodiment, the ADI CD distribution of failing and non-failing holes after etch are different, but these two CD distributions can be overlapping. Failures may not be classified by a FEM-independent CD threshold. However, when the CD distribution of all contact holes at a certain FEM condition is obtained, it can be fitted as the sum of two distributions, and the relative contribution of these distributions predict the fraction of failing holes after etch.

Figure 17:
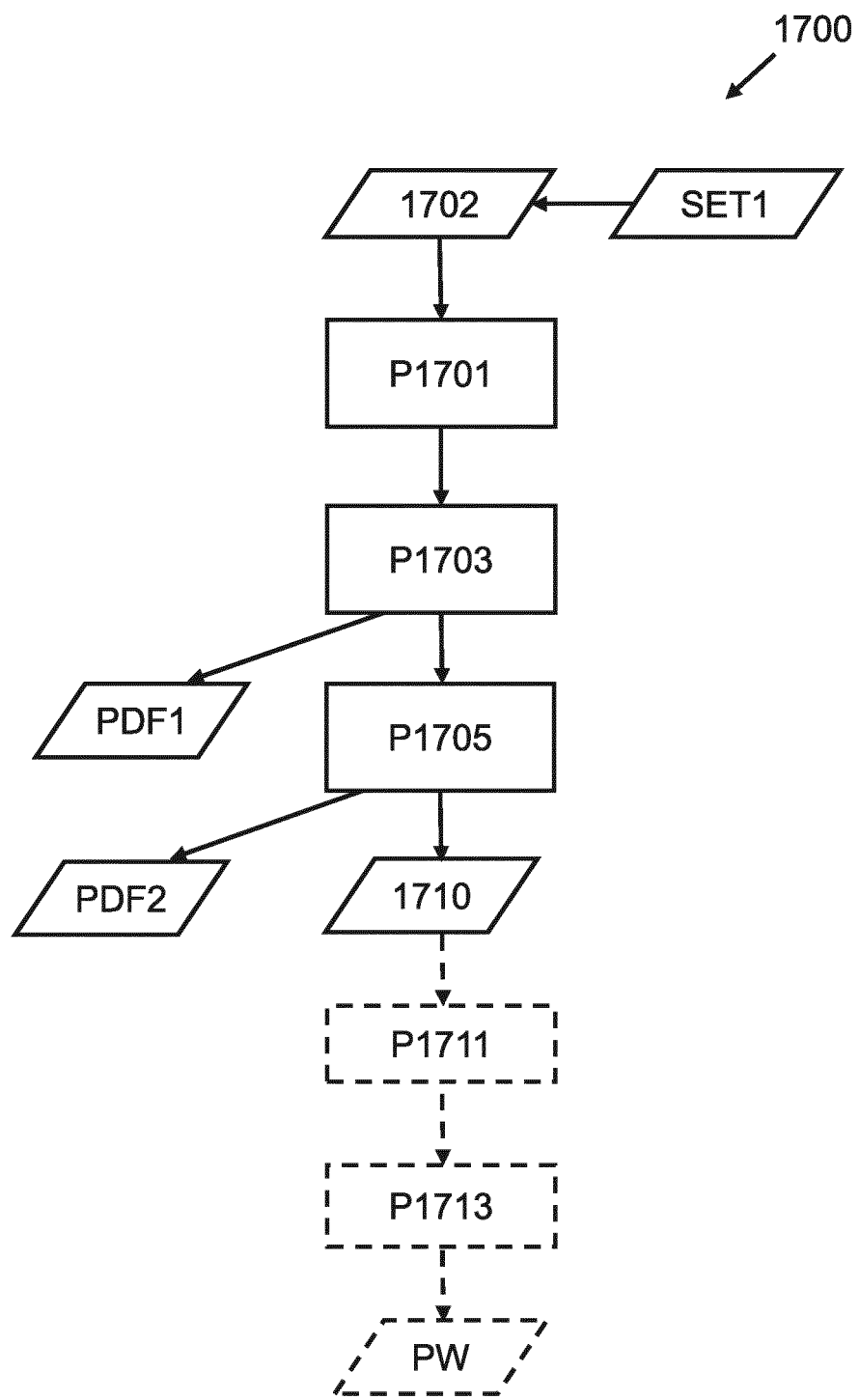
FIG. 17 is a flowchart of a method for predict fraction of feature failures (after etch) from ADI measurements using a model composed a first part (e.g., a first CD distribution) and a second part (e.g., a second CD distribution), according to an embodiment.

FIG. 17 is a flowchart of a method 1700 of determining fraction of feature failures after etch from ADI measurements based on a model composed a first part (e.g., a first CD distribution) and a second part (e.g., a second CD distribution). The model generated using the method 1700 can be applied for improving a patterning process. For example, the model can be used to estimate of the fraction of filled contact holes from an ADI measurement. The estimated filled holes can for example be used as follows. In an example application, the estimated filled holes can be used during ramp-up of the lithographic process. For example, the lithographic apparatus can be tuned to reduce the number of filled contact holes. Examples of improvements are tuning dose and focus of the scanner, or extra filtering steps for the resist. In another example application, during ramp-up, the fraction of filled contact holes can be used to assess whether extra descumming or punch-through should be used before etch to reduce the impact of filled contact holes. In yet another example application, during HVM, the ADI CD distribution can be inspected to see whether the machine is still in spec. Note that this would require a prohibitively large amount of contact holes per wafer. However, when all data of a certain time frame (e.g. 1 day) is combined, such fitting might be feasible. The method 1700 for generating the model and predicting fraction of features that may fail is discussed in details as follows.

Procedure P1701 includes obtaining the after development image (ADI) 1702 of a substrate, the ADI image 1702 includes a plurality of features. In an embodiment, the ADI is an image of a printed substrate obtained via a metrology tool or from a database storing images of the printed substrate. In an embodiment, the plurality of features of ADI image include a plurality of holes, a plurality of pillars, a plurality of lines, or a combination thereof. Accordingly, in an embodiment, the fraction of features of the ADI image classified as defective after etching includes at least one of: a closed hole or a missing hole after etching due to resist blocking a development of the hole; a merging hole after etching; a necking of a line of the plurality of lines; bridging lines, or a combination thereof.

In an embodiment, the physical characteristic may be a critical dimension (CD) of a feature in the ADI image, and a physical characteristic threshold value associated with the feature can be a CD threshold value. For example, the CD of a contact hole is determined by calculating the surface area enclosed by the contour resulting from a contouring algorithm (e.g., the CD obtained at multiple metrology tool thresholds for each feature of interest), and then the diameter of a circle can be determined with the same surface area. In an embodiment, the physical characteristic may be at least one of: a geometrical average of CDs of a feature, where the CDs may be measured along a first direction (e.g., x-direction) or a second direction (e.g., y-direction) in the ADI image; a directional CD of the feature of interest in the ADI image; a curvature variance of the feature of interest in the ADI image; or CD obtained at multiple metrology tool thresholds for each feature of interest. In an embodiment, a directional CD is at least one of: a CD measured along the x-direction; a CD measured along the y-direction; or a CD measured along a desired angle. The physical characteristic values (e.g., CD values) or a subset thereof can be used for generating the model, as discussed below. In an embodiment, the physical characteristic can be a function of one or more physical characteristics. For example, the physical characteristic can be a square of CD values. The present disclosure is not limited to a particular physical characteristic. It can be understood by a person skilled in the art that any physical characteristic that can be used to characterize a failure of a feature can be used herein.

Procedure P1703 includes generating a first part (e.g., a first probability distribution function (PDF1)) of a model 1710 based on the physical characteristic values (e.g., CD, EPE) related to a subset SET1 of features of the ADI image 1702. Procedure P1705 includes generating a second part (e.g., a second probability distribution function (PDF2)) of the model based upon the first part of the model and the physical characteristic values (e.g., CD) related to all the features of the plurality of features of the ADI image 1702. In an embodiment, the subset SET1 of features of the ADI image are differentiated from other features of the ADI image 1702. For example, the subset SET1 can be features having CD values above a specified threshold. In an embodiment, the subset SET1 is fitted using a truncated PDF. In an embodiment, using truncated PDF changes the normalization of the PDF based on a threshold (e.g., $CD_u$) and fit parameters.

In an embodiment, the generating of the first part of the model and the second part of the model comprises fitting of a first probability distribution function PDF1 and a second probability distribution function PDF2, respectively by maximizing a log-likelihood metric of the model 1710. In an embodiment, the model 1710 is a combination of the first probability distribution function PDF1 and the second probability distribution function PDF2. In an embodiment, the first probability distribution function PDF1 is configured to estimate distribution of the physical characteristic values (e.g., CD) for non-failing features (e.g., non-failing holes). In an embodiment, the non-failing holes may indicate having very low probability of failure. For example, a failure rate in a given range (e.g., 0 to 0.1). In an embodiment, the second probability distribution function PDF2 is configured to determine failure rates based on physical characteristic values of all the plurality of features of the ADI image.

In an embodiment, the model 1710 is a weighted sum of the first probability distribution function, and the second probability distribution function. For example, the model is a total distribution computed as a weighted sum of the first function PDF1 and the second function PDF2 for failing and non-failing, respectively.

In an embodiment, the first probability distribution function is a normal distribution (or a truncated normal distribution) characterized by a truncation value (e.g., $CD_u$) related to the physical characteristic, a first location parameter that describes a shift (e.g., mean) of the normal distribution and a first scale parameter (e.g., sigma) that describes a spread of the normal distribution. In an embodiment, as in equation 1, the square of the CD is fit with a normal distribution, while the CD itself may be fit with another (e.g., GEV) distribution.

In an embodiment, the second probability distribution function is a generalized extreme value (GEV) distribution characterized by a second location parameter ($\mu$) that describes a shift in the GEV distribution, a second scale parameter ($\sigma$) that describes a spread of the GEV distribution, and a shape parameter ($\xi$) that describes a shape of GEV distribution.

In an example of the present description, the model 1710 or the total distribution that is fitted is the sum of a normal distribution of a square of the ADI CDs and a generalized extreme value (GEV) distribution. For example, a total probability distribution function (PDF) can be given by $$f(x; p_{GEV}, \Theta_N, \Theta_{GEV}) = (1 - p_{GEV}) 2x \cdot N(x^2; \Theta_N) + p_{GEV} GEV(x; \Theta_{GEV})$$

In the above equation, variable x represents the physical characteristic of the features of ADI, e.g., CD, $p_{GEV}$ represents a cumulatively probability of tail of the GEV distribution, $\Theta_N$ represents parameters of a normal distribution or a truncated normal distribution and $\Theta_{GEV}$ represents parameters of a GEV distribution.

In an embodiment, the log-likelihood of the above PDF can be computed by following equation:

$$l(p_{GEV}, \Theta_N, \Theta_{GEV}) = \sum_{i=1}^{n} \log(f(x_i; p_{GEV}, \Theta_N, \Theta_{GEV}))$$

Using the above example of normal and GEV distributions, the present method generates the model in two steps as discussed below.

In an embodiment, when unconstraint numerical maximization of $l(p_{GEV}, \Theta_N, \Theta_{rGEV})$ is used, the GEV may fit the noise on the non-failing distribution, rather then fitting the tail of the distribution. Therefore, it is assumed that $p_{GEV}$ is small. To this end, a two-step procedure (e.g., including P1703 and P1705) is employed to generate the model (e.g., 1710) as follows.

First, fit $CD^2$ above a certain $CD_u^2$ with a truncated normal distribution that is truncated from below. For example, FIG. 16 illustrates an example of truncated normal distribution 1810, where $CD_u$ is 15 nm. In other words, CD values above 15 nm are used to fit the normal distribution.

$$PDF(CD) = \begin{cases} 0 \text{ if } CD < CD_u \\ \dfrac{2CD \cdot PDF_N(CD^2, v_N, \rho_N)}{1 - CDF_N(CD_u^2, v_N, \rho_N)} \text{ if } CD \geq CD_u \end{cases}$$

In the above equation, $v_{\mathcal{N}}$ and $\rho_{\mathcal{N}}$ are related mean and standard deviation of the normal distribution that can follow from maximizing the log-likelihood. For example, $\mu_{\mathcal{N}} = \sqrt{v_{\mathcal{N}}}$ and $$\sigma_N = \frac{\rho_N}{2\sqrt{v_N}}.$$

In an embodiment, the values of $v_{\mathcal{N}}$ and $\rho_{\mathcal{N}}$ can be solved iteratively until the log-likelihood of above PDF(CD) is maximized. Also, in the above equation, $PDF_{\mathcal{N}}$ refers to a probability distribution function of a normal distribution, and $CDF_{\mathcal{N}}$ refers to a cumulative distribution function of the normal distribution function. In an embodiment, $CD_u^2$ may be initially chosen such that it is $v_{\mathcal{N}} - 2\rho_{\mathcal{N}}$. This can be achieved iteratively.

Furthermore, after fitting at a second step (discussed below with respect to GEV), it can be checked whether the predicted fraction of failing holes for which $CD \geq CD_u$ is below a certain threshold (e.g., less than 1%). If this is not the case, the procedure (e.g., P1703 and P1705) can be repeated with a larger value of $CD_u$ (e.g., greater than 15 nm).

In an embodiment, a total CD distribution is fitted with the distribution proposed in Eq (1), keeping $v_{\mathcal{N}}$ and $\rho_{\mathcal{N}}$ fixed to the previously obtained values. $p_{GEV}$, $\xi$, $\sigma_{GEV}$, $\mu_{GEV}$ can be determined by maximizing the log-likelihood.

Such fitting process and equations used therein may be implemented using any nonlinear programming solver. The nonlinear programming solver can find a minimum of unconstrained multivariable function specified. In an embodiment, $\xi=0$ may be chosen to improve robustness.

As discussed with respect to the example above, the generating of the model involves fitting the first probability distribution function (e.g., normal distribution) based on a square of the physical characteristic (e.g., $CD^2$) values of the subset of features by maximizing a first log-likelihood metric related to the first probability distribution function. In an embodiment, the subset SET1 of features have values of the physical characteristics above a physical characteristics threshold value. Then, the fitted first probability distribution function can be combined with the second probability distribution function. Based on the combined distribution, the second probability distribution function can be fitted based on the physical characteristics values of all the features of the plurality of features so that a second log-likelihood metric related to the combined distribution is maximized. In an embodiment, a relative weight of the second distribution is determined in the fitting process.

Figure 18A:
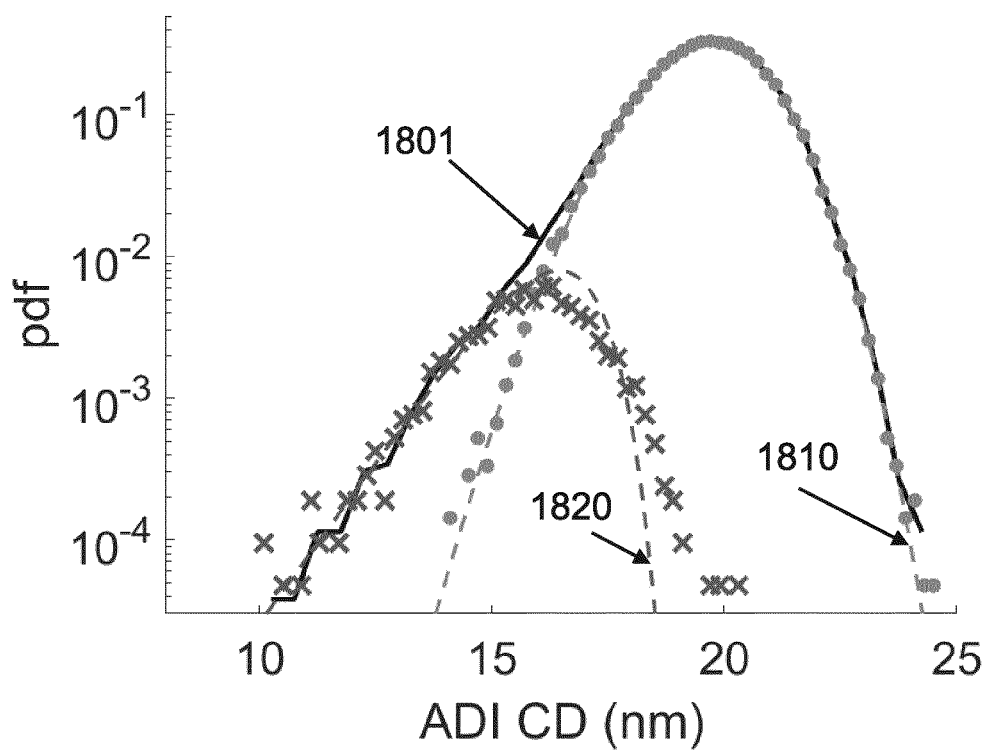
FIG. 18A illustrates an example model including a first probability distribution function and a second probability distribution function, according to an embodiment.

FIG. 18A is an example fitting of two probability distribution functions based on CD values of features in ADI image. The dots indicate non-failing holes (e.g., determined based on analysing etch data) and the crosses indicate failing holes (e.g., based on etch data and CD being less than a desired value). A truncated normal distribution 1810 (an example of the first probability distribution function) can be fitted using CD values of the non-failing holes, where holes with the CD values above a CD threshold (e.g., 15 nm) are considered non-failing holes. Further, a GEV distribution 1820 can be used for tails (e.g., CD below 15 nm) and a total distribution 1801 can be fitted e.g., using equation (1) above and all the ADI CD values. In an embodiment, for an overlapping region (e.g., around 15 nm), both the normal and GEV distribution may have similar weights (e.g., expressed by $p_{GEV}$ in Eq. (1)). In an example, the value of $p_{GEV}$ GEV(x; $\Theta_{GEV}$) is much larger than $(1-p_{GEV})2 \cdot CD \cdot N$ $(CD^2; \Theta_N)$ for small CD and the optimal fit parameters, although $p_{GEV}$ may be close to 0. In an embodiment, the weight associated with the GEV distribution progressively increases as the CD values progressively decrease.

In an embodiment, the fitting of the first probability distribution function is an iterative process. The iterative process includes (a) determining the first log-likelihood metric using given values of parameters of the first probability distribution function; (b) determining whether the first log-likelihood metric is maximized; (c) responsive to not maximized, adjusting, based on a gradient, the values of the parameters of the first probability distribution function, and performing steps (a)-(c). In an embodiment, the gradient is a first derivative of the first log-likelihood metric with respect to the parameters of the first probability distribution function.

In an embodiment, the fitting of the second probability distribution function involves determining, based on maximizing of the second log-likelihood metric, values of parameters of the second probability distribution function and its weight without modifying the values of the parameters of the first probability distribution function.

In an embodiment, the fitting of the second probability distribution function (e.g., 1820) is an iterative process. The iterative process involves (a) obtaining the combined distribution of the fitted first probability distribution function and the second probability distribution function; (b) determining, based on the combined distribution (e.g., 1801) and keeping the values of parameters of the fitted first distribution fixed, the second log-likelihood metric using given values of the parameters of the second probability distribution function; (b) determining whether the second log-likelihood metric is maximized; and (c) responsive to not maximized, adjusting, based on a gradient, the values of the parameters of the second probability distribution function, and performing steps (b)-(c). In an embodiment, the gradient is a first derivative of the second log-likelihood metric with respect to the parameters of the second probability distribution function. In an embodiment, it is the combined probability distribution function (e.g., 1801) that can be employed as the model 1710 for predicting failures or failure rates of ADI features.

Figure 18B:
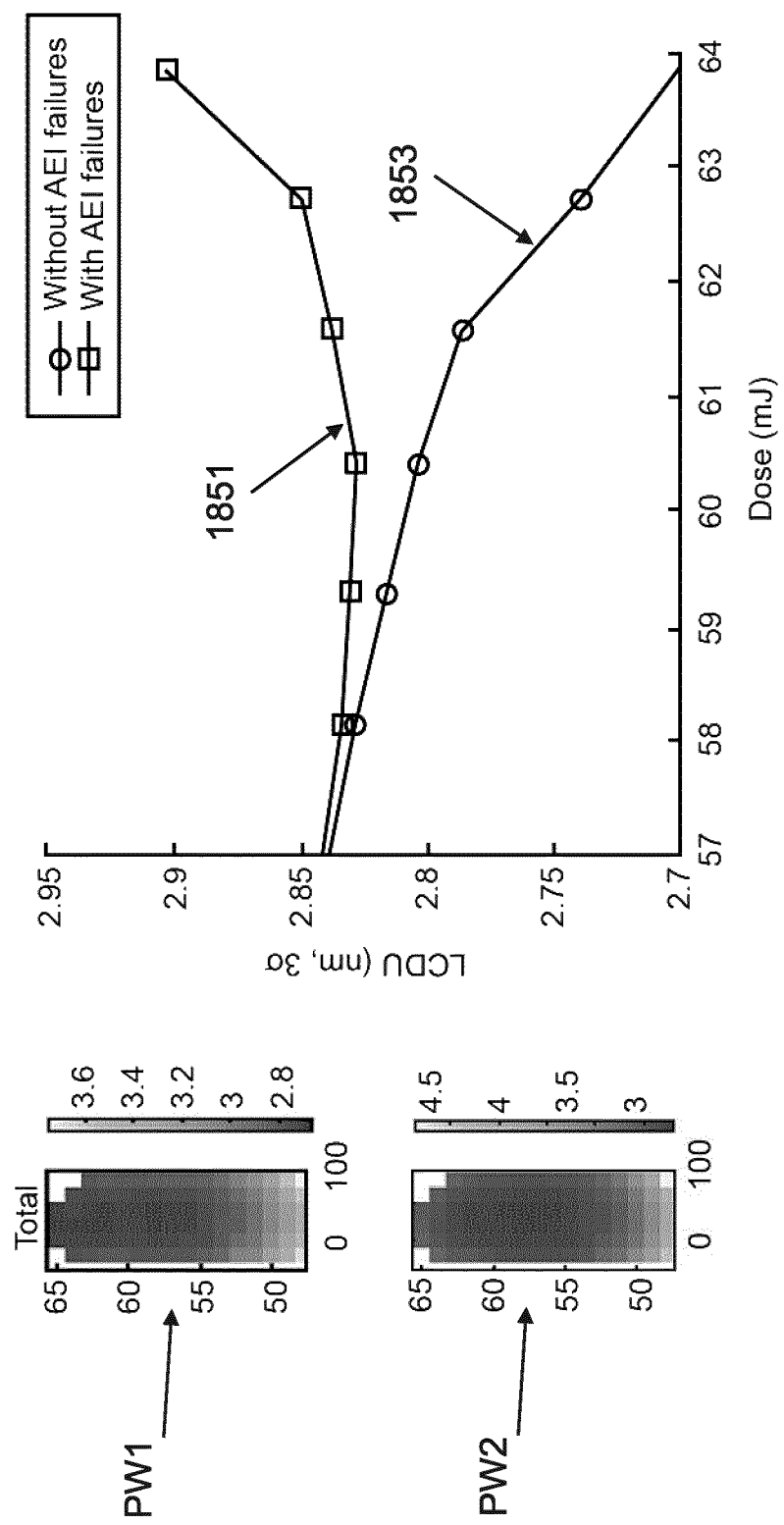
FIG. 18B illustrates focus-exposure matrix (focus on x-axis, dose on y-axis) associated with ADI that results in AEI with failing and non-failing features, LCDU variation with respect to dose for best focus used to print the ADI, according to an embodiment.

Referring to FIG. 18B, illustrates a first focus-exposure matrix PW1 (focus on x-axis, dose on y-axis) where the ADI LCDU is plotted of ADI holes that results in non-failing features AEI, and another focus-exposure matrix PW2 associated with an ADI that after etching may include both failing and non-failing. FIG. 18B also shows how the LCDU of a pattern varies with dose for the failing and non-failing AEI. There is a clear difference between the LCDU as a function of dose for all holes and for non-failing features. For example, curve 1851 illustrates a LCDU as a function of dose for all holes, and curve 1853 illustrates a LCDU as a function of dose for non-failing holes in AEI. In an example, when there are merging holes after etch, the LCDU (curve 1851) increases at higher doses. On the other hand, when there are non-failing holes after etch, the LCDU (curve 1853) decreases at higher doses. This relationship indicates that the fitting parameters of e.g., CD distribution associated with failing and non-failing features (e.g., contact holes) will be different. The fitted CD distribution can be used to determine, for example, the process window. In the present embodiment, the model 1710 captures the relationship between LCDU and dose more accurately, as the model 1710 is a combined distribution of a first distribution and the second distribution as discussed earlier. Hence, statistical parameters or characteristics of the fitted distribution 1710 can be used to more accurately determine a process window of a patterning process, for example.

In an embodiment, the method 1700 may further include procedures P1711 and P1713 configured to determine a process window PW. In an embodiment, the P1711 comprises extracting statistical characteristics of the fitted probability distribution 1710 (e.g., PDF1 in FIG. 17) that are related to non-failing features. For example, the statistical characteristics can be a mean, standard deviation, skewness, or other statistic related to contact holes that print on the substrate.

In an embodiment, in procedure P1713, the extracted statistical characteristics of the fitted distribution 1710 is employed for determining a process window. For example, the process window comprises a range of dose-focus values that cause features to print on the substrate without defects or very less number of defects (e.g., 1 defective feature in a million features). An example method of determining the process window is discussed in U.S. patent application No. 62/980,068, filed on Feb. 21, 2020, which is incorporated herein by reference in its entirety.

As discussed earlier, the method 1700 has several applications. Accordingly, the method 1700 can be further modified to includes improve the patterning process. For example, the method 1700 can further include imaging, via a patterning apparatus, a desired pattern comprising another plurality of features on another substrate; obtaining the after development image of the imaged pattern; executing the first and second probability distribution functions using the after development image to classify a fraction of features within ADI as defective after etching; and adjusting, based on the classified features, an etching condition such that the imaged pattern will not fail after etching.

In another example application, the method 1700 can be further modified or used to tune a lithographic process to reduce the failure rate of ADI features after etching, wherein the tuning comprises adjusting dose, focus, or both. In yet another applications, the method 1700 can be used to determine whether extra filtering step for a resist layer should be performed to reduce the failure rate of the ADI features after etching. In yet another application, the method 1700 can be used to determine whether an extra descumming or punch through step should be should be performed to reduce the failure rate of the ADI features after etching. In yet another application, the method 1700 can be used to inspect, during high volume manufacturing, ADI features to determine whether a lithographic apparatus satisfies specified criteria of printing. In yet another application, the method 1700 can be used to rework, based on the failure rate, a certain substrate or a lot of substrate before etching.

In an embodiment, a system can be configured for determining, using the two part model, a fraction of features that will fail after etching based on the ADI measurements. In an embodiment, the system includes a metrology tool (e.g., SEM of FIG. 28 and FIG. 29) for capturing an after development image (ADI) of a substrate at a given location, the after development image including a plurality of features; and a processor (e.g., 104 of FIG. 30) configured determine failure rates based on the ADI. In an embodiment, the processor (e.g., 104) is configured to execute a model (e.g., 1710 of FIG. 17) for determining failure rates of the plurality of features of ADI that will fail after etching. In an embodiment, the model is a combination of (i) a first probability distribution function configured to estimate distribution of the physical characteristic values for non-failing holes, and (ii) a second probability distribution function configured to determine failure rates based on physical characteristic values of all the plurality of features of the ADI.

In an embodiment, the system further includes a patterning apparatus (e.g., FIG. 1, and FIGS. 31-34) configured to image a desired pattern comprising the plurality of features on the substrate. The processor (e.g., 104) can be further configured to receive, via the metrology tool, the ADI of the imaged substrate; execute the first probability distribution (e.g., fitted PDF1) and the second probability distribution (e.g., fitted PDF2) to determine the failure rates of features of the ADI, and tune, based on features having relatively higher failure rates, the patterning apparatus to reduce the failure rates of the features. In an embodiment, the processor (e.g., 104) can be configured to tune a dose or focus via knobs/settings of the patterning apparatus.

In an embodiment, the processor (e.g., 104) can be further configured to: determine whether extra filtering step for a resist layer should be performed to reduce the failure rate of the ADI features after etching; determine whether an extra descumming or punch through step should be should be performed to reduce the failure rate of the ADI features after etching; or inspect, during high volume manufacturing, ADI features to determine whether a lithographic apparatus satisfies specified criteria of printing.

In an embodiment, the metrology tool (e.g., FIGS. 28 and 29) comprises a scanning electron microscope (SEM). The SEM can be configured to measure at least one of the following physical characteristic: an average CD of a plurality of instances of a feature of interest in the ADI; a directional CD of the feature of interest in the ADI; a curvature variance of the feature of interest in the ADI; or CD obtained at multiple metrology tool thresholds for each feature of interest.

As mentioned herein, random stochastic failures (interchangeably referred as defect) can significantly affect performance of the EUV lithography printing. Identifying failures can be done either after lithography step, or after etching step. There is a number of algorithms that classify failures of features such as contact holes after development using SEM image. The criteria for such failure classification are based on common sense interpreting of SEM images. For example, failure criteria could be SEM contrast or critical dimension (CD). The methods discussed above provide, in an embodiment, improved defectiveness classification and predictions of failures based on ADI. Additionally methods are provided to estimate the failure rate from the CD distribution of the contact holes.

As discussed earlier, the existing methods have several limitations. For example, defect classification may be calibrated based on a capture rate of programmed defects or by comparing defect rates before and after etch. It has been shown that programmed defects are statistically different from random defects, for example, see publication P. De Bisschop mentioned earlier.

The methods discussed herein provide improved defect classification based on training data of repeated SEM measurements ADI and AEI at the same location, as described in methods above. The methods herein results in a successful classification of e.g., 93.5% of the holes for an error-prone FEM condition.

A general disadvantage of predicting failure rates over defect classification is that less information is gathered, and the defect classification cannot be assessed visually. The prediction by tailCD (i.e., a tail of CD distribution) is an empirical one and that could depend on the process performed on the substrate.

In an embodiment, the method of defect classification discussed herein, use of the fact that, to some extent, features (e.g., contact holes) that will fail after etch, look different in a static ADI image (e.g., a SEM image of the ADI). In the present disclosure, it was observed that the difference in ADI images between e.g., contact holes that do or do not fail after etch is small, and can be hardly visible by the naked eye in many cases. It was also observed, via example experimentation, that the ADI SEM damage (e.g., a difference in CD between the first and second SEM "repro" or reproducibility of measurements of the same ADI) is much larger for failing contact holes. In an embodiment, exposing the same location on a wafer two or more times to capture two different SEM measurements is referred as SEM "repro". Accordingly, in an embodiment, there is provided a method that uses dynamic SEM information to distinguish between failing and non-failing contact holes, or to improve failure prediction with this information.

As discussed herein (e.g., with respect to FIG. 3), performing SEM metrology after lithography damages the resist on the substrate such that it shrinks or extra carbon is redeposited on the resist. Such damages affects the CD of the features on the substrate as measured by the SEM, particularly when the SEM repro measurement is performed (e.g., taking two SEM images at the same location ADI). For example, in FIG. 3, missing contact hole defects after etch are caused by a layer of remaining resist inside the contact hole. Therefore, the geometry of failing and non-failing holes after etch is different. Both shrink and carbon rede-position could therefore be different, which yields a larger difference between SEM repro images of holes failing after etch. In an embodiment, there is provided a method (e.g., in FIG. 19) to determine defectiveness of the features based on repro measurements of the same ADI feature. In an embodiment, the repro measurements comprise at two SEM image of the ADI from which different signature for failing and non-failing contact holes can be determined.

Figure 19:
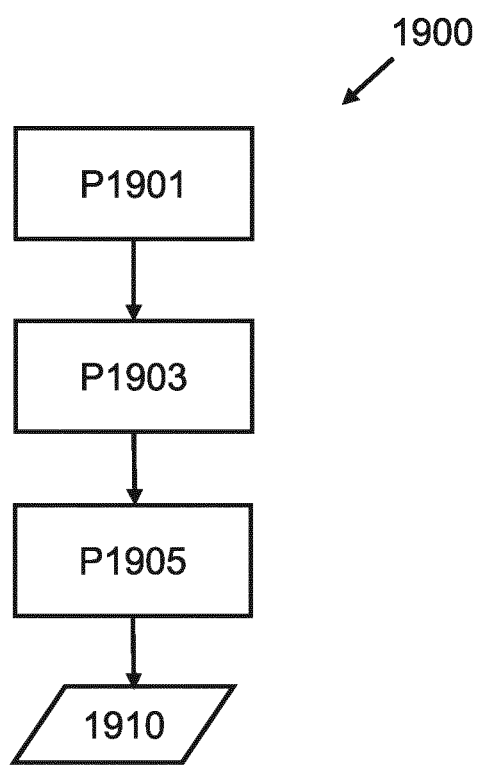
FIG. 19 is a flowchart of a method for determining a defect attribute of a feature in an after development image (ADI), according to an embodiment.

FIG. 19 is a flowchart of a method 1900 for determining a defect attribute of a feature in an after development image (ADI), according to an embodiment. In an embodiment, the defect attribute is whether the ADI feature is defective or not defective, or a probability of failure associated with the ADI feature. The method 1900 determines defectiveness based on a defect criterion, which can be e.g., CDs of first and second images. The method 1900 includes following procedures discussed in detailed below.

Procedure P1901 includes exposing an ADI feature to an electron-beam or a charged particle beam to produce a first image of the ADI feature, the ADI feature being a structure within a resist material. In an embodiment, the exposing includes exposing a plurality of ADI features to produce a plurality of first images. For example, multiple frames (e.g., 4, 5, 6, . . . , 50) of SEM image may be captured corresponding to different locations of the ADI feature on the substrate.

Procedure P1903 includes re-exposing the ADI feature to the electron-beam or the charged particle beam to produce a second image of the ADI feature. In an embodiment, the re-exposing step includes the plurality of ADI features to produce a plurality of second images. For example, multiple frames (e.g., 4, 5, 6, . . . , 50) of SEM image may be captured corresponding to same locations of the ADI feature on the substrate captured in P1901.

In an embodiment, the electron beam is generated via a scanning electron microscope (SEM), and the first image and the second images are SEM images. In an embodiment, a first set of images of an ADI feature (e.g., contact hole in a resist) may be captured of at different locations on the substrate. Further, the second set of images of the ADI (e.g., the contact hole) may be captured at the same locations (as used for first set of images) on the substrate.

In an embodiment, a SEM projects highly energetic electrons (also referred as e-beam) on the resist, which is a polymer, and causes damage to the resist. For example, the resist can shrink and hence the ADI feature (e.g., contact hole) size increases. A SEM may also deposit carbon that changes the CD of the ADI feature. The SEM measurement may have different effects on ADI features having different geometry because of different amount of resist to which the electrons may react. For example, referring to FIG. 3, an amount of resist left within a contact hole will have different geometry than another contact hole with no resist or relatively less resist in the contact hole. As such, for a partially filled contact hole, the electrons may react with the resist at a bottom and walls of the contact hole. On the other hand, for the contact hole having no resist at the bottom of the hole, the electrons may react with only resist walls of the contact hole. As such, damage to the resist of a filled contact hole will be different from not filled or relatively less filled contact hole, thereby causing different geometry changes after SEM measurements. In another example, the SEM damage caused to the resist in a circular contact hole can be different than damage caused to resist of an elliptical contact hole or other non-circular contact hole because the electron distribution in a circular contact hole and elliptical contact hole will be different. That is a reason that a first SEM measurement performed to measure the ADI feature followed by another SEM measurement will result in different results being obtained e.g., a second SEM image may have a slightly different geometry of the same ADI feature as compared to a first SEM image.

Procedure P1905 includes determining, based on the physical characteristic (e.g., CD) associated with the first image and the second image, a defect attribute of the ADI feature. For example, a first CD may be extracted from the first image and a second CD may be extracted from the second image. In an embodiment, the physical characteristic is a critical dimension, or pixel intensity associated with the ADI feature (e.g., contact hole).

In an embodiment, the defect attribute may be binary (e.g., whether the ADI feature is defective or not defective). In an embodiment, the defect attribute may be a probability of failure (e.g., characterized by a CD PDF fitted on failure data) associated with the ADI feature. In an embodiment, the determining of the defect attribute involves extracting a first characteristic from the first image and a second characteristic from the second image; determining, based on a difference between the first characteristic and the second characteristic, whether a defect metric is breached; and responsive to the defect metric being breached, classifying the ADI feature as defective.

In an embodiment, the first image captured in a first exposure comprises a plurality of images of the ADI feature. Similarly, the second image the re-exposure step comprises a plurality of images of the same ADI feature. For example, a metrology tool such as a Scanning Electron Microscope (SEM) scans an object (e.g., an ADI feature) with a focused electron beam. To get a reliable image with the least possible artifacts, the SEM may scan over the object multiple times (e.g. 8 times). The response of each scan is referred as a 'frame' and an average image may be generated by taking an average over multiple 'frames'. Hence, multiple frames (e.g., a first set of frames) of the ADI feature can be obtained from the first exposure step, and another multiple frames (e.g., a second set of frames) of the ADI feature can be obtained from the second exposure step. Accordingly, in an embodiment, an average image may be used as the first image from the first exposure, and a second average image may be used as the second image from the re-exposure. In another case, all or a subset of the frames of the first set of frames may be considered as the first image, and all frames or a subset of the frames of the second set of frames may be considered as the second image. Accordingly, a difference (e.g., CD difference, intensity difference, etc.) may be determined between all frames (or a subset) of the first set of frames and all frames (or a subset) of the second set of frames. It can be understood by a person of ordinary skill in the art that a frame can be represented as a pixelated image, each pixel having a grey scale value.

In an embodiment, the determining of the difference involves determining the difference between the physical characteristic (e.g., CD) extracted from one or more frames of the first image and the physical characteristic (e.g., CD) extracted from a corresponding one or more frame of the second image. For example, the first image may be include 4 frames and the physical characteristic (e.g., CD) can be extracted from each of the 4 frames. For example, the extracted physical characteristics can be CD1, CD2, CD3, and CD4. Similarly, after the re-exposure step, the second image may include 4 frames and the physical characteristic (e.g., CD) can be extracted from each of the 4 frames. For example, CD5, CD6, CD7, and CD8. Accordingly, a difference between be computed between, e.g., CD1 and CD5, CD2 and CD6, CD3 and CD7, and CD4 and CD8.

In an embodiment, the defect metric is a function of a first physical characteristic (e.g., CD1) of the ADI feature in the first image and a second physical characteristic (e.g., CD2) of the ADI feature in the second image. In an embodiment, the defect metric is a bilinear function, a trained machine learning model, or a second or higher order polynomial. For example, a function of two or more variables is called bilinear if it is linear with respect to each of its variables. The simplest example is $f(x,y)=xy$. In another example, the first image and the second image may include multiple frames, as discussed herein. From each frame a physical characteristic can be extracted (e.g., CD1, CD2, CD3, CD4, CD5, CD6, CD7, CD8). In this case, a multivariate distribution may be employed, where the multivariate distribution is a combined or joined PDF of CD1-CD8. In the above example, the bivariate function is used as an example to illustrate the concepts. However, the present disclosure is not limited the bivariate function. A person of ordinary skill in the art can modify the method to include a number of frames in the first image and the second image. Further, depending on the number of frames used to characterize the first image and the second image, the defect metric can be characterized by a multivariate function.

In an example, the defect metric is of the form $f(CD1, CD2)<0$, where CD1 is the CD in the first SEM image of an object, and CD2 is the CD of the same object in the second SEM image. An example of the defect metric is a function represented by line 2010 in FIG. 20.

Figure 20:
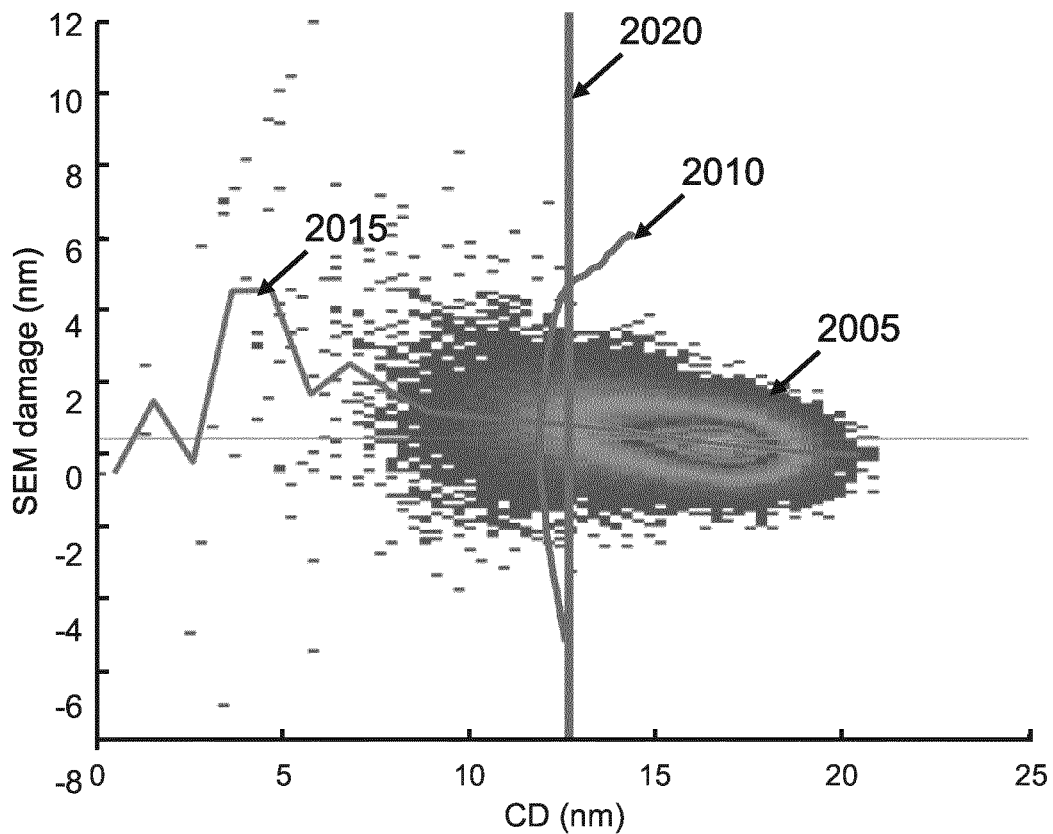
FIG. 20 is a plot of SEM damage against CD values of contact holes (e.g., for $10^5$ contact holes) at an error-prone condition in a FEM (e.g., at lower than normal dose), according to an embodiment.

FIG. 20 is a plot of SEM damage against CD values of contact holes (e.g., for $10^5$ contact holes) at an error-prone condition in a FEM (e.g., at lower than normal dose), according to an embodiment. The plot shows that the SEM damage is relatively higher for CD values smaller than a nominal CD. In the current embodiment, the SEM damage is characterized by a difference in a first CD and a second CD extracted from the first SEM image and the second SEM image, respectively. As shown in FIG. 20, this difference is relatively higher for CD values below 14 nm. SEM damage may be characterized in any of various methods. A moving average curve 2015 of SEM damage data 2005 further shows that SEM damage can be predictive of failure of an ADI feature (e.g., contact hole). For example, if a moving average of the SEM damage associated with a specified range of CD values exceeds a specified damage threshold (e.g., 3 nm), then the specified range of CD are more likely to fail after an etching process.

In an embodiment, the SEM damage information characterized by e.g., CD1 and CD2 derived from the first SEM image and the second SEM image, respectively, can be used to determine defect classification criteria, such as a curve 2010. In the present embodiment, the defect metric, used for defect classification, can be represented by the curve 2010. The defect metric 2010 serves as a CD defect threshold in relation to the SEM damage, which is a function of CD1 and CD2 of the same ADI feature obtained from the two SEM measurements. In an embodiment, the defect metric 2010 can be established based on defect data (e.g., failing contact holes and non-failing contact holes after etch), and CD1 and CD2 values extracted from the first SEM image and the second SEM image, respectively. In an embodiment, the defect metric 2010 indicates that if the SEM damage (characterized by CD1 and CD2 values) associated with an ADI feature having a nominal CD value is higher than the SEM damage associated with another ADI feature having the same nominal CD value, then the ADI feature having higher SEM damage has a relatively higher probability that the ADI feature will be defective after etching. The defect metric 2010 also indicates a minimum CD threshold value below which an ADI feature may be classified as defective even if the SEM damage may be zero or close to zero. In an embodiment, the defect metric 2010 can be a bilinear function that is fitted based on measurement data. It can be understood that the bilinear function is presented as an example and does not limit the scope of the present disclosure. Other multi-variate function e.g., 4, 8 variables etc. can be used as a defect metric, as discussed herein.

For comparison purposes, the plot in FIG. 20 also shows another defect criteria 2020. The example defect criteria 2020 represents a constant CD threshold value that does not depend on the SEM damage. For example, such constant CD threshold value 2020 can be set as discussed earlier e.g., with respect to FIGS. 7A-7B. In the example in FIG. 7A-7C, the CD threshold value is set based on failure data, where an ADI feature having CD value below the CD threshold can be classified as likely a failure and having a CD value above the CD threshold can be classified as not likely to be a failure. On the other hand, the defect metric 2010 based on SEM damage can more accurately classify the defective features compared to a simple single value CD threshold 2020.

In another example, a bivariate probability density function may be employed in the defect criteria. For example, a bivariate PDF can be a combined or joined PDF of two or more variables. In an embodiment, the bivariate PDF can be determined based on e.g., first SEM image and the second SEM image as discussed with respect to FIG. 22. The bivariate PDF can determine the probability that a first measurement will measure CD1 and the second measurement will measure CD2. In another example, the first SEM image and the second SEM may include multiple frames, as discussed herein. From each frame a physical characteristic can be extracted (e.g., CD1, CD2, CD3, CD4, CD5, CD6, CD7, CD8). In this case, a multivariate distribution may be employed, where the multivariate distribution is a combined or joined PDF of CD1-CD8.

In another example, the defect metric can be the trained machine learning model (e.g., CNN). The trained model can be obtained by training a machine learning model using a training data set comprising: (i) a plurality of image pairs, each image pair comprising a first image and a second image of a plurality of ADI features, and (ii) after etch images (AEI) of a substrate corresponding to the ADI features.

In an embodiment, the training of the machine learning model is an iterative process that involves (a) adjusting parameters of the machine learning model such that the model determines the defect attribute of a given ADI feature based on a comparison between the first image and the second image; (b) determining whether the model determined defect attribute is within a specified range of a defect attribute of the AEI feature corresponding to the given ADI feature; and (c) responsive to not being in the specified range, performing steps (a) and (b). In an embodiment, a gradient descent method may be employed to determine the model parameter values, the model parameter values causing the model determined defect attribute to converge to the defect attribute of the AEI feature. Once trained, the trained model can be used as the defect metric or a means to classify defects.

Figure 21:
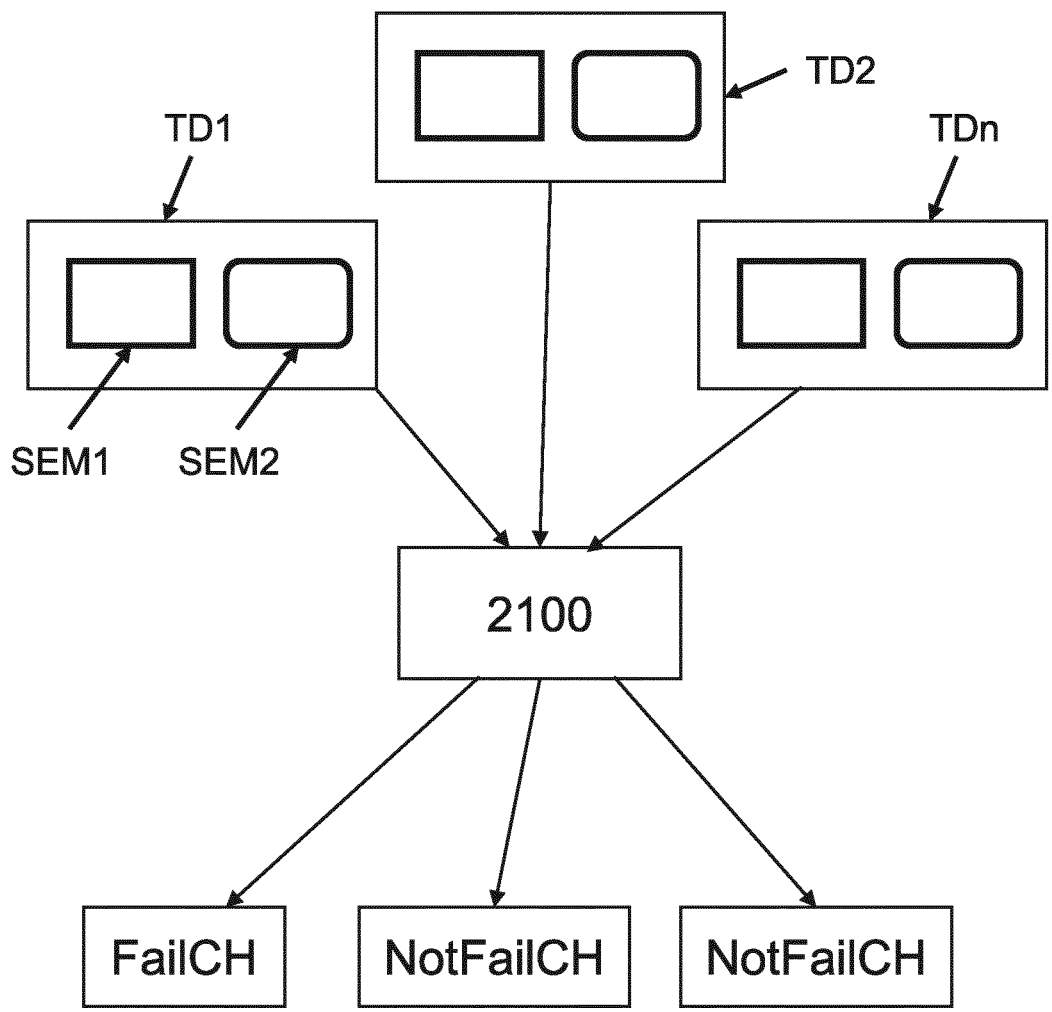
FIG. 21 is an example of training the machine learning model according to FIG. 21, according to an embodiment.

FIG. 21 is an example of training a machine learning model 2100 using training data set TD1, TD2, . . . , TDn comprising first images and second images, discussed above. In an embodiment, each data of the training data comprises a pair of the first image SEM1 and the second image SEM2 and reference AEI images (not shown). In an embodiment, the reference AEI images serve as ground truth that guides the machine learning model to accurately classify the inputs as a likely failure or not a failure. In an embodiment, one or more ADI features (e.g., contact holes, lines, etc.) may be used to generate the training data. For example, the training data may be generated based on the ADI features comprising a plurality of contact holes, a plurality of lines, and other specified structures. For each of the plurality of contact holes, and each of the plurality of lines, a corresponding pair of SEM1 and SEM2 images may be obtained via the SEM tool. Also, for each of the each of the plurality of contact holes, and each of the plurality of lines an AEI image can be obtained to serve as the ground truth. The output of the training of the machine learning model is the classification of the training data as likely failing (e.g., FailCH) or not likely failing (e.g., NotFailCH) of the ADI features, the failure being potentially observed in an after etch image (AEI). In an embodiment, the machine learning model can be a convolutional neural network or other existing neural networks trained using an existing training algorithm such as a gradient decent method. The present disclosure is not limited to a particular machine learning model.

Figure 22:
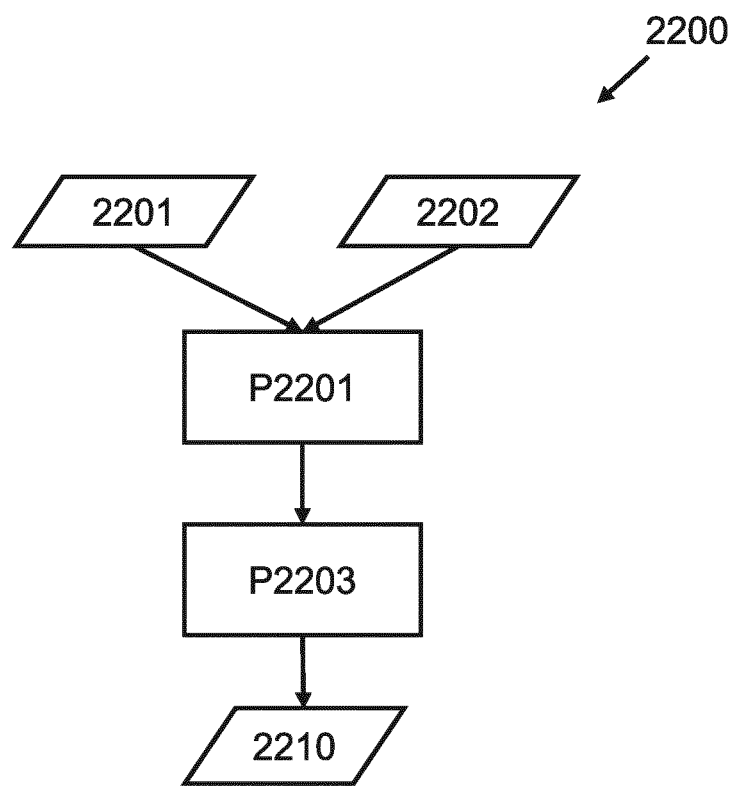
FIG. 22 is a flowchart of a method for determining a defect attribute of a feature in an after development image (ADI), according to an embodiment.

FIG. 22 is a flowchart of a method 2200 for developing a model 2210 to determine failure rates of features in an after development image, according to an embodiment. In an earlier embodiment, a model was developed to predict a failure rate based on a physical characteristic (e.g., CD) of ADI features by fitting the distribution of contact holes with the following probability density function:

$$\mathrm{PDF}(CD; \vec{\theta}) = p_{fail} \cdot \mathrm{PDF}_{fail}(CD; \vec{\theta}) + (1 - p_{fail}) \cdot \mathrm{PDF}_{no\ fail}(CD; \vec{\theta})$$

In the above equation, $p_{fail}$ is the probability of failing after etch, the vector $\vec{\theta}$ is a set of parameters of the distributions, and $\mathrm{PDF}_{fail}$ and $\mathrm{PDF}_{no\ fail}$ are the probability density functions for the failing and non-failing ADI features. In an earlier embodiment, a Generalized Extreme Value (GEV) distribution for failing holes, and a normal distribution of $CD_{ADI}^2$ for the non-failing holes, was employed.

In another embodiment, discussed with respect to FIG. 21, the model is developed based on a pair of SEM images of a given ADI feature. For example, the ADI CD distribution from both the first and second SEM images are used to fit the above equation PDF(CD). In the above equation PDF(CD), the fitting of the data provides $\vec{\theta}$ parameters that are different for both distributions (related to $\mathrm{PDF}_{fail}$ and $\mathrm{PDF}_{no\ fail}$), but $p_{fail}$ should be the same. This reduces the parameter space for fitting, relative to the number of data points. Furthermore, the first and second SEM measurements may reveal a relationship between the parameters $\vec{\theta}$ for the first and second distribution. The relationship may be used to further reduce the parameter space of the fitting.

In another example, the above fitting procedure of the method 2200 may be modified to fit the combined distribution of $CD_1$ and $CD_2$ with the following probability density function:

$$\mathrm{PDF}(CD_1, CD_2) = p_{fail} \cdot \mathrm{PDF}_{fail}(CD_1, CD_2; \vec{\theta}) + (1 - p_{fail}) \cdot \mathrm{PDF}_{no\ fail}(CD_1, CD_2; \vec{\theta})$$

The $\mathrm{PDF}(CD_1, CD_2)$ represents a combined distribution, the vector $\vec{\theta}$ is a set of parameters of the respective distributions determined via fitting process, and $p_{fail}$ is a failure parameter determined via a fitting process. The combined distribution reduces the model parameter space for fitting relative to a number of data points. The method 2200 is further discussed in detail as follows.

Procedure P2201 includes obtaining, via a metrology tool, (i) a first measurement data 2201 associated with an after development image (ADI) of a substrate, the ADI comprising a plurality of features, and (ii) a second measurement data 2202 associated with the same ADI, the second measurement data 2202 obtained subsequent to the first measurement. For example, the metrology tool can be a SEM and the measurement data can be data associated with SEM images. In the present example, a first SEM image of the ADI feature is taken followed by a second SEM image of the same ADI feature. In an embodiment, the measurement data includes physical characteristics of ADI features in the SEM images. In an embodiment, the measurement data may be extracted as intensity values related to the ADI features in the SEM images.

Procedure P2203 includes generating, based on the first measurement data 2201 and the second measurement data 2202, the model 2210 to determine failure rates of the features of the ADI. In an embodiment, the generating of the model 2210 includes adjusting values of one or more model parameters such that a metric associated with the model 2210 is improved compared to the metric associated with initial values of the model parameters. In an embodiment, as discussed herein, the model 2210 can be further used to determine a process window of a patterning process based on the failure rates of features predicted by the models for a given first measurement of a given ADI, and a second measurement of the given ADI.

In an embodiment, the generating of the model 2210 involves fitting, using the first measurement data 2201 and the second measurement data 2202, a first probability density function (PDF) associated with a failure rate parameter (e.g., $p_{fail}$), and a second probability density function (PDF) associated with a complement of the failure rate parameter by maximizing a log-likelihood metric of the model. In an embodiment, the fitting of the first probability density function includes determining values of each model parameters of the first PDF and the second PDF by maximizing the log-likelihood metric of the model. For example, the model can be PDF($CD_1$, $CD_2$) as discussed above.

In an embodiment, the first PDF (e.g., $PDF_{fail}(CD_1, CD_2; \vec{\theta})$) is characterized by a combined distribution of a first physical characteristic and a second physical characteristic, and a first set of model parameters. The first physical characteristic being associated with the first measurement data 2201 and the second physical characteristic being associated with the second measurement data 2202 of the ADI. The second PDF (e.g., $PDF_{no\ fail}(CD_1, CD_2; \vec{\theta})$) is characterized by another combined distribution of the first physical characteristic and the second physical characteristic, and a second set of model parameters.

In an embodiment, the first PDF may be a bivariate distribution characterized by: a first location parameter and a second location parameter that describes a shift of the bivariate distribution; and a first scale parameter and a second location parameter that describes a spread of the bivariate distribution.

In an embodiment, the second PDF may be a generalized extreme value (GEV) distribution characterized by: a third location parameter and a fourth location parameter that describes a shift in the GEV distribution; a third scale parameter and a fourth scale parameter that describes a spread of the GEV distribution; and a shape parameter ($\xi$) that describes a shape of GEV distribution.

In an embodiment, the first measurement data 2201 is a first SEM image of the ADI, and the second measurement data 2202 is a second SEM image of the ADI. In an embodiment, the first measurement data 2201 comprises first physical characteristic values of features in a first SEM image of the ADI, and the second measurement data 2202 comprises second physical characteristic values of features in a second SEM image of the ADI.

In an embodiment, the generating of the model involves fitting the first PDF and the second PDF simultaneously on the first and second measurement data. For example, fitting the first PDF based on the first physical characteristic values of the plurality of features in the first SEM image of the ADI; and fitting the second PDF based on the second physical characteristic values of the plurality of features in the second SEM image of the ADI. In an embodiment, both the first PDF and the second PDF are fitted simultaneously by maximizing the log-likelihood metric related to the model.

In an embodiment, the fitting of the first PDF and the second PDF is an iterative process comprising: (a) determining the log-likelihood metric using given values of parameters of the first PDF and the second PDF; (b) determining whether the log-likelihood metric is maximized (c) responsive to not maximized, adjusting, based on a gradient, the values of the first set of model parameters of the first PDF and the values of the second set of model parameters, and the failure rate parameter (e.g., $p_{fail}$), and performing steps (a)-(c). In an embodiment, the gradient is a first derivative of the log-likelihood metric with respect to the first model parameters, the second model parameters, and the failure rate parameter.

In an embodiment, the adjusted model parameter values of the model causes the value of the failure rate parameter (e.g., $p_{fail}$) associated with first PDF and the second PDF to be the same.

In an embodiment, the method 2200 may further comprise determining a relationship between one or more model parameters of the first set of model parameters and the second set of model parameters based on the first measurement data 2201 and the second measurement data 2202. The method 2200 may further comprise modifying, based on a relationship, the first set of model parameters in terms of the second set of model parameters to reduce a number of the first set of model parameters or the second set of model parameters. The method 2200 may further comprise generating, using the first measurement data 2201 and the second measurement data 2202, the model 2210 based on the modified parameters.

In an embodiment, the physical characteristic is critical dimension (CD) of a feature. In an embodiment, the physical characteristic is at least one of: an average CD of a plurality of instances of a feature of interest in the ADI; a directional CD of the feature of interest in the ADI; a curvature variance of the feature of interest in the ADI; or CDs obtained at multiple metrology tool thresholds for each feature of interest.

In an embodiment, a directional CD is at least one of: a CD measured along the x-direction; a CD measured along the y-direction; or a CD measured along a desired angle.

As discussed herein, the failure rate is indicative of a defect condition characterized by the physical characteristic of the ADI feature or the corresponding AEI feature. In an embodiment, the defect condition comprises one or more of: an omission of the feature; a displacement range associated with the feature; or a tolerance range associated with a critical dimension of the feature.

As discussed herein, performing the SEM repro measurements may double the SEM metrology time. An alternative could be to save several subsets of the frames of a SEM image, for example saving 2×8 or 4×4 frames. The SEM image can be a stack of eight frames that are typically aligned with each other to determine an average SEM image of the ADI feature. In the present embodiment, the SEM frames can be saved separately and from the saved SEM frames, the first two to four frames can be analyzed, all eight frames can be analyzed together, or all eight frames can be analyzed separately. As such, eight very vague SEM images (instead of one average SEM image) provide more information compared to a SEM average image of multiple frames with the same measurement. In an embodiment, a charging effect caused due to excess or lack of electrons on the substrate being measured could affect the SEM image contrast and thereby cause there to be a difference between the SEM images. In an embodiment, it can be analysed which of the measurement schemes gives most added value compared to measuring more holes of the ADI of the substrate.

Hence, SEM measurement data can be organized and further used to develop the model 2210 according to method 2200. For example, the method 2200 can be modified to develop the model 2210 based on the various ways in which the SEM measurement data is obtained. For example, the model 2210 can be developed by grouping an 8 frames as 4×4 frames, where 4 frames are used to develop the model and another 4 frames are used to verify a prediction accuracy of the model. In another example, the model 2210 can be developed by grouping SEM measurement data having similar charging effect.

As discussed herein, the methods (e.g., the methods 1900 and 2200) have several advantages. For example, during ramp-up (e.g., high volume manufacturing HVM), the model 2210 can be employed in or associated with a lithographic apparatus to tune lithographic parameters, based on model-predicted failure rates, to reduce the number of feature failures (e.g., filled contact holes). Examples of improvements are tuning dose and focus of the scanner, resist screening, extra filtering steps for the resist, or other lithography related parameters. In another example, when the model 2210 predicts an ADI feature to be defective, the photoresist may be stripped or removed, the photoresist may be reapplied and the photoresist may be re-exposed in order to prevent the predicted defect to occur on the substrate after etching.

In an embodiment, an accurate defect classification based on ADI can help to find the root cause of AEI failures of e.g., contact holes. Furthermore, for example, a fraction of filled contact holes can be used to assess whether extra descumming or punch-through should be used before etch to reduce the impact of filled contact holes.

In an embodiment, the methods (e.g., 1700, 1900, 2200) described herein can be included as instructions in a computer-readable media (e.g., memory). For example, a non-transitory computer-readable media comprising instructions that, when executed by one or more processors, cause operations including obtaining the after development image (ADI) of a substrate, the ADI comprising a plurality of features; generating a first part of the model based on physical characteristic values related to a subset of features of the ADI; and generating a second part of the model based upon the first part of the model and the physical characteristic values related to all the features of the plurality of features of the ADI, wherein the subset of features of the ADI are differentiated from other features of the ADI.

In an embodiment, the non-transitory computer-readable media includes the model that is a combination of (i) a first probability distribution function configured to estimate distribution of the physical characteristic values for non-failing holes, and (ii) a second probability distribution function configured to determine failure rates based on physical characteristic values of all the plurality of features of the ADI. In an embodiment, the model is a weighted sum of the first probability distribution function, and the second probability distribution function. In an embodiment the first probability distribution function is a normal distribution characterized by a truncation value related to the physical characteristic, a first location parameter that describes a shift of the normal distribution and a first scale parameter that describes a spread of the normal distribution. In an embodiment, the second probability distribution function is a generalized extreme value (GEV) distribution characterized by a second location parameter ($\mu$) that describes a shift in the GEV distribution, a second scale parameter ($\sigma$) that describes a spread of the GEV distribution, and a shape parameter ($\xi$) that describes a shape of GEV distribution.

In an embodiment, the non-transitory computer-readable media includes instructions for the generating of the model, instructions that cause operations including fitting the first probability distribution function based on a square of the physical characteristic values of the subset of features by maximizing a first log-likelihood metric related to the first probability distribution function, wherein the subset of features have values of the physical characteristics above a physical characteristics threshold value; combining the fitted first probability distribution function and the second probability distribution function; and fitting, based on the combined distribution, the second probability distribution function and a relative weight associated therewith based on the physical characteristics values of all the features of the plurality of features so that a second log-likelihood metric related to the combined distribution is maximized.

In an embodiment, the non-transitory computer-readable media includes instructions for the fitting of the first probability distribution function in an iterative manner. An iteration includes (a) determining the first log-likelihood metric using given values of parameters of the first probability distribution function; (b) determining whether the first log-likelihood metric is maximized; and (c) responsive to not maximized, adjusting, based on a gradient, the values of the parameters of the first probability distribution function, and performing steps (a)-(c). The gradient is a first derivative of the first log-likelihood metric with respect to the parameters of the first probability distribution function.

In an embodiment, the non-transitory computer-readable media includes instructions for the fitting of the second probability distribution function including determining, based on maximizing of the second log-likelihood metric, values of parameters of the second probability distribution function and its weight without modifying the values of the parameters of the first probability distribution function. In an embodiment, the fitting of the second probability distribution function is an iterative process. An iteration process includes (a) obtaining the combined distribution of the fitted first probability distribution function and the second probability distribution function; (b) determining, based on the combined distribution and keeping the values of parameters of the fitted first distribution fixed, the second log-likelihood metric using given values of the parameters of the second probability distribution function and; (b) determining whether the second log-likelihood metric is maximized; and (c) responsive to not maximized, adjusting, based on a gradient, the values of the parameters of the second probability distribution function, and performing steps (b)-(c). The gradient is a first derivative of the second log-likelihood metric with respect to the parameters of the second probability distribution function.

In an embodiment, the non-transitory computer-readable media may further cause operations including imaging, via a patterning apparatus, a desired pattern comprising a plurality of features on a substrate; obtaining the after development image of the imaged pattern; executing the first and second probability distribution functions using the after development image to classify a fraction of features within ADI as defective after etching; and adjusting, based on the classified features, an etching condition such that the imaged pattern will not fail after etching.

In an embodiment, the non-transitory computer-readable media may further cause operations including tuning a lithographic process to reduce the failure rate of ADI features after etching, wherein the tuning comprises adjusting dose, focus, or both; determining whether extra filtering step for a resist layer should be performed to reduce the failure rate of the ADI features after etching; determining whether an extra descumming or punch through step should be should be performed to reduce the failure rate of the ADI features after etching; or inspecting, during high volume manufacturing, ADI features to determine whether a lithographic apparatus satisfies specified criteria of printing.

In an embodiment, a computer program may be coded and implemented on a process to implement various steps of the methods discussed herein. For example, a computer program may be configured to simulate a patterning process (e.g., lithography step, etching, resist development, etc.). Then, based on the simulation results, it is possible to calibrate individual parameters according to, e.g., the correlation between results of different process (e.g., after resist development and after etch development) discussed in the methods described herein. In an embodiment, simulation based tuning or calibration can also provide insights during manual tuning of an etch process. For example, insights related to effect of change in a process parameter on the correlation.

As discussed earlier, the present disclosure describes a method to quantify the short-range etch loading effect on CD of features after etching. In an example, a short-range etch loading affects after etch patterns. For example, the short-range loading effect characterizes the effect of neighboring features (in an ADI) on a size of a feature of interest after etching. For example, the size of a centrally located contact hole is influenced by the contact hole itself and by its neighbors. Additionally, the post-exposure processes can affect placement of features. In an embodiment, etch loading is characterized before etch optimization by analyzing test structures, and by modeling via an OPC process. To this end, features with variable pitch and CD are printed and etched, and the etch rate is fitted with an empirical formula that accounts for the open area within a certain circle around the point of interest.

After development of an imaged pattern on a substrate, one or more post-exposure processes are performed to transfer pattern on a substrate. For example, a pattern transfer process can be considered as a combination of an etch and (re-)deposition process. The etch process is performed by physical sputtering of material and chemical etching. The sputtered material and/or added gas constituents also ensure (re)deposition. For example, a sheath voltage influences an ion-angle of the sputtering process, and an u-wave power influences a density of the plasma/sputtering-speed. The sputter-rate of a material is dependent on an incidence angle, ion-velocity, and material composition that allows tweaking of patterns. For example, a Fluor gas pressure determines the redeposition during a post-exposure process. In one method, the process involves first shrink features ("CD"'s) and grow them back again (with less loading) in many cycles. This allows to reduce an incoming CD variation. However, the competing processes should be adjusted in all cycles to transfer a desired pattern on the substrate. According to the present disclosure, the methods herein are discussed with respect to an etching process. However, the present disclosure is not limited to etching process, and effect associated with other post-exposure processes can be determined herein.

Some existing approach establish relationship between ADI and AEI based on one or more parameters associated with a pattern. For example, for contact holes, relevant parameters include CD variations and contact edge roughness (CER) before and after etch. CER is, for high spatial frequencies, sensitive to SEM shot noise. The magnitude of the CER therefore depends on averaging of images (e.g., SEM images) of pattern employed by a contouring algorithm. The pattern transfer (e.g., ADI to AEI) tends to act as a convolution filter (e.g., smoothing) and it is not clear what is the relevant variation of CER to be included in a final pattern transfer. In another example, for lines, it is unclear which spatial frequencies in a power spectral density of a contour of the patter being transferred are relevant. Hence, it is further unclear how averaging of the images should be applied. In some cases, a relation between Line Edge Roughness (LER) (a measure of the variability) and averaging length depends on a type of resist. As such, variability metrics between different resists may not be comparable.

In an embodiment of the present disclosure, the short-range etch loading is quantified by a measure-etch-measure experiment, where the same contact holes are imaged with the SEM before and after etch. The correlation between the size of the contact hole after etch and the size of its neighbors before etch is used as a metric to quantify strength of the etch loading. In an embodiment, the correlation between neighbors over different distances is used as a metric for the range over which the local etch loading is relevant.

In an embodiment, ADI and AEI are SEM images of smallest features that contain a relatively large amount of noise, for example, due to the shot noise in the SEM image. Moreover, the SEM image is a two-dimensional (2D) excitation map of a three-dimensional (3D) structure. It is not immediately clear how the 2D information in the map should be mapped back to relevant 3D information. Additionally, not all fluctuations of the ADI of the feature are relevant to predict an AEI feature. Therefore, it is not obvious to what extend the short length-scale details of ADI and AEI features are relevant to quantify a lithography process, and which contouring methods should be used.

Figure 23A:
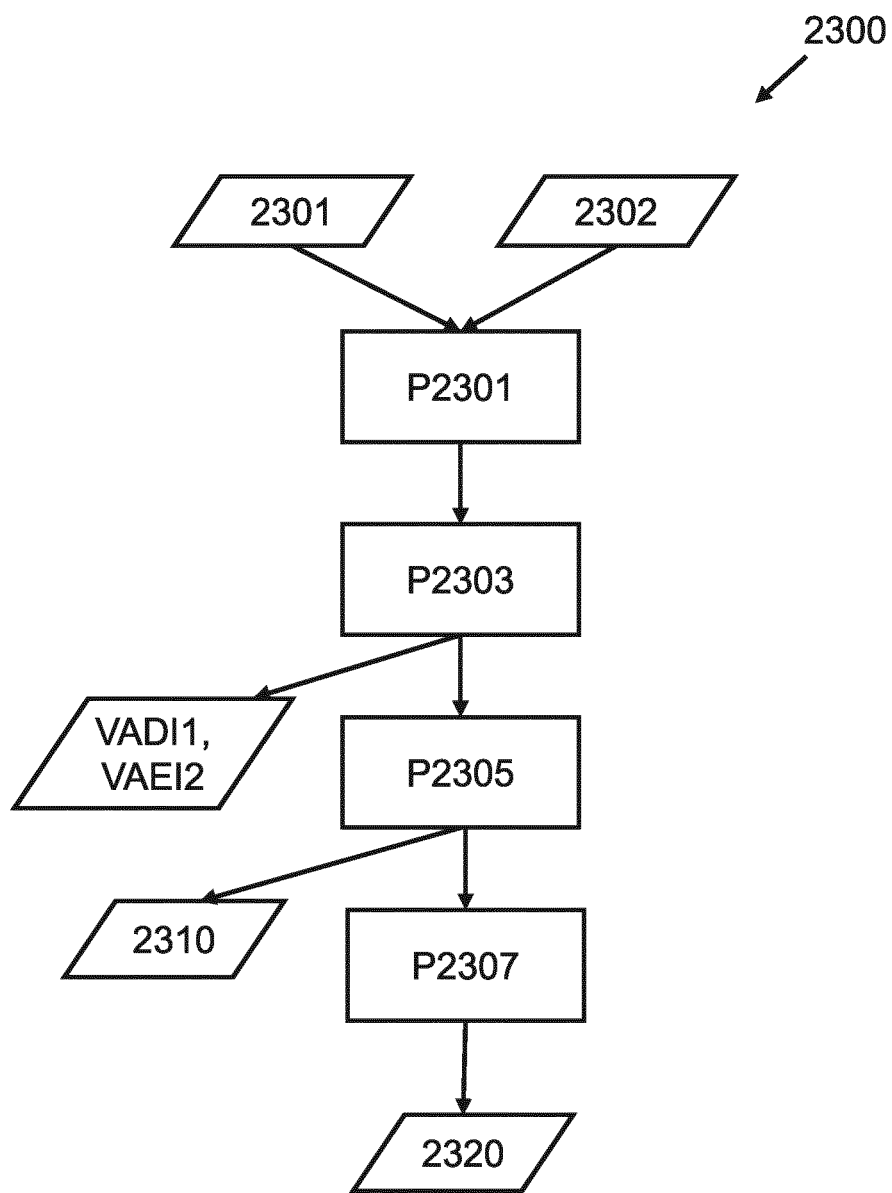
FIG. 23A is a flow chart of a method for training a model configured to determine an after etch image (AEI) based on an after development image (ADI), according to an embodiment.

In an embodiment, a method described herein (discussed later) address effects associated with the short-range loading, as well as placement of the neighboring contact holes. In an embodiment, placement of the neighboring contact holes can be described with respect to a reference grid, or a grid associated with a design layout (e.g., provided in GDS format). In an embodiment, the placement is described with respect to a feature of interest. For example, moving the neighboring contact holes relatively inwards (e.g., close to the feature of interest) affects the CD of the central contact hole after etching. So, not only the size of the surrounding contact holes, but also their placement that affect the after etch patterns. The present method e.g., FIG. 23A, provides a systematic way to get such relations out.

In an embodiment, the method to find the relevant contour features ADI and AEI and to quantify their transfer after etch employs canonical correlation analysis. The present method, can be used both to extract relevant contour points and to quantify the transfer after etch.

In an embodiment, ADI and AEI data used in the method can be obtained by making addressed SEM images of a structure on a substrate after lithographic step (e.g., ADI). Next, the imaged substrate is processed using a process of interest (e.g., a specified etch process). In an embodiment, after etching, SEM images at a same location are obtained based on the addressed SEM images. Further, the SEM images ADI and AEI are aligned.

In an embodiment, contours of the features of interest in ADI and AEI are determined using a contour extraction algorithm. In an example, the contour extraction algorithm employs contour points or pixel intensities to describe a contour. Further, a correlation such as a coefficient of determination ($R^2$) between contour points of ADI and AEI is determined. In an embodiment, the correlation explains that proportion of variance of a linear combination of the AEI contour points is explained by a linear combination of the ADI contour points of the feature itself and of its neighboring features. In an embodiment, the correlation determination procedure yields an eigenvalue equation to determine an optimal linear combinations of ADI and AEI contours, and the corresponding $R^2$. The method is further described in detail with respect to FIG. 23A.

FIG. 23A is a flow chart of a method 2300 for training a model configured to determine an after etch image (AEI) based on an after development image (ADI). The method includes following procedures P2301, P2303, P2305, and P2307 discussed in detail below.

Procedure P2301 includes obtaining (i) a measurement of an ADI feature 2301 imaged on a substrate, and (ii) a measurement of an after etch image (AEI) feature 2302. The measurement of the AEI feature 2302 corresponds to the measured ADI feature, on the substrate subjected to an etch process. For example, the same features is measured before an etch process and after an etch process. It can be understood that the present method is not limited to a single ADI image or a single AEI image, and multiple ADI and AEI images can be employed.

In the present discussion, the ADI feature 2301 and the AEI feature 2302 are used as examples to discuss the concepts. However, the present disclosure is not limited to an ADI feature or AEI feature. In an embodiment, an entire ADI image and AEI image may be obtained without measuring a particular ADI feature and AEI feature. Furthermore, in an embodiment, the AEI image is not limited to an after etch image, any other image obtained after post-exposure step of the patterning process can be used herein and is within the scope of the present disclosure.

In an embodiment, the measured ADI feature 2301 and the measured AEI feature 2302 is obtained via a metrology tool or a simulation process configured to generate an ADI and an AEI images for an input target feature. In an embodiment, the metrology tool is a scanning electron microscope (SEM) (e.g., FIG. 28) configured to capture an ADI and AEI of the substrate. The ADI comprises the ADI feature and the AEI comprises the AEI feature. In an embodiment, the ADI comprises images obtained from a first and a second SEM measurement of the ADI feature before etching. In an embodiment, the first SEM measurement of the ADI feature is obtained by exposing, via the SEM tool, the imaged substrate. The second SEM measurement of the ADI feature is obtained by re-exposing, via the SEM tool, the same ADI feature of the imaged substrate. Similarly, the AEI comprises images obtained from a first and a second SEM measurements of the AEI feature, by exposing and re-exposing an etched substrate. The etched substrate is obtained after etching the imaged substrate.

Procedure P2303 includes assigning a first set of variables VADI1 to characterize the measured ADI feature 2301 and a second set of variables VAEI1 to characterize the measured AEI feature 2302. In an embodiment, the first set of variables VADI1 correspond to a set of location on an ADI contour of the measured ADI feature 2301, and the second set of variables VAEI1 correspond to a set of location on an AEI contour of the measured AEI feature 2302.

In an embodiment, pixel intensities (e.g., grey scale values) of the ADI image and the pixel intensities (e.g., grey scale values) of the AEI image may be used as a first set of variables VADI1 and the second set of variables VAEI1, respectively.

Procedure P2305 includes determining a correlation 2310 between a combination of the first set of variables VADI1 of the measured ADI feature 2301 and a combination of the second set of variables VAEI1 of the measured AEI feature 2302. In an embodiment, the combination of the first set of variables VADI1 is a linear combination, a non-linear combination, or a machine learning model. In an embodiment, the combination of the first set of variables VADI1 is a weighted sum of the first set of variables VADI1.

In an embodiment, the correlation 2310 may be determine based on a canonical correlation analysis or other correlation determination methods. These combination of variables are considered as relevant variables to characterize a pattern transfer behavior from ADI to AEI, for example.

The weights can be positive values or negative values. In an embodiment, the positive or negative is indicative of a direction of a variable e.g., towards left or right in which a variable value should be applied. In an embodiment, the positive or negative may indicate shrinkage or growing of the ADI feature. In an embodiment, the combination or the one or more sub-combination of the second set of variables VAEI1 is a linear combination, a non-linear combination, or a machine learning model. In an embodiment, the first set of variables VADI1 correspond to a set of location on an ADI contour of the measured ADI feature 2301, and the second set of variables VAEI1 correspond to a set of location on an AEI contour of the measured AEI feature 2302.

In an embodiment, the ADI feature comprises a feature of interest, and one or more neighboring features. In an embodiment, the first set of variables VADI1 comprises a first sub-set of variables associated with the feature of interest and a second sub-set of variables associated with the one or more neighboring features. In an embodiment, the combination is a weighted sum of the first sub-set of variables associated with the feature of interest and the second sub-set of variables associated with the one or more neighboring features. In an embodiment, the weights assigned to variables of a neighboring feature is relatively higher than to variables of another neighboring feature away from the feature of interest.

Figure 24A:
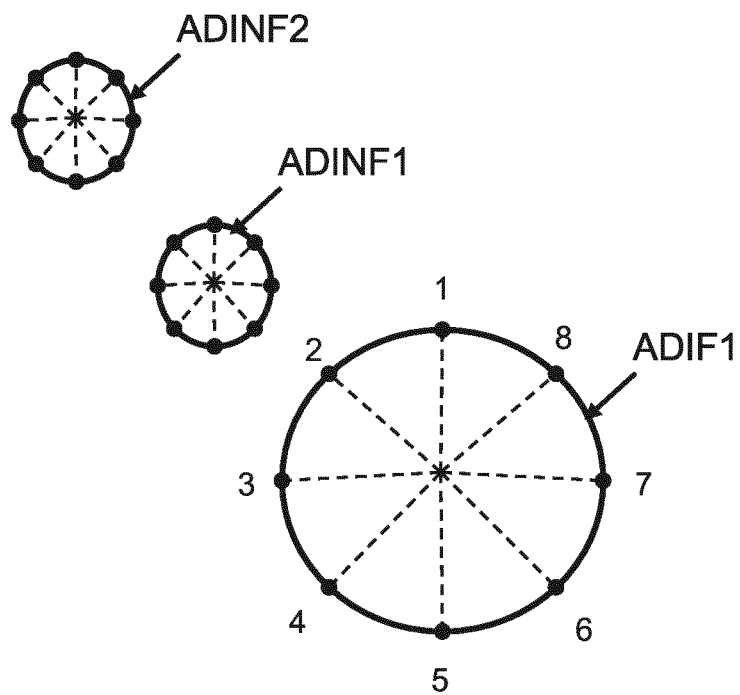
FIG. 24A and FIG. 24B illustrate exemplary ADI features and an AEI feature with example set of variables of ADI and AEI, respectively, according to an embodiment.
Figure 24B:
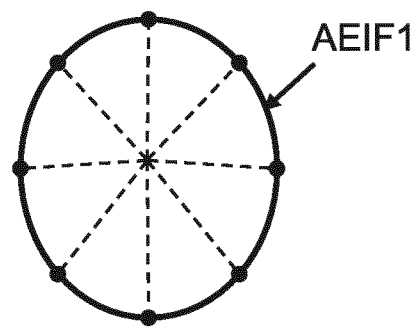

FIG. 24A and FIG. 24B illustrate exemplary ADI features and an AEI feature, respectively. In FIG. 24A, an ADI includes a feature of interest ADIF1 and neighboring features ADINF1 and ADINF2 around the feature ADIF1. The first neighboring feature ADINF1 is relatively closer to the feature of interest ADIF1 than the second neighboring feature ADINF2. In an embodiment, a set of variables may locations marked with numbers 1-8 on the contour of the feature ADIF1. Similarly, another set of variables may be locations (points) on contours of the neighboring features ADINF1 and ADINF2. In an embodiment, the first set of variables VADI1 can be a set of variables (e.g., contour points on a feature's contour) of ADIF1, ADINF1 and ADINF2. In an embodiment, a second set of variables VAEI1 can be locations (points) on the contour of the AEI feature AEIF1. In an embodiment, the AEI feature AEIF1 may be generated after etching the ADI feature ADIF1. In an embodiment, the neighboring features ADINF1 and ADINF2 may affect the shape and size of the AEI feature AEIF1. Accordingly, in an example, a linear combination of variables (e.g., contour points) associated with ADIF1 can be determined (as discussed in the method 2300 herein) that best correlates, $2^{nd}$ best correlates, $3^{rd}$ best correlates, (and so on) with a linear combination of variables of AEIF1. In another example, a linear combination of variables associated with ADIF1 and neighboring features ADINF1 and ANF2 can be determined (as discussed in the method 2300 herein) that best ($2^{nd}$ best, $3^{rd}$ best, and so on) correlates with a linear combination of variables of AEIF1.

In an embodiment, the determining of the correlation 2310 includes computing the correlation 2310 using given values of (i) a first set of parameters associated with the combination of the first set of variables VADI1, and (ii) a second set of parameters associated with the combination of the second set of variables VAEI1; determining whether the correlation 2310 is maximized (or in a specified range); and responsive to the correlation 2310 not being maximized (or in the specified range), adjusting the given values of the first set of parameters, and the second set of parameters until the correlation 2310 is maximized. In an embodiment, the adjusting of the given values of the first set of parameters and the second set of parameters is performed until the correlation 2310 is maximized (or within a specified range).

In an embodiment, the first set of variables VADI1 associated with an ADI (e.g., ADI feature ADIF1, ADINF1, or ADINF2 of FIG. 24A, or pixel intensities of an ADI image) can be represented as vector $\vec{x}$, and $\vec{\alpha} \cdot \vec{x}$ represents one or more combination of the first set of variables VADI1. In an example, $\vec{\alpha}$ can be represented as matrix and $\vec{\alpha} \cdot \vec{x}$ comprises more than one number. In the present example, $\vec{\alpha} \cdot \vec{x}$ is a scalar, and $\vec{\alpha}$ and $\vec{\beta}$ is optimizes to maximize the correlation. The optimization process may provide more than one solution for which the correlation is a (local) maximum, and that corresponds then to the multiple combinations found. In an embodiment, $\vec{\alpha}$ represents weights associated with respective variable of the first set of variables VADI1. In an embodiment, the second set of variables VAEI1 associated with an AEI (e.g., AEIF1 of FIG. 24B, or pixel intensities of an AEI image) may be represented as a vector $\vec{y}$ and $\vec{\beta} \cdot \vec{y}$ represents one or more combination of the second set of variables VAEI1. In an embodiment, $\vec{\alpha}$ represents weights associated with respective variable of the first set of variables VADI1.

In an embodiment, the determination of correlation 2310 involves optimization (in an embodiment, maximization) of mutual information of $\vec{x} \cdot \vec{\alpha}$ and $\vec{y} \cdot \vec{\beta}$ with respect to $\vec{\alpha}$ and $\vec{\beta}$. In an embodiment, optimization of the mutual information can be determine based on analytical approach or numerical approach. In an embodiment, eigenvalue equations may be used to maximize the correlation 2310 between the combination of variables of ADI and the combination of variables of AEI. In an embodiment, the mutual information can be determined in terms of a probability density function over the space of the combination of variables. In an embodiment, e.g., for a finite data set, the probability densities may not be computed, instead normalized histograms may be used. An example approach for estimating mutual information can be found in the reference A. Kraskov, H. Stogbauer and P. Grassberger, "Estimating mutual information". Phys. Rev. E 69, 2004, which is incorporated herein in its entirety by reference.

In an embodiment, the combination can be a non-linear combination of variables. In the non-linear case, the determination of the correlation 2310 comprises maximizing the correlation (e.g., $R^2$) between non-linear functions of $\vec{x}$ and $\vec{y}$. These functions can be explicit analytical expressions of $\vec{x}$ and $\vec{y}$, but also neural networks that generates a scalar out of a vector input. For example, an example method to determine correlation 2310 can be based on "Deep Canonical Correlation Analysis by Andrew 2013," which is incorporated herein in its entirety by reference. For example, optimization process entails maximization with respect to the coefficients in the neural network. In an example, the correlation 2310 can be computed using the following correlation $R^2$ equation:

$$R^2 = \frac{\operatorname{cov}(f(\vec{x};\vec{\alpha}), g(\vec{y};\vec{\beta}))^2}{\operatorname{var}(f(\vec{x};\vec{\alpha})) \operatorname{var}(g(\vec{y};\vec{\beta}))}$$

In the above equation, cov and var denote the covariance and variance of a variable, $f$ is a predefined scalar function of $\vec{x}$ with parameters $\vec{\alpha}$, and g is a scalar function of $\vec{y}$ with parameters $\vec{\beta}$. Examples for $f$ and g comprises linear function ($\vec{\alpha} \cdot \vec{x}$), quadratic function, higher order polynomial, machine learning networks with weights $\vec{\alpha}$ and $\vec{\beta}$.

In case of linear combinations, the correlation 2310 is computed using the following correlation $R^2$ equation:

$$R^2 = \frac{\left(\vec{\alpha^T} \cdot <\vec{x}^T \otimes \vec{y}> \cdot \vec{\beta}\right)^2}{\left(\vec{\alpha^T} \cdot <\vec{x}^T \otimes \vec{x}> \cdot \vec{\alpha}\right)\left(\vec{\beta^T} \cdot <\vec{y}^T \otimes \vec{y}> \cdot \vec{\beta}\right)}$$

In the above equation, $\vec{x}$ is a vector form of the first set of variables VADI1, $\vec{\alpha}$ correspond to the first set of parameters, $\vec{\alpha} \cdot \vec{x}$ comprises one or more combination of the first set of variables VADI1, $\vec{y}$ is a vector form of the second set of variables VAEI1, $\vec{\beta}$ correspond to the second set of parameters, $\vec{\beta} \cdot \vec{y}$ comprises one or more combination of the second set of variables VAEI1, a numerator of $R^2$ represents a covariance between $\vec{x}$ and $\vec{y}$, and a denominator represents a product of a variance of $\vec{x}$ and a variance of $\vec{y}$.

In an embodiment, the determination of the correlation 2310 comprises setting derivative of $R^2$ with respect to $\vec{\alpha}$ and $\vec{\beta}$ to 0, which yields the following expressions:

$$<\vec{y}^T \otimes \vec{y}>^{-1} \cdot <\vec{y}^T \otimes \vec{x}> \cdot <\vec{x} \otimes \vec{x}^T>^{-1} \cdot <\vec{x} \otimes \vec{y}^T> \vec{\beta} = R^2 \cdot \vec{\beta}(A)$$

$$\vec{\alpha} \alpha <\vec{x} \otimes \vec{x}^T>^{-1} \cdot <\vec{x} \otimes \vec{y}^T> \vec{\beta}(B)$$

The first equation (A) is an eigenvalue equation that determines the eigenvalue of $R^2$ and the eigenvector $\vec{\beta}$. In the second equation (B) $\vec{\alpha}$ is a proportionality operator. In an embodiment, the correlation $R^2$ is independent of the length of $\vec{\alpha}$ and $\vec{\beta}$. According to an embodiment, the above equations indicate that the vector $\vec{\beta}_1$ and corresponding vector $\vec{\alpha}_1$ with the largest eigenvalue $R^2_1$ are the linear combinations that transfer best. The vector $\vec{\beta}_2$ and corresponding vector $\vec{\alpha}_2$ with the largest eigenvalue $R^2_2$ are the linear combinations that transfer second best, and so on. In an embodiment, though $\vec{\alpha}$ and $\vec{\beta}$ are vectors, and $\vec{\alpha} \cdot \vec{x}$ is a scalar, and multiple solutions to the equations A and B are determined during optimization (e.g., to maximize correlation) of the above equation, and hence get different deformation modes.

In an embodiment, the number of non-zero eigenvalues is at most the smallest of the length of the vectors $\vec{x}$ and $\vec{y}$. Among these non-zero eigenvalues, only a limited number of eigenvalues correspond to $R^2$ with values significantly larger than 0. Hence, only a limited number of contour properties are considered transfer after etch. The remaining combinations may be not be considered. In an embodiment, by inspecting the vectors $\vec{\alpha}$ and $\vec{\beta}$, one can find the physical meaning of the transferred variables and reduce the parameter space accordingly.

In an embodiment, the eigenvalue analysis may be used to determine transfer characteristics after etch for a selected focus and dose condition. In an example, the first set of variables VADI1 associated with an ADI can be distances of 16 contour points to a center of mass of the contact hole, for a contact hole of interest and its six neighbors. Hence, a first set of variables VADI1 include 16·(1+6)=112 variables. A second set of variables VAEI1 associated with AEI can be the distances of the 16 contour points to a center for the contact hole in AEI of interest. So, the second set of variables VAEI1 include 16 variables. In an embodiment, example properties the pattern transfer according to the linear combination of these variables is further illustrates in FIGS. 25A-25F. In an embodiment, non-zero eigenvalues and corresponding eigenvectors (e.g., obtained from the correlation related equations A and B above) are also analyzed and explained with reference to FIGS. 25A-25F.

Figure 25A:
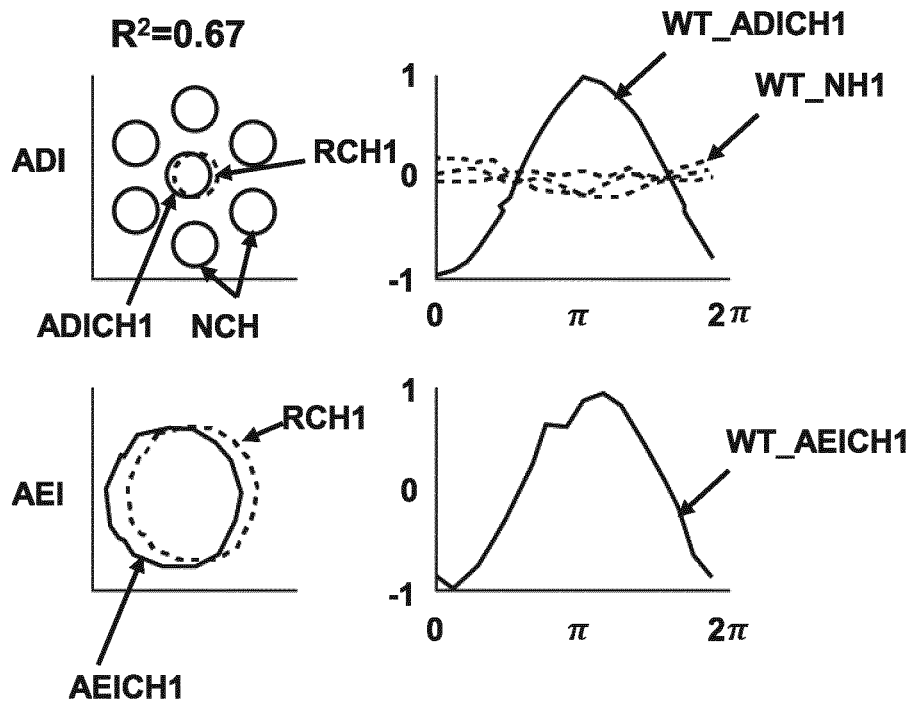
FIGS. 25A and 25B illustrate a linear combination of variables corresponding to translation of features in x- and y-direction, respectively, according to an embodiment.
Figure 25B:
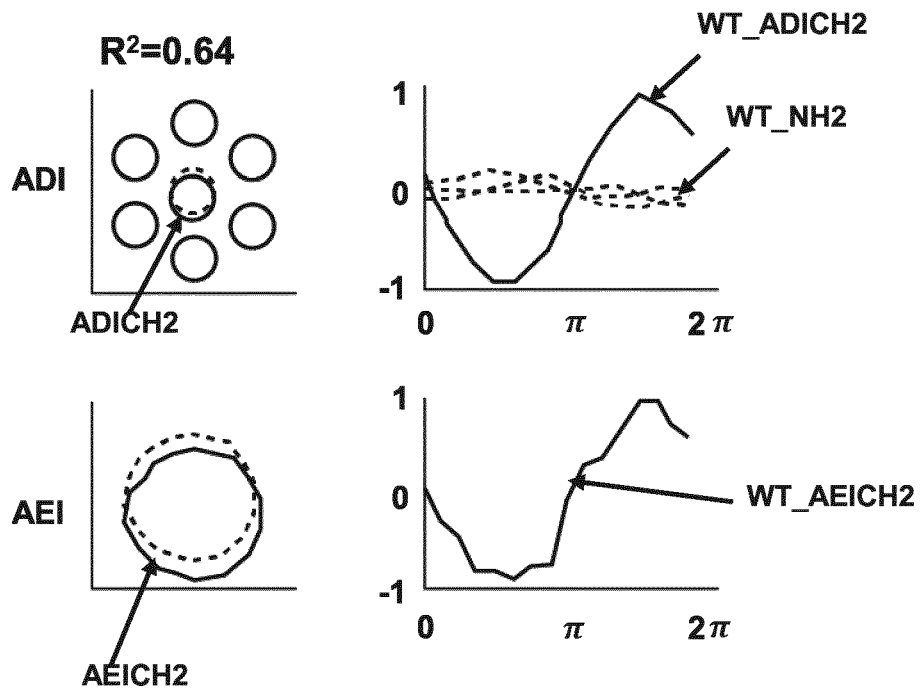
Figure 25C:
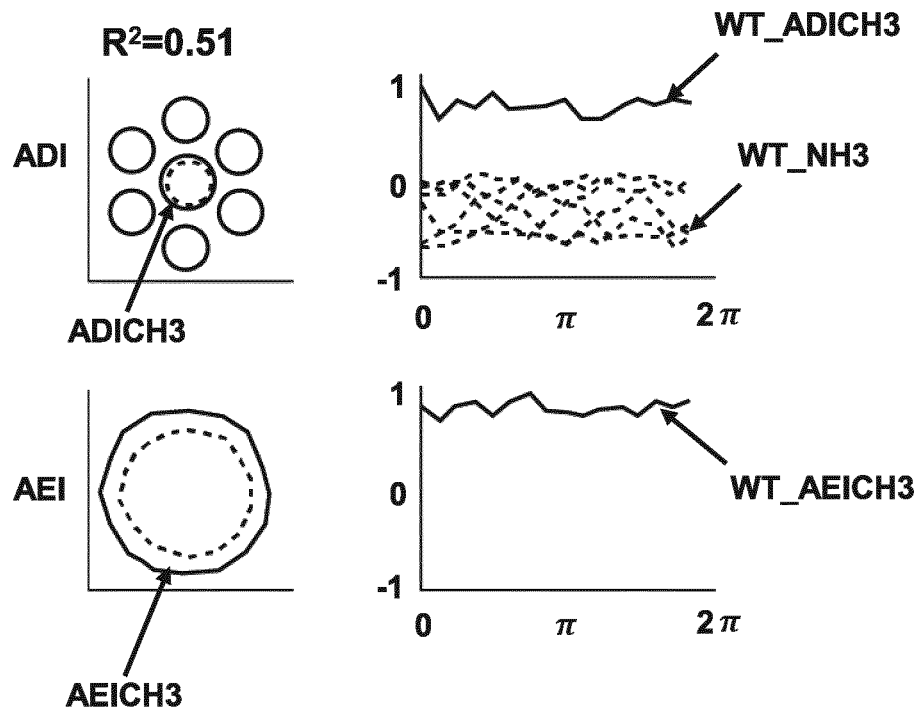
FIG. 25C illustrates a linear combination of variables corresponding to critical dimension (CD) of AEI features that is impacted by the CDs in ADI of central hole and its neighbors, according to an embodiment.
Figure 25D:
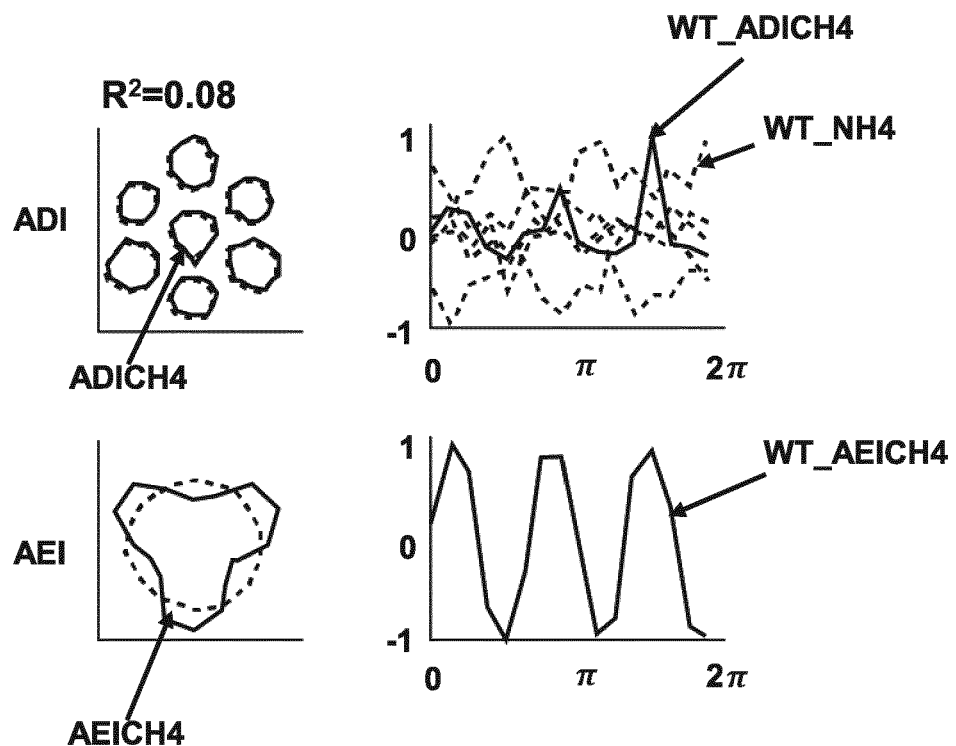
FIG. 25D illustrates a linear combination of variables corresponding to triangularity of the AEI feature impacted by the triangularity of features in the ADI, according to an embodiment.
Figure 25E:
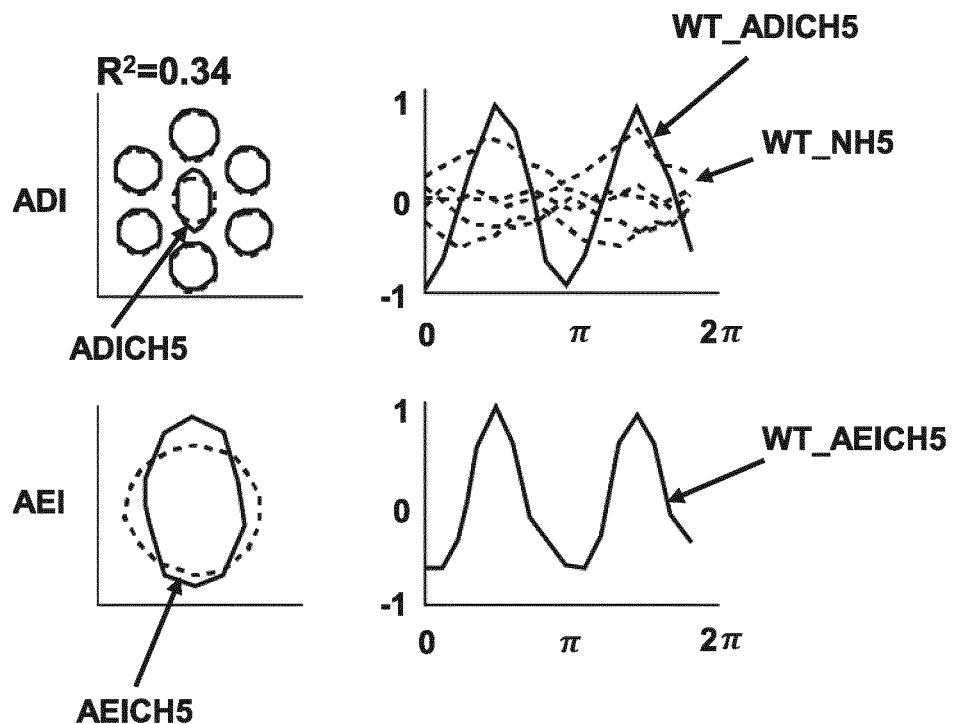
FIGS. 25E and 25F illustrate a linear combination of variables corresponding to an elongation of feature determined by the elongation of a centrally located ADI hole and the size and displacement of neighboring holes, according to an embodiment.
Figure 25F:
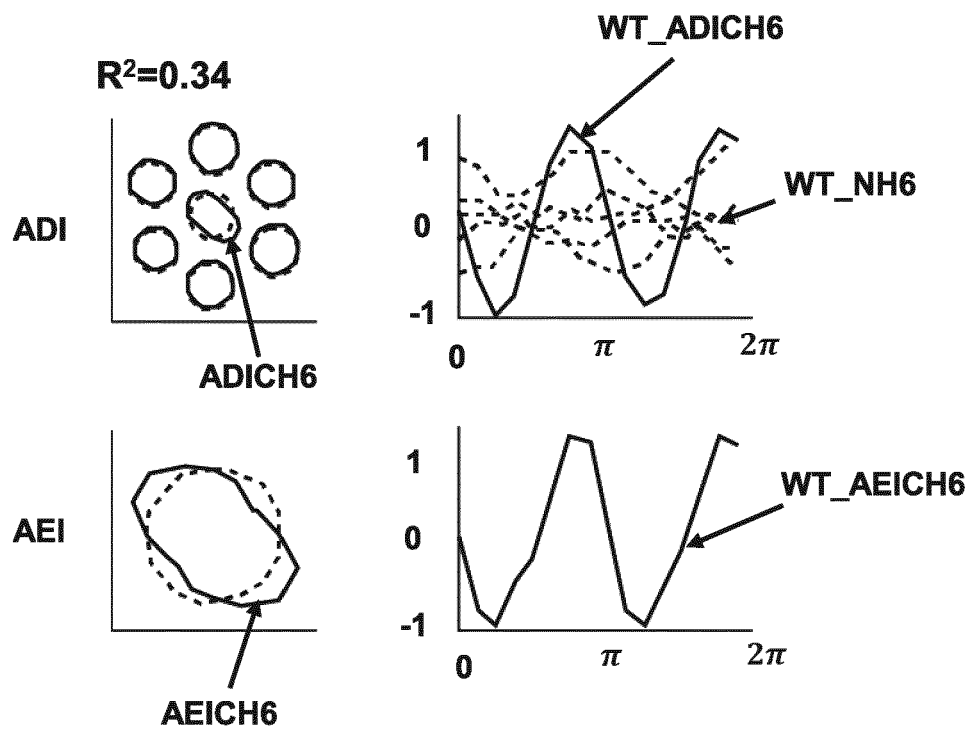

FIGS. 25A-25F illustrate optimal transfer of linear combinations of the first set of variables, as determined by the eigenvalue equations (e.g., equations A and B above). In each subfigure, at top right, solid lines (e.g., referenced as WT_ADICH1, WT_ADICH2, WT_ADICH3, WT_ADICH4, WT_ADICH5, and WT_ADICH6) correspond to the weights of a feature of interest (e.g., ADICH1). In each subfigure, at top right, dashed lines (e.g., collectively referenced as WT_NH1, WT_NH2, WT_NH3, WT_NH4, WT_NH5, and WT_NH6, respectively) correspond to the weights of neighboring features around a feature of interest (e.g., ADICH1). FIGS. 25A and 25B illustrate a linear combination of variables corresponding to translation of features e.g., translation of holes in x- and y-direction. FIG. 25C illustrates a linear combination of variables corresponding to the CD of the features e.g., AEI CD that is impacted by the CD (in ADI) of central hole and its neighbors. FIGS. 25E and 25F illustrate a linear combination of variables corresponding to an elongation of feature e.g., determined by the elongation of a centrally located ADI hole and the size and displacement of neighboring holes. FIG. 25D illustrates a linear combination of variables corresponding to triangularity of the features, e.g., AEI feature impacted by the CD and translation of neighboring features in the ADI.

Referring to FIG. 25A, weights WT_ADICH1 of each contour point on the ADI feature ADICH1 are plotted against the angle (right graph). Also, weights WT_NH1 of each contour point on neighboring ADI features (e.g., NCH) are plotted against the angle (right graph). The left graph illustrates an exemplary arrangement of ADI contact holes in polar coordinates representation. In the arrangement of the contact holes (the left graphs), a dashed line contour rch1 corresponds a desired feature or a reference feature with contour points having zero weight. In the present example, inward excursions (e.g., solid line contours ADICH1) with respect to the dashed line contour rch1 correspond to negative weights, and outward excursions (e.g., solid line contours ADICH1) with respect to the dashed line correspond to positive weights. Similarly, the bottom graphs, represents an AEI contact hole AEICH1 and weights WT_AEICH1 of the AEI contact hole AEICH1.

In the present example, referring to FIGS. 25A-25F, the linear combinations are obtained based on eigenvalue analysis. In the present example, the largest eigenvalue obtained using the first set of variables (e.g., 112 variables) and the second set of variables (e.g., 16 variables) is $R^2$=0.67 (see FIG. 25A). The corresponding weights of the AEI variables represent a shift of the contact hole to the left, see FIG. 25A (bottom left). In the ADI and AEI graphs (the left graphs), a radius on a left edge (e.g., from 0° to 180°) has positive weight, and a radius on a right edge (e.g., from 180° to) 360° has negative weight. The solid contact hole AEICH1, in FIG. 25A (bottom left), is displaced to the left with respect to the reference contact hole RCH1 (dotted circle), and the weights WT_AEICH1 are a (minus) cosine, as shown in FIG. 25A (bottom right). In FIG. 25A (top row), the corresponding weights WT_ADICH1 and WT_NCH1 of the ADI variables represent a shift of the contact hole ADICH1 (at center) to the left with respect to the reference hole RCH1 (dotted circle), and no impact of neighboring holes NCH. Observe that variables associated with the neighboring contact holes NCH have approximately zero weights WT_NCH1.

Similarly, FIGS. 25B-25F shows weights associated with linear combinations of variables (e.g., the first set of variables and the second set of variable), corresponding ADI and AEI feature transformations, and how the ADI transformation correspond to the AEI transformation.

According to an embodiment, FIGS. 25A and 25B illustrate a first eigenvalue (e.g., 0.67) and a second eigenvalue (e.g., 0.64) corresponding to combinations of the first set of variables and the second set of variables that describe translation of ADI and AEI features, respectively. The first and the second eigenvalues correspond to translations of the contact hole ADICH1 and ADICH2, respectively, in a first direction and a second direction. In the present example, the translations are in x-direction and y-direction. FIGS. 25A and 25B indicate that the translations in both directions can be measured equally well, as the correlation $R^2$ is approximately the same in both directions.

According to an embodiment, FIG. 25C illustrates a third eigenvector corresponding to a combination of the first set of variables and the second set of variables that describe CD of ADI and AEI features, respectively. Also, the weights WT_ADICH3, WT_NCH3, and WT_AEI3 associated with the linear combination of variables are plotted. The AEI related eigenvector (e.g., a linear combination of the second set of variables) shows that approximately equal weight is assigned to each variable of the combination of the second set of variables. For example, the variables may be radius (or diameters) of the contact hole measured at different orientations. Then, the radius correspond to CD of an AEI feature and a mean diameter length is equal to the mean CD of AEI feature. Similarly, the ADI eigenvector (e.g., a linear combination of the first set of variables) correspond to the CD of the ADI contact hole minus a mean CD of the neighboring holes with some weighing factor.

Figure 26A:
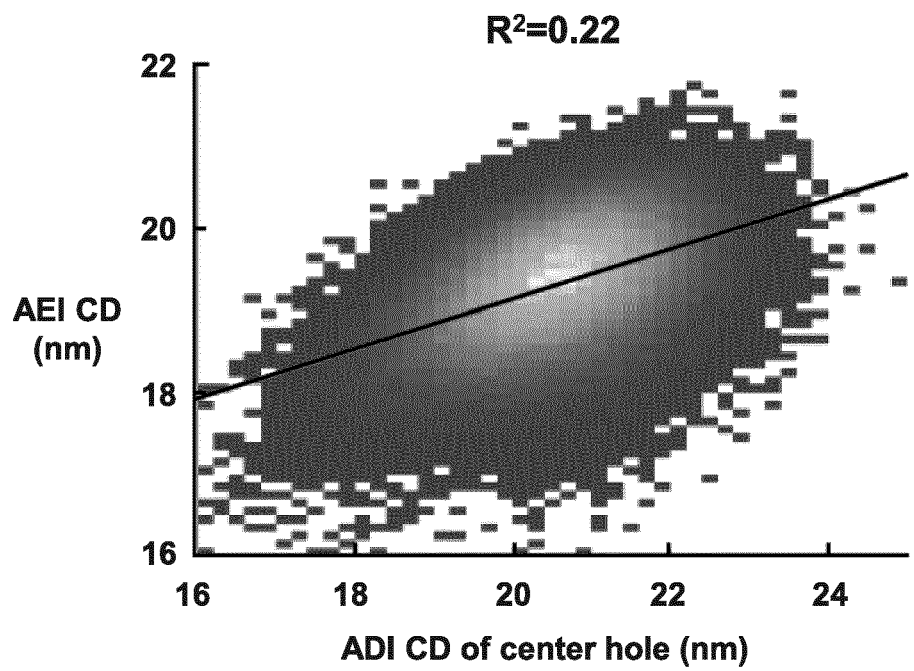
FIG. 26A illustrate a relationship between AEI CDs and ADI CDs of a feature of interest, according to an embodiment.
Figure 26B:
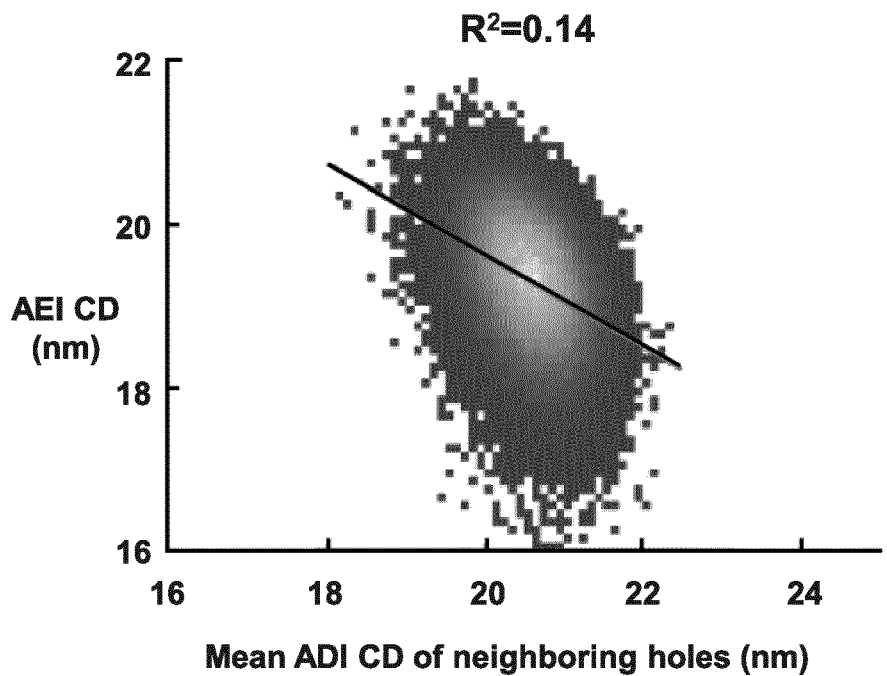
FIG. 26B illustrate a relationship between AEI CDs and CDs of neighboring features of the feature of interest in ADI, according to an embodiment.

In an embodiment, further inspection of the eigenvector (of FIG. 25C) also reveals that a placement of the neighboring contact holes around the contact hole ADICH3 impacts the CD of the AEI feature AEICH3. To understand the impact, CDs of AEI features of interest (e.g., a centrally located contact hole in AEI) are plotted against CDs of ADI features of interest (e.g., a centrally located contact hole in ADI), see FIG. 26A. FIG. 26A shows that there is a positive correlation between both CD parameters of ADI and AEI, but there is quite some spread in data, as the correlation $R^2$ is 0.22. The second plot, in FIG. 26B, the CDs of AEI feature of interest are plotted against the mean CDs of neighbors of ADI features of interest. The plot reveals a negative correlation with correlation $R^2$ is being 0.14. This is the previously mentioned local etch loading. In other words, if all neighbors are relatively large, lot of by-products will be produced by an etch process, and there is less etchant available for the feature of interest (e.g., the centrally located contact hole in ADI). This local etch loading effect lowers the etch rate and makes the AEI contact hole smaller than desired. It should be emphasized that the correlations according to the present embodiment e.g., the present eigenvalue equation corrects for the correlations in the plotted data. For example, the corrected correlation between the hole size and the size of its neighbors is much smaller e.g., $R^2=0.006$ and positive.

According to an embodiment, FIGS. 25E and 25F illustrate fourth and fifth eigenvectors corresponding to combinations of the first set of variables and the second set of variables that describe elongation (in two directions) of ADI and AEI features, respectively. Also, the weights WT_ADICH5, WT_NCH5, and WT_AEI5 associated with the linear combination of variables are plotted in FIG. 25E. The weights WT_ADICH6, WT_NCH6, and WT_AEI6 associated with the other linear combination of variables are plotted in FIG. 25F. The elongation of contact holes AEICH5 and AEICH6 are impacted by elongation of the contact holes ADICH5 and ADICH6, respectively. Additionally, the elongation is impacted by the CD and displacement of the neighboring holes of the ADICH5 and ADICH6. In the present example, as the two corresponding eigenvalues of $R^2$ are almost equal, elongation in any direction is equally well explained. However, as $R^2=0.34$, about two-thirds of the AEI elongation may not explained by the ADI measurements. Thus, the value of the correlation $R^2$ indicates that either other factors impact the elongation, or that the ADI or AEI elongation measurements are noise-prone.

According to an embodiment, FIG. 25D illustrates a sixth eigenvector corresponding to a combination of the first set of variables and the second set of variables that describe triangularity of ADI and AEI features, respectively. Also, the weights WT_ADICH4, WT_NCH4, and WT_AEI4 associated with the linear combination of variables are plotted in FIG. 25D. In the present example, the weights associated with ADI features are the size and displacement of the neighboring holes around the feature ADICH4. As $R^2=0.08$, it indicates that most of the triangularity measured after etch may not explained by the ADI contours.

In an embodiment, other eigenvalues that are below a specified correlation threshold, e.g. $R^2 \leq 0.01$. The correlation values that are below the specified threshold may indicate that the ADI measurements may not explain the AEI measurements, and the corresponding contour properties (e.g., triangulation) of measured ADI may not be relevant for predicting AEI contours.

Procedure P2307 includes training, based on the correlation 2310, the model 2320 by including one or more sub-combinations of the first set of variables VADI1 that have correlation values within a specified correlation threshold, the model 2320 being used to determine an AEI feature for an input ADI feature.

As discussed herein, the one or more sub-combination of the first set of variables VADI1 is a linear combination, a non-linear combination, or a machine learning model. In an embodiment, the one or more sub-combination of the first set of variables VADI1 is a weighted sum of the first set of variables VADI1, wherein the weights being positive values or negative values. In an embodiment, the one or more sub-combination of the second set of variables VAEI1 is a linear combination, a non-linear combination, or a machine learning model. In an embodiment, a sub-combination may not be same as a mathematical 'subset,' and could be an average over all contour points.

In an embodiment, the one or more sub-combination characterize an amount of deformation of an ADI contour of the measured ADI feature 2301 caused by a process performed on the measured ADI feature 2301. In an embodiment, the amount of deformation is a difference between a given location of the ADI contour and a corresponding location of the AEI contour. In an embodiment, the amount of deformation is characterized by a linear combination of the first set of variables VADI1.

In an embodiment, the determining of the model 2320 includes (a) determining a sub-combination of the first set of variables VADI1 and whether the correlation 2310 of the sub-combination is above a specified correlation threshold; (b) responsive to the sub-combination being above, including the sub-combination in the model 2320; and (c) responsive to the sub-combination not being above, selecting another sub-combination of the first set of variables VADI1, and repeating step (a)-(c) for a specified number of iterations or until the sub-combination are exhausted. In an embodiment, the specified correlation threshold is more than 0.01. For example, FIG. 25A-25F represent selected sub-combinations having $R^2$ values more than or equal to 0.08.

In an embodiment, the one or more sub-combination characterizes one or more of: a translation, in a specified direction, of the measured ADI feature 2301; a critical dimension of the measured ADI feature 2301; an elongation, in a specified direction, of the measured ADI feature 2301; a triangularity of the measured ADI feature 2301; and a rotation of the measured ADI feature 2301. Examples of sub-combinations and corresponding transfer characteristics are discussed herein with respect to FIGS. 25A-25F.

The above method (e.g., the method 2300) has several applications related to lithographic process, post-exposure process, metrology apparatus, and other application involving image based determination of feature transformations due to one or more processing on the features.

In an embodiment, the method 2300 can be used to quantify a short-range etch loading effect and placement of features. For example, a combination based on first set of variables VADI1 associated with neighboring features of a feature of interest in an ADI can be determined. Using the present method 2300, impact of placement variation of the neighboring features (e.g., features around the feature of interest in the ADI) on CD and placement of the AEI feature can be incorporated. In an embodiment, the eigenvalue analysis is used to quantify the effect of next nearest neighbors and beyond on the AEI contour. For example, impact due to neighboring features within 180 nm from the feature of interest in the ADI may be used. In an embodiment, the combination variables characterizing the ADI CD, displacement of each feature, and an elongation of the feature may be used to quantify the short-range etch loading effect.

Figure 27A:
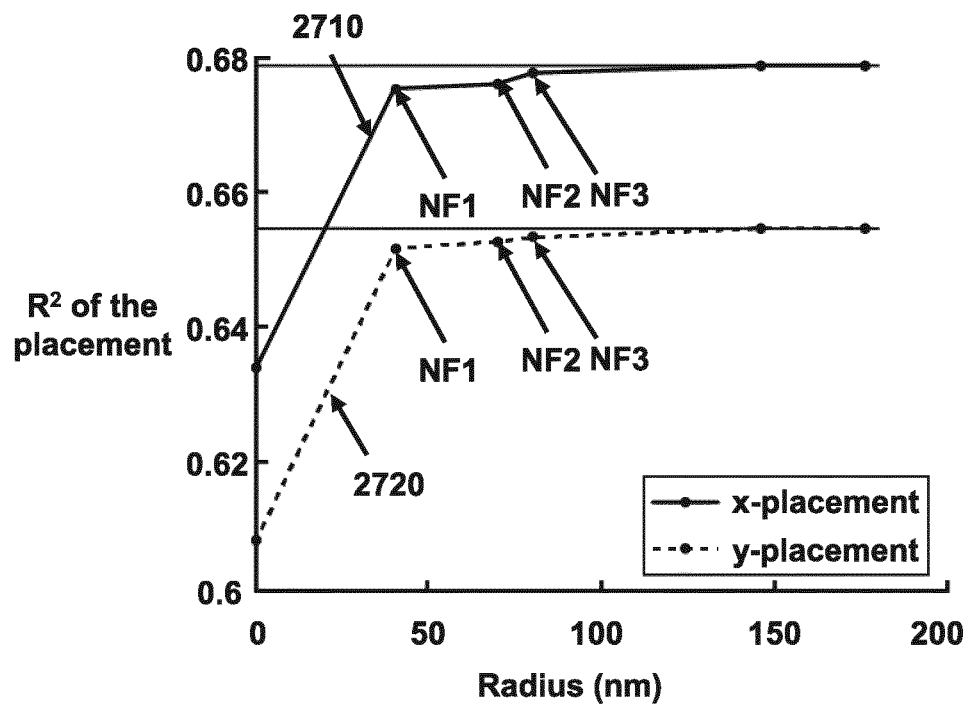
FIG. 27A illustrate fraction of a correlation of AEI placement explained by radius of influence of neighboring features in ADI, according to an embodiment.
Figure 27B:
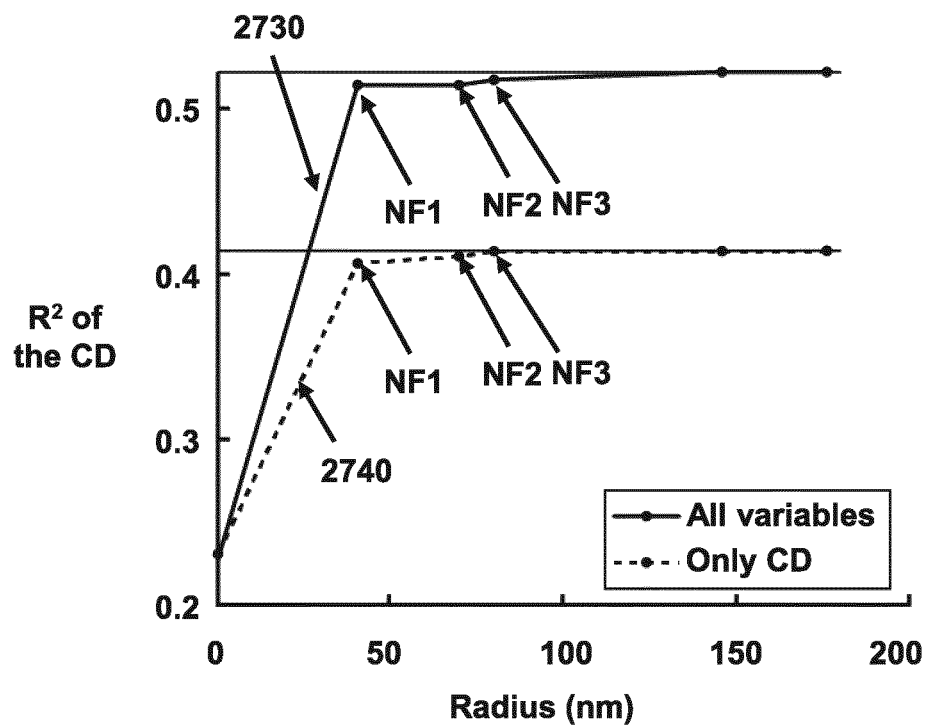
FIG. 27B illustrate fraction of a correlation of AEI CD explained by radius of influence of neighboring features in ADI, according to an embodiment.

FIGS. 27A and 27B illustrate a fraction of variance of $R^2$ of AEI placement explained by a feature of interest (e.g., a contact hole at a center of a pattern) and neighboring features (e.g., NH1, NH2, and NH3) within a radius of the circle of influence around the feature of interest in an ADI. For example, a line 2710 shows the correlation $R^2$ associated with x-placement of AEI as a distance from a feature of interest (at radius=0) increases in the ADI, and a dotted line 2720 shows the correlation $R^2$ associated y-placement as a distance from a feature of interest (at radius=0) increases in the ADI. The line 2710 indicates the feature of interest (or the first set of variables associated therewith) explain approximately 62% of the variation in AEI feature's x-placement and approximately 60% of variation in AEI feature's y-placement.

Also, the line 2710 indicates that a first neighboring feature NH1 (or linear combination of a sub-set of first set of variables) explains 4.2% (e.g., difference between points on y-axis and NH1) of the variance of $R^2$. Similarly, the next neighboring feature NH2 explains 0.3% of variance of $R^2$. Thus, further away features explain less and less variations than the feature of interest itself. Similarly, the line 2720 shows a fraction of variation in y-placement explained by the feature of interest (at radius=0) and further away features NH1, NH2, and NH3 in ADI.

FIG. 27B explains a fraction of variance of $R^2$ of the AEI CD explained by the feature of interest (e.g., a contact hole at a center of a pattern) and neighboring features (e.g., NH1, NH2, and NH3) within a radius of the circle of influence around a feature of interest in the ADI.

For example, a line 2730 shows the correlation $R^2$ explained by all variables (e.g., all of the first set of variables) as a distance from a feature of interest (at radius=0) increases in the ADI, and a dotted line 2740 shows the correlation $R^2$ associated CD related set of variables. The line 2740 shows amount of the correlation $R^2$ explained as a distance from a feature of interest (at radius=0) increases in the ADI. The lines 2730 indicates the all the variables of the feature of interest explain approximately 23.5% of the variation in AEI feature's CD.

Also, the line 2740 indicates a sub-set of variables associated with CD of the feature of interest explains approximately 23.5% of variation. The line 2730 further indicates that the first neighboring features NH1 (or linear combination of a sub-set of first set of variables) explains about 27% (e.g., difference between points on y-axis and NH1) of the variance of $R^2$. In the present example, the neighboring features NH1 comprises six features that are equidistance from a center feature (e.g., see FIGS. 25A-25F). The neighboring feature(s) NH2 that further away from neighboring features NH1 explains about 0.5% and the further neighboring feature NH3 explains another 0.7%. Similarly, the line 2740 shows a fraction of variation in variation in AEI feature's CD explained by the feature of interest (at radius=0) and further away features NH1, NH2, and NH3 in ADI. In the present example, the exact radius of influence affecting the AEI feature depends on the pattern density in ADI. Also, notice that 11% (difference between the lines 2730 and 2740) of the AEI CD variation is due to placement variations associated with the neighboring features. Such placement variation is a fifth of the total fraction of variance explained.

Thus, FIGS. 27A and 27B illustrate example quantification of the short range etch loading. Hence, employing the present method e.g., using all variables associated with ADI, the short range etch loading quantification can be improved (e.g., by 11%). In other words the present method can explain more variations than existing methods and causes of the such variation e.g., by neighboring features and transfer characteristics (e.g., placement, CD, translation, triangulation, etc.). The identified cause can be further used to reduce e.g., CD variations after development. In other words, the present method can help with determining causes of CD and placement variations as well as how it transfers after development, then one can predict what the variation after etch, deposition or other after exposure process will be, based on an ADI.

In an embodiment, another application of the method 2300 can be to monitor process quality. For example, the method 2300 further includes procedure for monitoring a process quality based on selected combination of the first set of variables of the ADI features and their sensitivity to focus and exposure conditions; and adjusting one or more process parameters to maintain the process quality in a specified range. In an embodiment, the monitoring comprises measuring relevant ADI contour properties (e.g., a sub-combination of variables of the first set of variables) related to a tip of a pattern; and adjusting, based on the measured sensitivity and the correlation, the one or more process parameters to improve the transfer of tip-to-tip features of the ADI feature into the AEI feature.

For example, the behavior of the etch for tip-to-tip structures substantially depends on a feature's shape in a resist, which in turn is focus-sensitive. Additionally, when a SEM is used to measure the feature shape in the resist, the resist shape changes a wave form generated by the SEM. By the present method 2300, it can be directly assessed which parameters of the SEM wave form correlate to an efficiency of the tip-to-tip transfer process. These tip-to-tip features can then be monitored closely in a high volume manufacturing (HVM) of a semiconductor chip. Furthermore, these features can be used in an (empirical) simulator of an etch process, and hence used for process optimizations during ramp-up.

In an embodiment, SEM measurement recipes can be refined for monitoring the HVM process. In an embodiment, SEM recipe comprises SEM tool settings for measuring tip-to-tip structures after development and after etch. In an embodiment, the SEM measurement recipe is kept the same for both ADI and AEI measurements to inspect the tip-to-tip structures. Further, a set of variables characterizing the tip-to-tip structures can be correlated to determine their transfer characteristic after etch. For example, whether the transfer is good or not (e.g., within a threshold limit), and how much variation they have. The tip-to-tip structure may behave differently from e.g., structures like holes or lines, because the tip-to-tip structure is focus sensitive and they have a lot of 3D information (e.g., CD variation throughout the height). So setting the SEM recipes to measure tip-to-tip structures is not a trivial task.

According to an embodiment, the method 2300 herein can be applied as follows. The tip-to-tip structure can be measured after development and then a contour can be extracted. In an embodiment, the ADI measurements can be performed at different SEM setting and contour information can be extracted at each SEM threshold. Next, AEI measurements can be performed to analyze the corresponding AEI contour with respect to ADI contours. For example, correlate the variations in the ADI and AEI contours to determine which SEM settings best explains AEI variations based on the ADI contour information. As such, a SEM setting can be quantified in terms of how good a SEM setting is to measure a tip-to-tip structure and will in turn speeds up inspection process using SEM tool.

In an embodiment, the procedure P2305 of the determining of the correlation is based on a sparsity constraint. A sparsity constraint refers to excluding one or more variables in the first set of variables or the second set of variables, or both.

In an embodiment, any contour can be used and characterized by a first set of variables. For a very detailed contour (e.g., characterized by a large number of contour points), most of the variation in contour points will be determined by e.g. SEM shot noise or tiny resist fluctuations. By optimizing the correlation (e.g., maximizing $R^2$), only relevant linear combinations of variables (e.g., weighted sums of all variables.) will be selected, and combinations related to e.g., SEM noise will not transfer.

Additionally, the selected combinations provides information that other shapes (e.g., relatively higher frequencies of contour deformation) do not transfer after etch, and are thus not relevant to quantify the etch behavior. In an embodiment, a sparsity constraint can be introduced in a systematic way by setting the sparsity constraint in an optimization. The sparsity constraint can be set of equations that automatically set weights of irrelevant data points to zero. The sparsity constraints can be enforced by adding a regularization term in the optimization (e.g., comprising a L1-norm of the weights α and β).

In an embodiment, the method 2300 can further comprise adjusting, based on the correlation, the metrology tool settings to cause the correlation to improve. An example, of adjusting metrology tool settings is discussed above with respect to tip-to-tip structure. However, the present disclosure is not limited to a particular structure. SEM setting can be determined for any other structures such as contact holes, lines, rectangle, or other features of interest to be printed on the substrate. In an embodiment, the metrology tool setting comprises at least one of: an e-beam intensity, an angle of incidence, voltage contrast, a SEM threshold, a pixel size, a scan speed, or a number of frames.

In an embodiment, the method 2300 can be further comprise adjusting, based on the correlation, one or more parameters associated with a contour extraction algorithm to cause the correlation to improve.

Figure 23B:
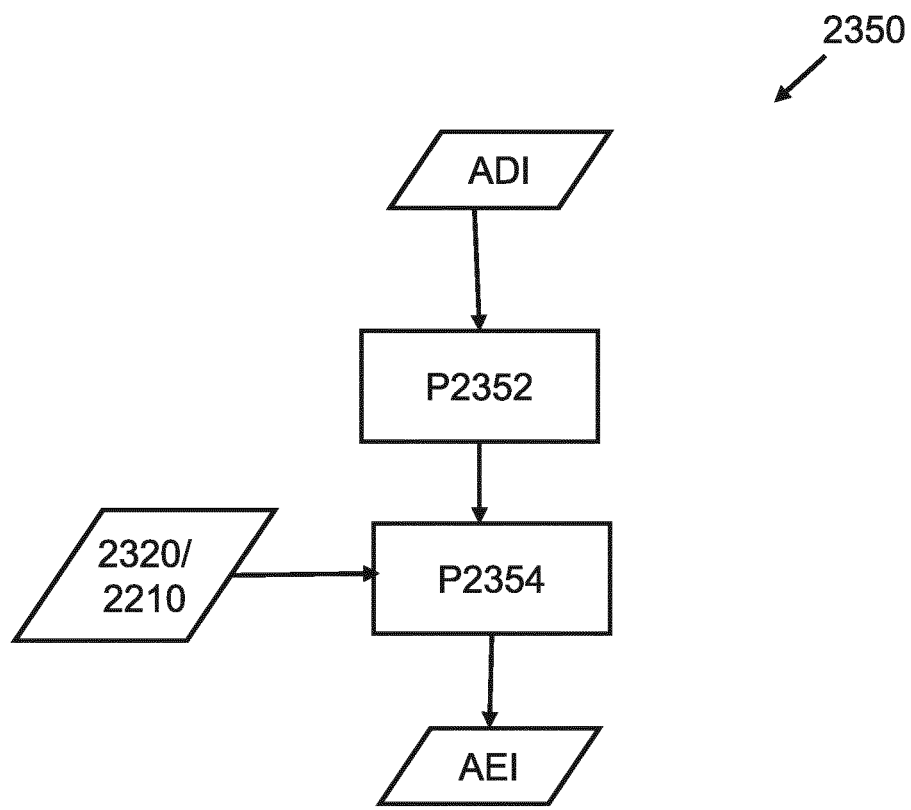
FIG. 23B is a flow chart of a method for determining an after etch image (AEI) based on an after development image (ADI) using the trained model of FIG. 22 or 23A, according to an embodiment.
Figure 23C:
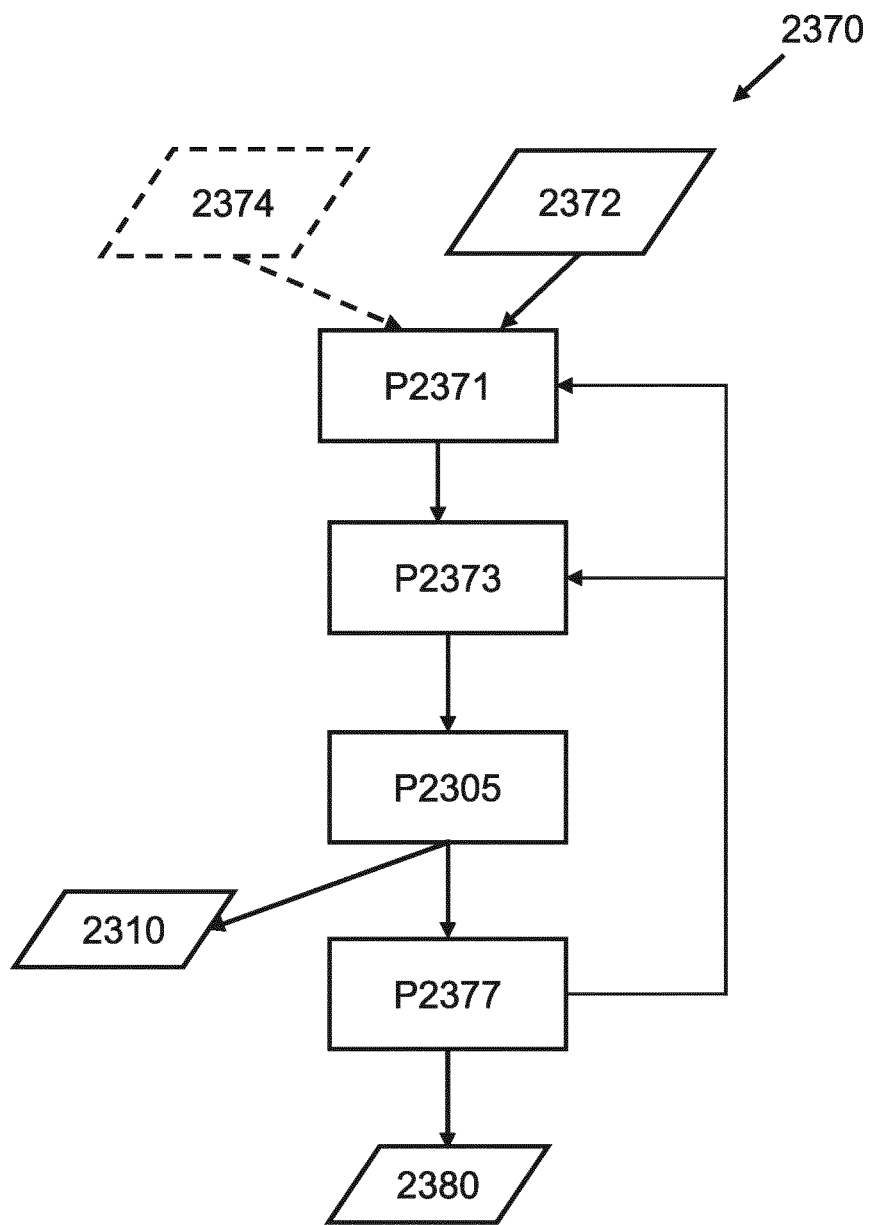
FIG. 23C is a flow chart of a method for optimizing metrology recipe (e.g., SEM settings or contour extraction settings) based on correlation between the ADI and AEI measurements, according to an embodiment.

In an embodiment, FIG. 23C illustrates a flow chart of a method 2370 for optimizing metrology recipes based on the correlation between the ADI and AEI. For example, the optimizing involves perturbing the metrology tool or algorithm related settings (e.g. number of frames, SEM voltage, thresholds) to maximize the correlation $R^2$. In one embodiment, the optimization is performed by perturbing only the metrology related parameters to best measure local variability. In another example, the optimization of metrology recipe involves perturbing not only the metrology related parameters but also patterning process related parameters to best measure process variation. For example, patterning process related parameters can be overlay, average CD of a pattern, focus, dose, etc. In an embodiment, procedure P2371 comprises acquiring ADI and AEI data 2372 without perturbing the process parameters. In an embodiment, procedure 2371 comprises acquiring ADI and AEI data 2374 by perturbing process variables (e.g., overlay, CD, dose, focus). Procedure P2373 comprises extracting (e.g., via a contour extraction algorithm) contours from the ADI and AEI images. Procedure P2305 can be performed to determine a correlation 2310 between ADI and AEI, as discussed earlier in method 2300. Procedure P2377 comprises determining metrology recipe or parameters of the contour extraction algorithm to cause the correlation 2310 to improve (e.g., maximized).

In an embodiment, a systematic optimization of SEM recipes and contour extraction algorithms can be performed as follows. For example, perform (e.g., via a computer system of FIG. 30) the procedures of method 2300 to determine a correlation between the measured ADI and AEI as discussed above. Further, perturb the parameters of the SEM recipe or the contour extraction algorithm to determine whether perturbed parameters improves the correlation $R^2$ between ADI and AEI. By perturbation, the settings that maximize the correlation $R^2$ can be obtained. As an example, SEM thresholds can be varied. For example, SEM thresholds such as 30%, 50% and 70% may be used for ADI and/or AEI measurements. In an example, using multiple thresholds while measuring AEI features may increase the correlation $R^2$ for an elongation and a triangularity transfer characteristic. Using multiple thresholds for measuring ADI may increases the correlation $R^2$ for a translation and the CD transfer characteristic.

Furthermore, parameters in a contouring algorithm related to extracting a contour from SEM images may be varied. Additionally, a number of variables (e.g., radius of a contract hole measured at different orientations) of the first set of variables may also be varied to determined that maximizes the correlation $R^2$. If a number of variables can be 8 or 32. It can be determined that reducing the number of variables significantly reduces the correlation $R^2$, so 8 spokes may be too little to describe the contour. On the other hand, increasing the number of variables to 32 may only slightly increases the correlation $R^2$. As such, it may be concluded that 16 variables may be sufficient to describe a contour for a given contact hole size.

Figure 23D:
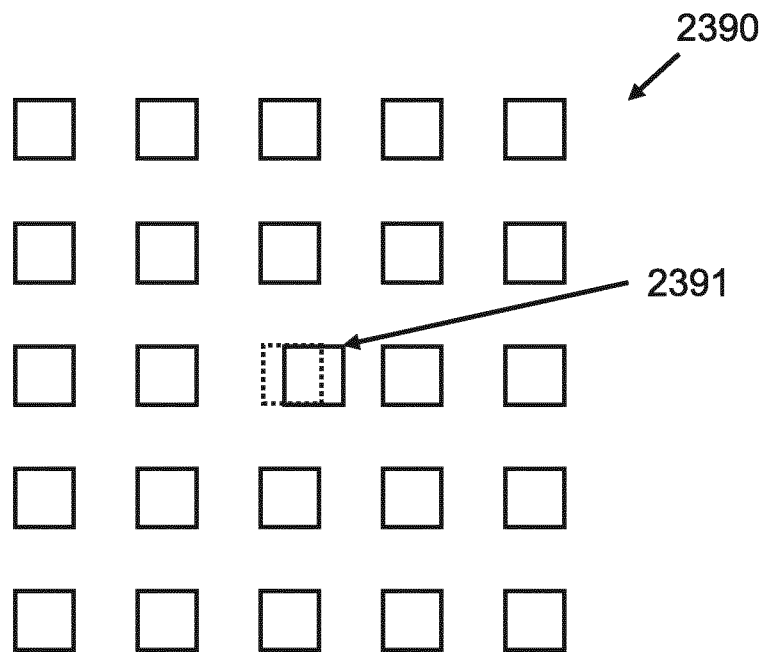
FIGS. 23D and 23E are example of implementing process variations via mask patterns used for obtaining ADI and AEI measurements, according to an embodiment.
Figure 23E:
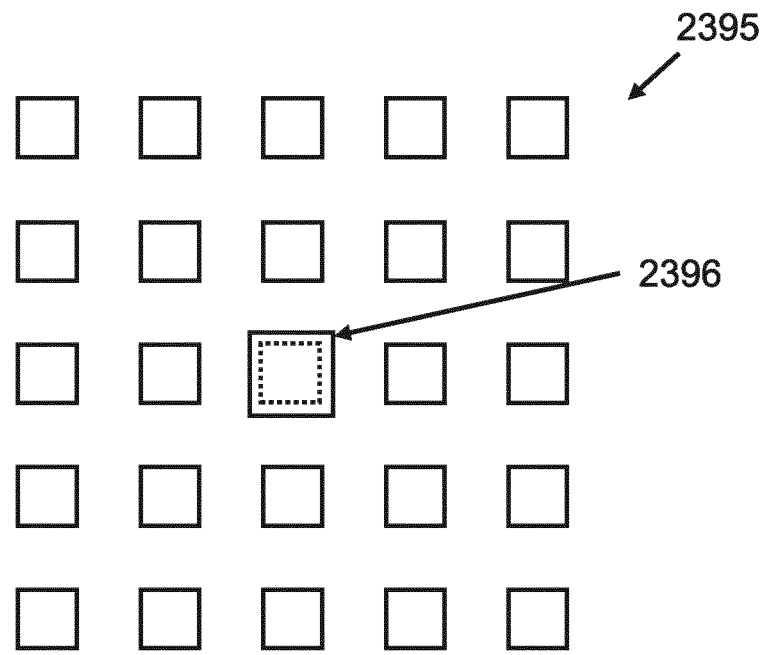

In an embodiment, a range of process variations may be performed. For example, a range of overlay values may be programmed by modifying a mask pattern. For example, as shown in FIGS. 23D and 23E, mask patterns 2390 and 295 comprises an array of contact holes. The overlay can be programmed by shifting a contact hole, or average CD can be perturbed by increasing size of a contact hole. For example, in the mask pattern 2390, a contact hole 2391 is shifted toward right from a desired position (dotted). In the mask pattern 2395, a contact hole 2396 is increased in size with respect to desired size (dotted). The mask pattern 2390 or 2395 can used to manufacture a physical mask and image a substrate. As such, for example, a shifted contact hole (corresponding to hole 2391) is imaged on the substrate. Using a metrology tool (e.g., SEM), capture an ADI image of such imaged substrate. Further, etch the imaged substrate and capture AEI of the etched substrate. Measure the overlay using image AEI at nearby locations for different overlay conditions (e.g., overlay within −10 nm to 10 nm range). Then, an average contour or unit cell can be determined for each overlay condition, both ADI and AEI. The ADI and AEI data based on the different overlay conditions is an example of data 2374. Once the data 2374 is acquired, further procedures of the method 2370 in FIG. 23C can be performed to determine optimal parameters for the metrology recipe (e.g., SEM setting or parameters of contour extraction algorithms) that maximized the correlation between ADI and AEI, for example. As discussed herein, the parameters of the metrology recipe can be, for example, an e-beam intensity, an angle of incidence, voltage contrast, a SEM threshold, a pixel size, a scan speed, a number of frames, or a combination thereof. In an embodiment, one or more parameters associated with a contour extraction algorithms may be modified.

In an embodiment, as discussed herein, repeated SEM measurements for capturing ADI and AEI are performed at the SEM location. In another embodiment, where test substrates are used for obtaining data 2374, ADI and AEI may not be performed at the same location. Accordingly, in the present disclosure, the metrology recipe optimization is not only applicable for measuring local variability, but also mean process related variations such overlay.

In an embodiment, the method 2300 further includes adjusting, via simulating a patterning process and the etch process using the correlation, parameters associated with a resist process or the etch process to cause a yield of the patterning process to be greater than a specified yield threshold.

In an embodiment, the method 2300 further includes adjusting, via simulating a patterning process using the correlation, parameters related to a lithographic process to cause a performance metric of a lithographic apparatus to be within a specified performance threshold. In an embodiment, the parameter of the patterning process comprises dose or focus conditions set via the lithographic apparatus.

In an embodiment, the method 2300 can be modified for training a model configured to determine an after etch image (AEI) based on an after development image (ADI). For example, determine correlation based on grey scale values of pixels of ADI and AEI. In an embodiment, the method includes obtaining (i) an ADI of an imaged substrate, and (ii) an after etch image (AEI) after etching the imaged substrate; determining a correlation between a combination of a first set of variables of the ADI and a combination of a second set of variables of AEI, the first set and the second set of variables being grey scale values of the ADI and AEI, respectively; and training, based on the correlation, the model by including one or more sub-combinations of the first set of variables that have correlation values within a specified correlation threshold, the model being used to determine an AEI for an input ADI. Accordingly, the procedures, P2305 and P2307 can be modified to consider the first set of variables as grey scale values of pixels in the entire ADI and the second set of variables as grey scale values of the pixels in the entire AEI.

In an embodiment, there is provided a metrology tool (e.g., FIG. 28) configured to adjust metrology tool setting based on a correlation between ADI and AEI. In an embodiment, the metrology tool includes a beam generator configured to measure an ADI feature after imaging a substrate and an AEI feature after etching the substrate; and a processor (e.g., process 100) configured to determine the setting based on the correlation between the measured ADI and the AEI via the e-beam.

In an embodiment, the processor may be configured to obtain a correlation between the measured ADI feature, and the measured AEI feature corresponding to the measured ADI feature printed on a substrate subjected to an etch process, the correlation being based on a combination of variables characterizing how the measured ADI feature transforms to the AEI feature; and adjust, based on the correlation, the settings of the metrology tool to cause the correlation to improve. The settings may be determined based on a derivative of the correlation with respect to each setting, the derivative indicative of an improvement in the correlation per setting of the metrology tool.

In an embodiment, the metrology tool is a scanning electron microscope (SEM). In an embodiment, the settings of the metrology tool comprises values of at least one of: an e-beam intensity, an angle of incidence, voltage contrast, a SEM threshold, a pixel size, a scan speed, or a number of frames. In an embodiment, the beam generator is an electron beam generator.

FIG. 23B is a flow chart of a method 2350 for determine an after etch image (AEI) based on an after development image (ADI) using the trained machine learning model 2210 (FIG. 22) or 2320 (FIG. 23A). The method includes following procedures P2352, and P2354 discussed in detail below.

Procedure P2352 includes obtaining an ADI of a substrate. For example, ADI can be obtained via a metrology tool such as SEM as discussed herein. Procedure P2354 includes determining, via a trained model 2210 or 2320, an AEI by inputting the ADI to the trained model and outputting the ADI. In an embodiment, e.g., as discussed in FIGS. 22 and 23A, the trained model is obtained by training based on a correlation between a combination of a first set of variables of a measured ADI and a combination of a second set of variables of a measured AEI. The correlation is within a specified correlation threshold.

In an embodiment, as discussed above, the correlation is determined by computing the correlation using given values of (i) a first set of parameters associated with the combination of the first set of variables, and (ii) a second set of parameters associated with the combination of the second set of variables; determining whether the correlation is maximized; and responsive to the correlation not being maximized, adjusting the given values of the first set of parameters, and the second set of parameters until the correlation is maximized.

In an embodiment, the trained model is obtained by: (a) determining sub-combinations of the first and second set of variables and whether the correlation of the sub-combination is above the specified correlation threshold; (b) responsive to the sub-combinations being above, including the sub-combination in a model; and (c) responsive to the sub-combinations not being above, selecting another sub-combination of the first set of variables, and repeating step (a)-(c) for a specified number of iterations or until the sub-combination are exhausted.

In an embodiment, as discussed above, the combination or the one or more sub-combination of the first set of variables is a linear combination, a non-linear combination, or a machine learning model. In an embodiment, the combination of the first set of variables is a weighted sum of the first set of variables, wherein the weights being positive values or negative values. In an embodiment, the combination of the second set of variables is a linear combination, a non-linear combination, or a machine learning model. In an embodiment, the ADI comprises an ADI feature, and the AEI comprises an AEI feature corresponding to the ADI feature, the AEI feature being determined via the trained model.

In an embodiment, the trained model determines one or more of: a translation of a feature of the ADI in a specified direction; a critical dimension of the feature of the ADI; an elongation of the feature of the ADI in a specified direction; a triangularity of the feature of the ADI; or a rotation of the feature of the ADI.

In an embodiment, the processor may further include instructions stored on the processor configured to adjust, based on the correlation, one or more parameters associated with a contour extraction algorithm to cause the correlation to improve. For example, as discussed above, 16 variables may be sufficient to obtained an improve correlation related to a given contact hole, as discussed earlier.

In an embodiment, the one or more combination of variables characterizes one or more of: a translation, in a specified direction, of the measured ADI feature; a critical dimension of the measured ADI feature; an elongation, in a specified direction, of the measured ADI feature; a triangularity of the measured ADI feature; and a rotation of the measured ADI feature.

In an embodiment, there is provided a non-transitory computer-readable media comprising instructions that, when executed by one or more processors, cause operations comprising procedures of method 2200, 2300, or 2400 discussed above. In an embodiment, the non-transitory computer-readable media can be implemented in the metrology tool, a computer hardware system, a lithographic apparatus, or other systems related to a patterning process. Such non-transitory computer-readable media improves the patterning process, metrology results, and overall yield of the patterning process.

In an embodiment, the methods discussed above (e.g. methods 400, 900, 1700, 2200 or 2300) may be implemented via a processor (e.g., 104 of the computer system 100). In an embodiment, a computer program product comprises a non-transitory computer readable medium having instructions recorded thereon, the instructions when executed by a computer implementing procedures of the method discussed herein.

Figure 28:
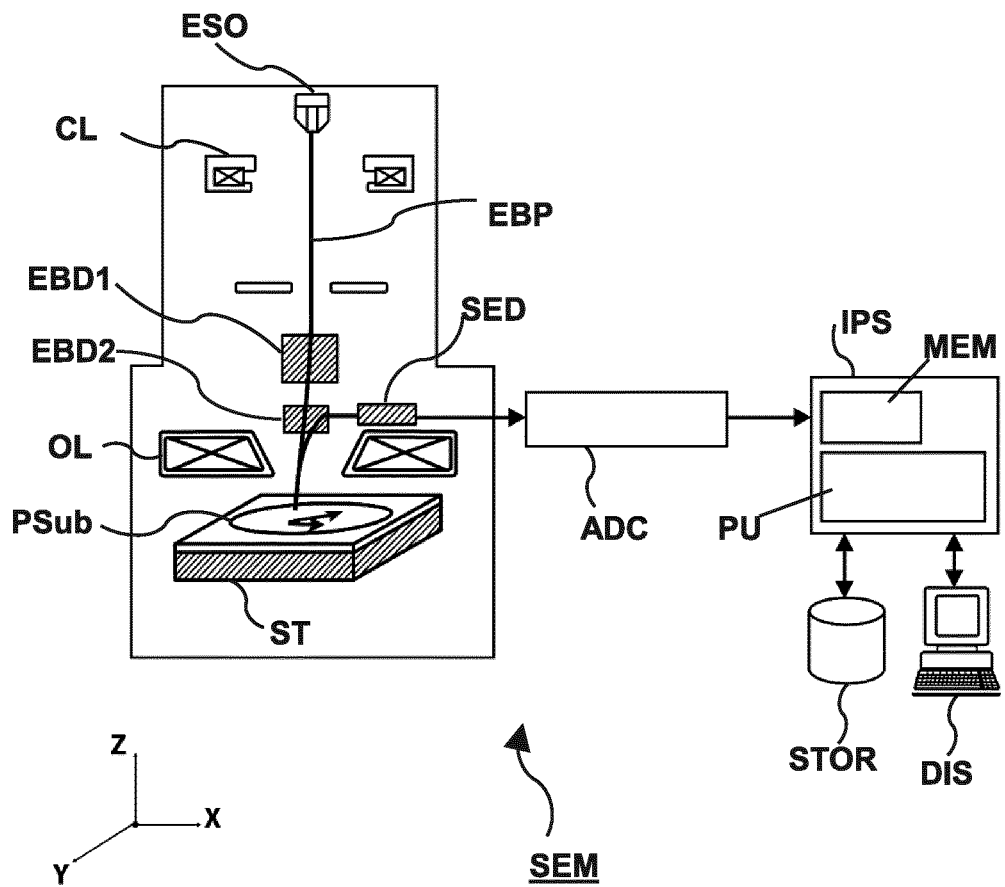
FIG. 28 schematically depicts an embodiment of a scanning electron microscope (SEM), according to an embodiment.

In some embodiments, the inspection apparatus may be a scanning electron microscope (SEM) that yields an image of a structure (e.g., some or all the structure of a device) exposed or transferred on the substrate. FIG. 28 depicts an embodiment of a SEM tool. A primary electron beam EBP emitted from an electron source ESO is converged by condenser lens CL and then passes through a beam deflector EBD1, an E×B deflector EBD2, and an objective lens OL to irradiate a substrate PSub on a substrate table ST at a focus.

When the substrate PSub is irradiated with electron beam EBP, secondary electrons are generated from the substrate PSub. The secondary electrons are deflected by the E×B deflector EBD2 and detected by a secondary electron detector SED. A two-dimensional electron beam image can be obtained by detecting the electrons generated from the sample in synchronization with, e.g., two dimensional scanning of the electron beam by beam deflector EBD1 or with repetitive scanning of electron beam EBP by beam deflector EBD1 in an X or Y direction, together with continuous movement of the substrate PSub by the substrate table ST in the other of the X or Y direction.

A signal detected by secondary electron detector SED is converted to a digital signal by an analog/digital (A/D) converter ADC, and the digital signal is sent to an image processing system IPU. In an embodiment, the image processing system IPU may have memory MEM to store all or part of digital images for processing by a processing unit PU. The processing unit PU (e.g., specially designed hardware or a combination of hardware and software) is configured to convert or process the digital images into datasets representative of the digital images. Further, image processing system IPU may have a storage medium STOR configured to store the digital images and corresponding datasets in a reference database. A display device DIS may be connected with the image processing system IPU, so that an operator can conduct necessary operation of the equipment with the help of a graphical user interface.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In this case, the structure may be referred as a pattern or a desired pattern that comprises a plurality of feature of the semiconductor device. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

Figure 29:
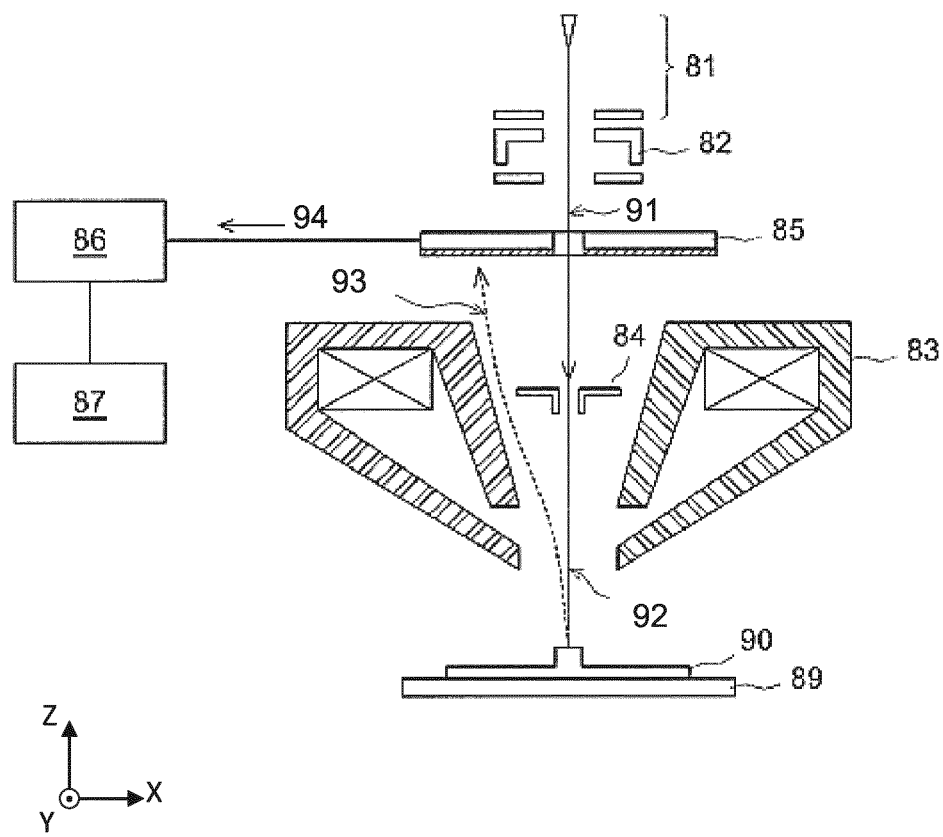
FIG. 29 schematically depicts an embodiment of an electron beam inspection apparatus, according to an embodiment.

FIG. 29 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 28 that uses a probe to inspect a substrate, the electron current in the system of FIG. 29 is significantly larger compared to, e.g., a CD SEM such as depicted in FIG. 28, such that the probe spot is large enough so that the inspection speed can be fast. However, the resolution may not be as high as compared to a CD SEM because of the large probe spot. In an embodiment, the above discussed inspection apparatus may be single beam or a multi-beam apparatus without limiting the scope of the present disclosure.

The SEM images, from, e.g., the system of FIG. 28 or FIG. 29, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 30:
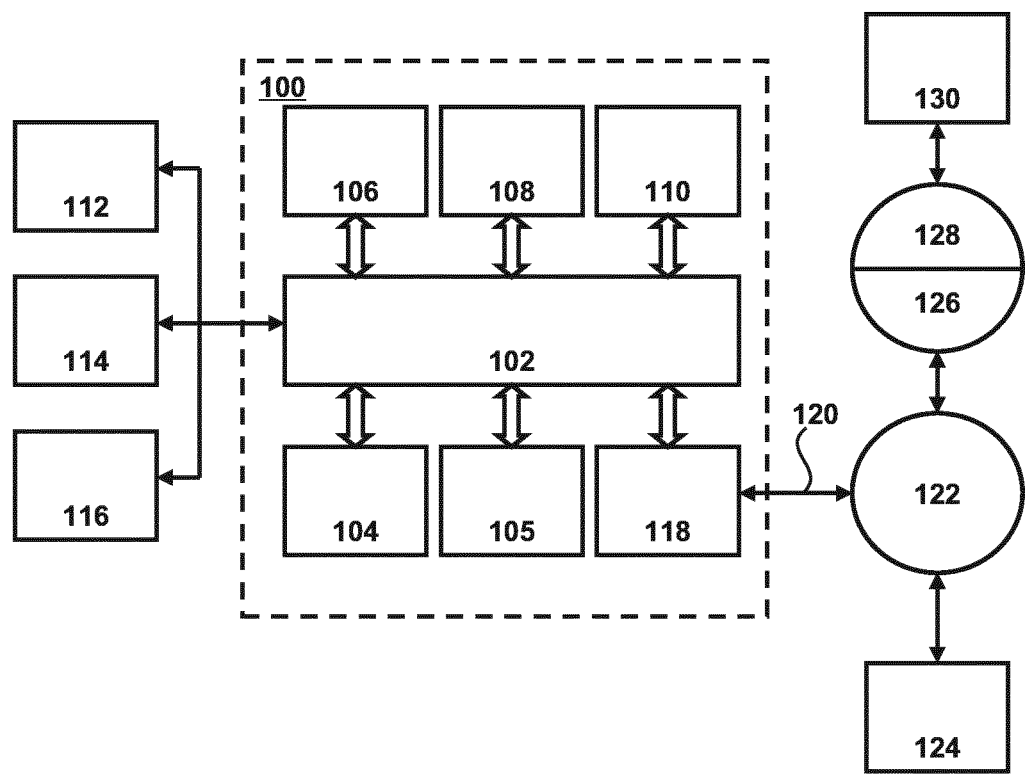
FIG. 30 is a block diagram of an example computer system, according to an embodiment.

FIG. 30 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 31:
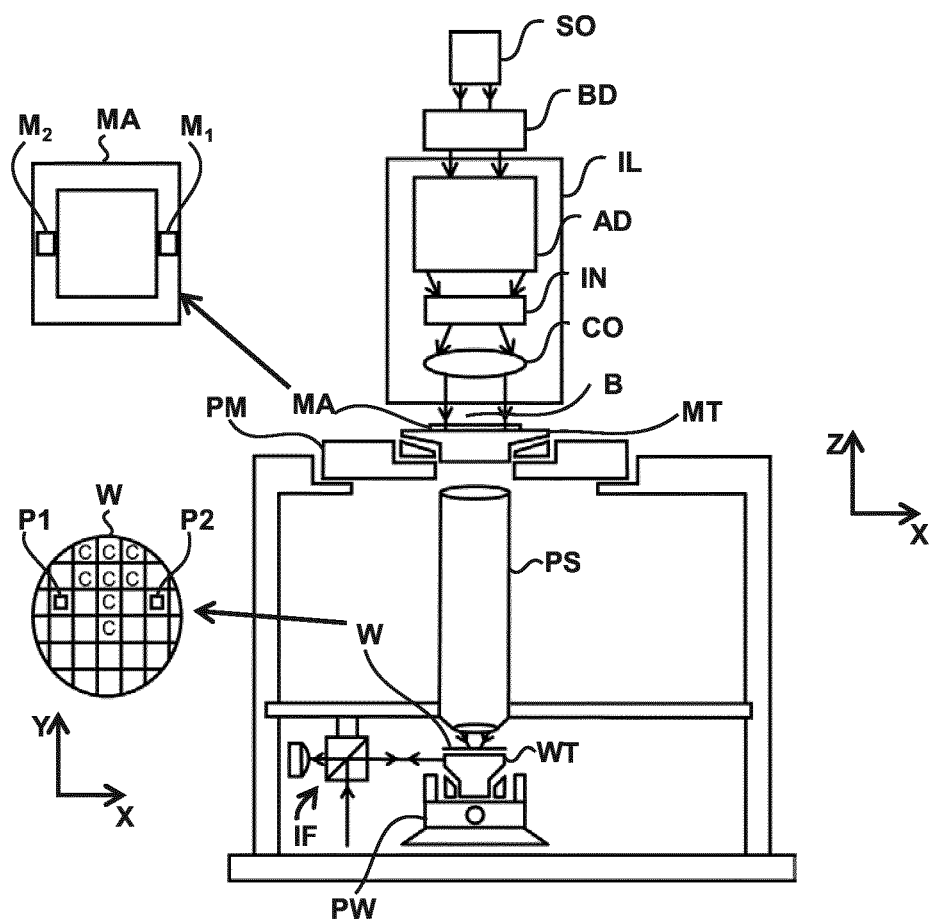
FIG. 31 is a schematic diagram of a lithographic projection apparatus, according to an embodiment.

FIG. 31 schematically depicts an exemplary lithographic projection apparatus in conjunction with the techniques described herein can be utilized. The apparatus comprises:
  an illumination system IL, to condition a beam B of radiation. In this particular case, the illumination system also comprises a radiation source SO;
  a first object table (e.g., patterning device table) MT provided with a patterning device holder to hold a patterning device MA (e.g., a reticle), and connected to a first positioner to accurately position the patterning device with respect to item PS;
  a second object table (substrate table) WT provided with a substrate holder to hold a substrate W (e.g., a resist-coated silicon wafer), and connected to a second positioner to accurately position the substrate with respect to item PS;
  a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 31 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 31. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 32:
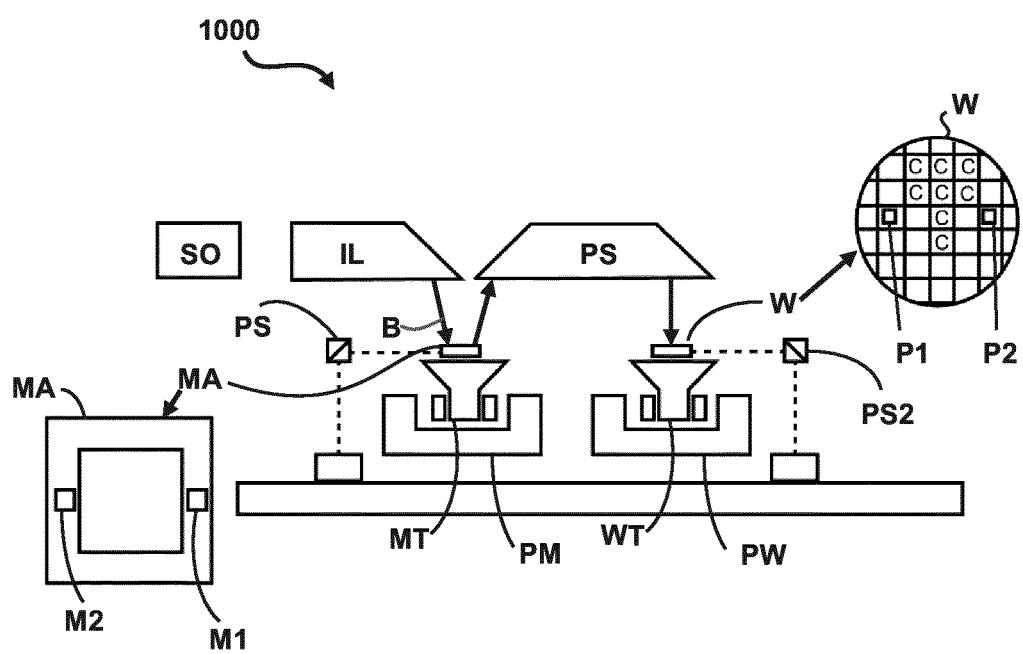
FIG. 32 is a schematic diagram of an extreme ultraviolet (EUV) lithographic projection apparatus, according to an embodiment.

FIG. 32 schematically depicts another exemplary lithographic projection apparatus 1000 that includes:

a source collector module SO to provide radiation.

an illumination system (illuminator) IL configured to condition a radiation beam B (e.g. EUV radiation) from the source collector module SO.

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have multilayer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 32, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 32, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 33:
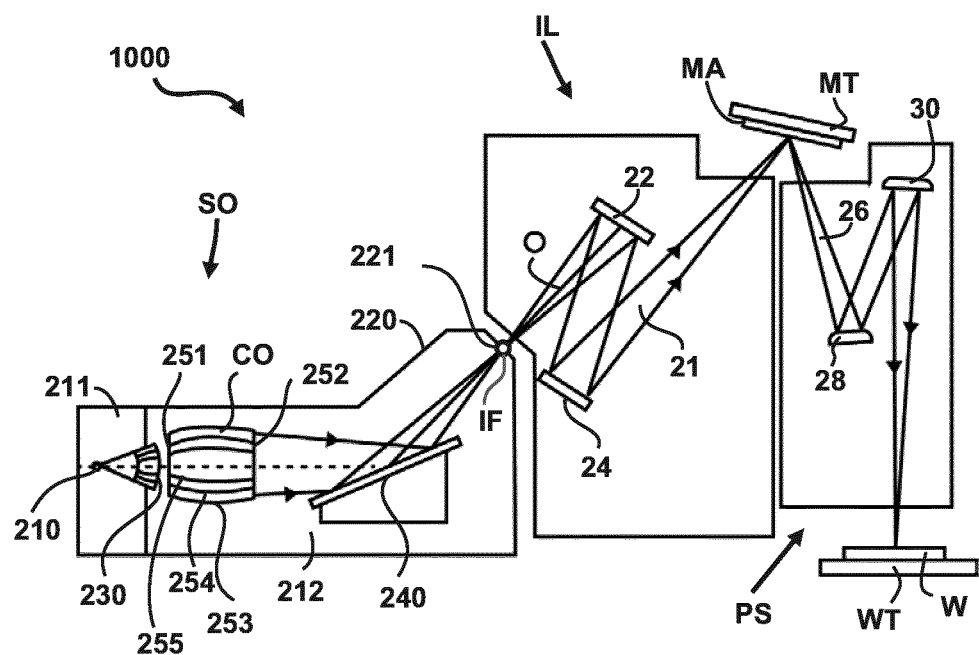
FIG. 33 is a more detailed view of the apparatus in FIG. 32, according to an embodiment.

FIG. 33 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 33.

Collector optic CO, as illustrated in FIG. 33, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 34:
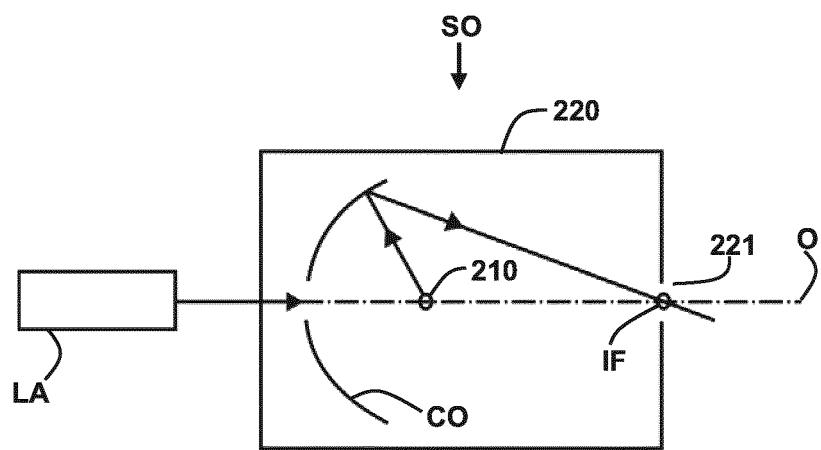
FIG. 34 is a more detailed view of the source collector module of the apparatus of FIG. 32 and FIG. 33, according to an embodiment.

Alternatively, the source collector module SO may be part of an LPP radiation system as shown in FIG. 34. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of training a model configured to predict whether a feature associated with an imaged substrate will be defective after etching of the imaged substrate, the method comprising:

obtaining, via a metrology tool, (i) an after development image of the imaged substrate at a given location, the after development image including a plurality of features, and (ii) an after etch image of the imaged substrate at the given location, the after etch image including etched features corresponding to the plurality of features; and training, using the after development image and the after etch image, the model configured to determine defectiveness of a given feature of the plurality of features in the after development image, wherein the determining of defectiveness is based on comparing the given feature in the after development image with a corresponding etch feature in the after etch image.

2. The method of clause 1, wherein the model is an empirical model or a machine learning model, wherein the empirical model is a function of a physical characteristic of the feature associated with the imaged substrate.

3. The method of any of clauses 1-2, wherein the obtaining of the after development image comprises:

imaging, via a patterning apparatus, a mask pattern on a substrate;

obtaining a developed substrate of the imaged substrate;

aligning the metrology tool to the developed substrate at the given location; and capturing an image of the developed substrate.

4. The method of any of clauses 1-3, wherein the obtaining of the after etch image comprises:

etching, via an etch process with specified etch conditions, the imaged substrate;

aligning the metrology tool to the etched substrate at the given location; and capturing the after etch image of the etched substrate.

5. The method of clause 4, wherein the etch conditions include etchant composition, plasma gas parameters, etching rate, electro-magnetic fields, a plasma potential, an inductive or a capacitive type of etching, a temperature of the substrate, ion energy distribution, ion angular distribution, sputtering and redeposition rates, or a combination thereof.

6. The method of any of clauses 1-5, wherein the training comprises:

aligning, based on the plurality of features, the after development image and the after etch image;

comparing each of the features of the plurality of features in the after development image with a corresponding feature of etched features in the after etch image;

determining, based on the comparison, whether a given etched feature in the after etch image satisfy a defect condition;

responsive to not satisfying the defect condition, classifying the identified feature as defective; and adjusting a model parameter value of the model based on the defectiveness of the identified feature.

7. The method of clause 6, wherein the adjusting of the model parameter value includes adjusting values of a plurality of model parameters.

8. The method of clause 6, wherein the defective condition is a physical characteristic of the given etched feature in the after etch image.

9. The method of clause 8, wherein the physical characteristic is at least one of:

a critical dimension of the given etched feature; or a displacement of the given etched feature with respect to the given feature of the after development image.

10. The method of any of clauses 1-9, wherein the defectiveness is characterized by at least one of:

a binary determination of defective or not defective; or a probability of the given feature being defective.

11. The method of any of clauses 2-10, wherein the machine learning model is a convolution neural network.

12. The method of clause 11, wherein the model parameters are weights or biases associated with one or more layers of the machine learning model.

13. The method of clause 11, wherein the model parameters being weights or biases includes the model parameters being weights and biases.

14. The method of any of clauses 1-13, wherein the metrology tool is an optical microscope or an electron beam microscope.

15. The method of any of clauses 1-13, wherein the metrology tool is a scanning electron microscope (SEM) and the measure values are obtained from a SEM image.

16. The method of any of clauses 1-15, wherein the trained model is further configured to predict a failure rate associated with the given pattern of the after development image, the failure rate being indicative of a defect occurrence when the imaged substrate is etched using the specified etch conditions.

17. The method of any of clauses 1-16, wherein the further configuring of the training model comprises:

classifying the plurality of patterns associated with a pattern of interest as defective or not defective;

determining a total number of defective patterns associated with the pattern of interest; and computing the failure rate of the pattern of interest as ratio of the total number of defective pattern and a total number of patterns in the plurality of patterns.

18. The method of any of clauses 1-17, further comprising:

imaging, via a patterning apparatus, a desired pattern on a substrate;

obtaining an after development image of the imaged pattern;

executing the training model using the after development image to classify whether the desired pattern will be defective after etching; and adjusting, based on the classified defective pattern, an etching condition such that imaged pattern will not be defective after etching.

19. A method for determining etch conditions for an imaged substrate, the method comprising:

obtaining an after development image of the imaged substrate, and initial etch conditions to be used for etching the imaged substrate;

determining, via a trained model using the after development image and the initial etch conditions, a failure rate of a feature associated with the imaged substrate, the failure rate being indicative of the feature being defective after etching of the imaged substrate; and modifying, based on the failure rate, the initial etch conditions such that a chance of the feature being defective after etching is reduced.

20. The method of clause 19, wherein the modifying the etch conditions is an iterative process, and wherein an iteration comprises:

obtaining a relationship between a given etch condition and a given failure rate associated with a given feature;

determining, via executing an etch model using the after development image and the etch conditions, an after etch image associated with the imaged substrate, determining, based on the after etch image, whether the given feature satisfies a defect condition; and responsive to not satisfying the defect condition, identifying, based on the relationship, another etch condition associated with a lower failure rate as compared to the given failure rate.

21. The method of any of clauses 19-20, wherein the defect condition of the feature is at least one of:

an omission of the feature;

a displacement range associated with the feature; or a tolerance range associated with critical dimension of the feature.

22. A method of determining an etch characteristic associated with an etch process, the method comprising:

obtaining, via a metrology tool, (i) an after development image (ADI) of an imaged pattern at a given location of a substrate, wherein the imaged pattern includes feature of interest and neighboring features adjacent to the feature of interest, and (ii) an after etch image (AEI) of the imaged pattern at the given location of the substrate, wherein the AEI includes an etched feature corresponding to the feature of interest in the ADI; and determining, using the ADI and the AEI, a correlation between the etched feature and the neighboring features associated with the feature of interest in the ADI, wherein the correlation characterizes the etch characteristic associated with the etching process.

23. The method of clause 22, wherein the feature of interest includes a plurality of features of interest.

24. The method of any of clauses 22-23, wherein the correlation is a function of a density of the neighboring features adjacent to the feature of interest.

25. The method of any of clauses 22-24, wherein the correlation between the etched feature and the neighboring features in the ADI depends on at least one of:

a geometric shape of the feature of interest or the neighboring features;

a geometric shape of assist features or bias associated with the feature of interest;

a distance between the feature of interest and the neighboring features;

a distance along a line feature;

a critical dimension of the feature;

coordinates on the substrate associated with the feature of interest, the neighboring features, and the etched feature of interest;

assist features or lack of assist features around the feature of interest; or a deviation of an edge position from its expected position associated with the feature of interest.

26. The method of any of clauses 22-25, wherein the correlation based on the critical dimension of a feature is computed using following equation:

$$R_{neighbors}^2 = \vec{c}^T \cdot Q^{-1} \cdot \vec{c}$$

wherein $\vec{c} = (r_{CDAEI,CDADI_1}, \ldots, r_{CDAEI,CDADI_6})^T$ is a vector of correlations, where CDAEI is the AEI CD of the feature of interest; $CDADI_i$ is the ADI CD of the $i^{th}$ neighbor; and r is the correlation coefficient, and $Q_{ij} = r_{CDADI_i,CDADI_j}$ is a correlation matrix.

27. The method of any of clauses 22-26, wherein the feature of interest is at least one of:
 a contact hole;
 a line; or
 a line end.

28. The method of any of clauses 22-27, wherein the neighboring features are at least one of:
 a plurality of contact holes at a defined orientation with respect to the feature of interest; or
 a plurality of lines with a defined pitch.

29. The method of any of clauses 22-28, further comprising:
 generating a power spectral density of the correlation in a spatial domain, the power spectral density being indicative of a magnitude of the etch characteristic effect and a range of the loading effect.

30. The method of any of clauses 22-29, further comprising determining, based on the correlation and at a given radial distance between the center of the substrate and the edge of the substrate, etch conditions associated with the imaged pattern so that the correlation remains within a target range.

31. The method of any of clauses 22-30, further comprising determining, based on the correlation, etch conditions for the imaged pattern located at a center of a substrate so that the correlation is within the target range.

32. The method of any of clauses 22-31, further comprising determining, based on the correlation, etch conditions for the imaged pattern located at an edge of the substrate so that the correlation remains within the target range.

33. The method of any of clauses 31-32, wherein the etch conditions include etchant composition, plasma gas parameters, etching rate, electro-magnetic fields, a plasma potential, an inductive or a capacitive type of etching, a temperature of the substrate, ion energy distribution, ion angular distribution, parameters associated with sputtering and redeposition rates, an etch cycle parameter based on a saturation effect, or a combination thereof.

34. The method of any of clauses 30-33, wherein the etch conditions depends on at least one of:
 a location of the substrate being etched, the location being the radial distance between the center of the substrate and the edge of the substrate;
 an etch cycle;
 an etch chamber;
 a sequence of the etching cycle and deposition step; or
 tuning parameters associated with the etch chamber, the tuning being based on a sensitivity of correlation to a change in the tuning parameter.

35. The method of any of clauses 30-34, wherein the determining of the correlation comprises:
 obtaining (i) a plurality of ADI at a plurality of given locations of the substrate, each ADI having a same feature of interest, and (ii) a plurality of AEI at the plurality of the given locations, each AEI having the etched feature of interest corresponding to the feature of interest; establishing the correlation between the neighboring features of the feature of interest in each ADI and the etched feature of interest in each of the AEI.

36. A method of determining an etch condition associated with an etch process, the method comprising:
 obtaining a correlation between an etched feature of interest in an after etch image (AEI) and a neighboring feature associated with the etched feature of interest in an after development image (ADI); and
 determining, based on the correlation, the etch condition associated with the etch process so that the correlation remains within a target range.

37. The method of clause 36, wherein the obtaining of the correlation between the etched feature and the neighboring feature includes obtaining the correlation between the etched feature and a plurality of neighboring features.

38. The method of clause 36, wherein the determining of the etch condition depends on at least one of:
 a location of the substrate being etched, the location being a radial distance between the center of the substrate and the edge of the substrate;
 an etch cycle of the etch process;
 an etch chamber used in the etch process;
 a sequence of the etching cycle and deposition step; or
 a tuning parameter associated with the etch chamber tuning parameter associated with the etch chamber, the tuning being based on a sensitivity of correlation to a change in the tuning parameter.

39. The method of clause 38, wherein the tuning parameter includes a plurality of tuning parameters.

40. The method of any of clauses 36-39, wherein the determining of the etch condition comprises:
 adjusting values of the tuning parameter associated with a given etch chamber such that the correlation associated with the given imaged pattern remains within the target range.

41. The method of any of clauses 36-40, wherein the obtaining of the correlation comprises:
 obtaining, via a metrology tool, (i) the after development image (ADI) of the imaged pattern at a given location, an imaged pattern including a feature of interest and a neighboring feature adjacent to the feature of interest, and (ii) the after etch image (AEI) of the imaged pattern at the given location, the AEI including the etched feature of interest corresponding to the feature of interest in the ADI; and
 determining, using the ADI and the AEI, the correlation between the etched feature and the neighboring feature associated with the feature of interest in the ADI.

42. A method of developing an interpretation model configured to interpret a prediction generated by a trained model, the method comprising:
 obtaining, via executing the trained model, a data set, the data set comprising a plurality of predictions associated with a plurality of features in an after development image (ADI), the ADI including a feature of interest, each prediction of the plurality of predictions being made by the trained model;
 determining distances between each location of the plurality of features and the feature of interest;
 assigning, based on the distances, weights to each prediction of the plurality of predictions; and
 determining, based on the weighted predictions, model parameter values of the interpretation model so that a difference between an output of the interpretation model and the weighted predictions is reduced, wherein the model parameter values indicate contributions of each pixel of the ADI towards the prediction related to the feature of interest.

43. The method of clause 42, wherein the obtaining of the plurality of predictions comprises:
   executing the trained model to predict a characteristic of each feature of the plurality of features in the ADI, the characteristic indicates defectiveness of the plurality of features.

44. The method of clause 43, wherein the defectiveness of a given feature in the ADI indicates a probability that the given feature will be defective after etching.

45. The method of any of clauses 42-44, wherein the prediction is whether the feature of interest in the ADI will print with defect or no defect after etching.

46. The method of any of clauses 42-45, wherein the assigning of the weights to each prediction comprises: assigning a relatively higher weight to a prediction of the plurality of predictions if the distance associated therewith is relatively small.

47. The method of any of clauses 42-46, wherein the determining of the model parameter values of the interpretation model is a fitting process comprising:
   obtaining initial model parameter values and the weighted predictions;
   executing the interpretation model using the initial model parameter values to generate an initial output; and
   determining a difference between the weighted predictions and the initial output;
   adjusting, based on the difference, the initial model parameter values so that the difference is minimized.

48. The method of any of clauses 42-47, wherein the interpretation model receives the ADI including the feature of interest as input and generates an interpretation map as an output, wherein the interpretation map indicates contributions of a vicinity of the feature of interest towards making the prediction associated with the feature of interest.

49. The method of any of clauses 42-48, wherein the interpretation map is a pixelated image and the model parameter values are weights assigned to each pixel of the pixelated image.

50. The method of any of clauses 42-49, wherein the interpretation map is a binary map, wherein each pixel is assigned a value of either 0 or 1.

51. The method of any of clauses 42-50, wherein the binary map is generated by assigning each pixel a value of either 0 or 1 based on a pixel value breaching a threshold value, wherein 0 indicates the feature of interest will print with defect after etching and 1 indicates the feature interest will print with no defect after etching.

52. The method of any of clauses 42-51, wherein the interpretation map is a colored imaged, wherein a particular color are assigned based on the model parameter values.

53. The method of any of clauses 42-52, wherein the interpretation model is a linear model associated with the feature of interest in the ADI.

54. The method of any of clauses 42-53, wherein the linear model is fitted to the plurality of predictions using a linear regression employing a least squares error.

55. A method for identifying contributions of pixels of an after development image towards a prediction generated by a trained model, the method comprising:
   obtaining (i) the after development image (ADI) including a feature of interest using a metrology tool, and (ii) an interpretation model configured to interpret a prediction related to the feature of interest, the prediction being generated via the trained model; and
   applying the interpretation model to the ADI image to generate an interpretation map, the interpretation map comprising pixel values that quantify contributions of each pixel of the ADI image towards the prediction of the feature of interest.

56. The method of clause 55, wherein the interpretation model is a linear model associated with the feature of interest in the ADI.

57. The method of any of clauses 55-56, wherein the interpretation map is a binary map, wherein each pixel is assigned a value of either 0 or 1.

58. The method of any of clauses 55-57, wherein the prediction is defectiveness of the feature of interest, the prediction being made via a trained model.

59. The method of any of clauses 55-58, wherein the interpretation map is a binary map, wherein each pixel is assigned a value of either 0 or 1.

60. A method of developing a model for determining failure rates of features in an after development image, the method comprising:
   obtaining the after development image (ADI) of a substrate, the ADI comprising a plurality of features;
   generating a first part of the model based on physical characteristic values related to a subset of features of the ADI; and
   generating a second part of the model based upon the first part of the model and the physical characteristic values related to all the features of the plurality of features of the ADI, wherein the subset of features of the ADI are differentiated from other features of the ADI.

61. The method of clause 60, wherein the generating of the first part of the model and the second part of the model comprises fitting of a first probability distribution function and a second probability distribution function, respectively by maximizing a log-likelihood metric of the model.

62. The method of clause 61, wherein the model is a combination of (i) the first probability distribution function configured to estimate distribution of the physical characteristic values (e.g., CD) for non-failing holes, and (ii) the second probability distribution function configured to determine failure rates based on physical characteristic values of all the plurality of features of the ADI.

63. The method of clause 61, wherein the model is a weighted sum of the first probability distribution function, and the second probability distribution function.

64. The method of clause 61, wherein the generating of the model comprises:
   fitting the first probability distribution function based on a square of the physical characteristic values of the subset of features by maximizing a first log-likelihood metric related to the first probability distribution function, wherein the subset of features have values of the physical characteristics above a physical characteristics threshold value;
   combining the fitted first probability distribution function and the second probability distribution function; and
   fitting, based on the combined distribution, the second probability distribution function and a relative weight associated therewith based on the physical characteristics values of all the features of the plurality of features so that a second log-likelihood metric related to the combined distribution is maximized.

65. The method of clause 61, wherein the fitting of the first probability distribution function is an iterative process comprising:

(a) determining the first log-likelihood metric using given values of parameters of the first probability distribution function;
(b) determining whether the first log-likelihood metric is maximized; and
(c) responsive to not maximized, adjusting, based on a gradient, the values of the parameters of the first probability distribution function, and performing steps (a)-(c)
wherein the gradient is a first derivative of the first log-likelihood metric with respect to the parameters of the first probability distribution function.

66. The method of clause 61, wherein the fitting of the second probability distribution function comprises:
determining, based on maximizing of the second log-likelihood metric, values of parameters of the second probability distribution function and its weight without modifying the values of the parameters of the first probability distribution function.

67. The method of clause 61, wherein the fitting of the second probability distribution function is an iterative process comprising:
(a) obtaining the combined distribution of the fitted first probability distribution function and the second probability distribution function;
(b) determining, based on the combined distribution and keeping the values of parameters of the fitted first distribution fixed, the second log-likelihood metric using given values of the parameters of the second probability distribution function;
(c) determining whether the second log-likelihood metric is maximized; and
(d) responsive to not maximized, adjusting, based on a gradient, the values of the parameters of the second probability distribution function, and performing steps (b)-(d)
wherein the gradient is a first derivative of the second log-likelihood metric with respect to the parameters of the second probability distribution function.

68. The method of any of clauses 61-67, wherein the first probability distribution function is a normal distribution characterized by a truncation value related to the physical characteristic, a first location parameter that describes a shift of the normal distribution and a first scale parameter that describes a spread of the normal distribution.

69. The method of any of clauses 61-68, wherein the second probability distribution function is a generalized extreme value (GEV) distribution characterized by a second location parameter ($\mu$) that describes a shift in the GEV distribution, a second scale parameter ($\sigma$) that describes a spread of the GEV distribution, and a shape parameter ($\xi$) that describes a shape of GEV distribution.

70. The method of any of clauses 61-69, further comprising:
imaging, via a patterning apparatus, a desired pattern comprising another plurality of features on another substrate;
obtaining the after development image of the imaged pattern;
executing the first and second probability distribution functions using the after development image to classify a fraction of features within ADI as defective after etching; and
adjusting, based on the classified features, an etching condition such that the imaged pattern will not fail after etching.

71. The method of any of clauses 61-70, wherein the plurality of features include a plurality of holes, a plurality of lines, a plurality of pillars, or a combination thereof.

72. The method of any of clauses 70-71, wherein the fraction of features of the ADI classified as defective after etching includes at least one of:
a closed hole after etching due to resist blocking a development of the hole; or
a merging hole after etching; or
a necking of a line of the plurality of lines.

73. The method of any of clauses 60-72, further comprising:
tuning a lithographic process to reduce the failure rate of ADI features after etching, wherein the tuning comprises adjusting dose, focus, or both;
determining whether extra filtering step for a resist layer should be performed to reduce the failure rate of the ADI features after etching;
determining whether an extra descumming or punch through step should be should be performed to reduce the failure rate of the ADI features after etching;
inspecting, during high volume manufacturing, ADI features to determine whether a lithographic apparatus satisfies specified criteria of printing; or
reworking, based on the failure rate, a certain substrate or a lot of substrate before etching.

74. The method of any of clauses 60-73, wherein the ADI is an image of a printed substrate obtained via a metrology tool or from a database storing images of the printed substrate.

75. The method of any of clauses 60-74, wherein the physical characteristic is critical dimension (CD) of a feature, and the physical characteristic threshold value is a CD threshold value.

76. The method of any of clauses 60-74, wherein the physical characteristic is at least one of:
a geometrical average of CDs of a feature, where the CDs are measured along a first direction and a second direction in the ADI;
a directional CD of the feature of interest in the ADI;
a curvature variance of the feature of interest in the ADI; or CD obtained at multiple metrology tool thresholds for each feature of interest.

77. The method of clause 76, wherein the directional CD is at least one of:
CD measured along the x-direction;
CD measured along the y-direction; or
CD measured along a desired angle.

78. The method of any of clauses 60-77, further comprising:
extracting, from the model, statistical characteristics associated with the non-failing holes; and
determining, based on the statistical characteristics, a process window of a patterning process.

79. A system for determining a fraction of features that will fail after etching, the system comprises:
a metrology tool for capturing an after development image (ADI) of a substrate at a given location, the after development image including a plurality of features; and
a processor configured to:
execute a model for determining failure rates of the plurality of features of ADI that will fail after etching,
wherein the model is a combination of (i) a first probability distribution function configured to estimate distribution of the physical characteristic values for non-failing holes, and (ii) a second probability distribution function configured to determine failure rates based on physical characteristic values of all the plurality of features of the ADI.

80. The system of clause 79, further comprising:
a patterning apparatus configured to image a desired pattern comprising the plurality of features on the substrate; and
the processor configured to:
receive, via the metrology tool, the ADI of the imaged substrate;
execute the first probability distribution and the second probability distribution to determine the failure rates of features of the ADI, and
tune, based on features having relatively higher failure rates, the patterning apparatus to reduce the failure rates of the features.

81. The system of clause 80, wherein the processor is configured to tune a dose or focus via knobs/settings of the patterning apparatus.

82. The system of clause 81, wherein the processor is further configured to:
determine whether extra filtering step for a resist layer should be performed to reduce the failure rate of the ADI features after etching;
determine whether an extra descumming or punch through step should be should be performed to reduce the failure rate of the ADI features after etching; or
inspect, during high volume manufacturing, ADI features to determine whether a lithographic apparatus satisfies specified criteria of printing.

83. The system of any of clauses 79-82, wherein the metrology tool comprises a scanning electron microscope (SEM), the SEM being configured to measure at least one of the following physical characteristic:
an average CD of a plurality of instances of a feature of interest in the ADI;
a directional CD of the feature of interest in the ADI;
a curvature variance of the feature of interest in the ADI; or
CD obtained at multiple metrology tool thresholds for each feature of interest.

84. A non-transitory computer-readable media comprising instructions that, when executed by one or more processors, cause operations comprising:
obtaining the after development image (ADI) of a substrate, the ADI comprising a plurality of features;
generating a first part of the model based on physical characteristic values related to a subset of features of the ADI; and
generating a second part of the model based upon the first part of the model and the physical characteristic values related to all the features of the plurality of features of the ADI, wherein the subset of features of the ADI are differentiated from other features of the ADI.

85. The non-transitory computer-readable media of clause 84, wherein the model is a combination of (i) a first probability distribution function configured to estimate distribution of the physical characteristic values for non-failing holes, and (ii) a second probability distribution function configured to determine failure rates based on physical characteristic values of all the plurality of features of the ADI.

86. The non-transitory computer-readable media of clause 85, wherein the model is a weighted sum of the first probability distribution function, and the second probability distribution function.

87. The non-transitory computer-readable media of clause 85, wherein the generating of the model comprises:
fitting the first probability distribution function based on a square of the physical characteristic values of the subset of features by maximizing a first log-likelihood metric related to the first probability distribution function, wherein the subset of features have values of the physical characteristics above a physical characteristics threshold value;
combining the fitted first probability distribution function and the second probability distribution function; and
fitting, based on the combined distribution, the second probability distribution function and a relative weight associated therewith based on the physical characteristics values of all the features of the plurality of features so that a second log-likelihood metric related to the combined distribution is maximized.

88. The non-transitory computer-readable media of clause 85, wherein the fitting of the first probability distribution function is an iterative process comprising:
(a) determining the first log-likelihood metric using given values of parameters of the first probability distribution function;
(b) determining whether the first log-likelihood metric is maximized; and
(c) responsive to not maximized, adjusting, based on a gradient, the values of the parameters of the first probability distribution function, and performing steps (a)-(c),
wherein the gradient is a first derivative of the first log-likelihood metric with respect to the parameters of the first probability distribution function.

89. The non-transitory computer-readable media of clause 85, wherein the fitting of the second probability distribution function comprises:
determining, based on maximizing of the second log-likelihood metric, values of parameters of the second probability distribution function and its weight without modifying the values of the parameters of the first probability distribution function.

90. The non-transitory computer-readable media of clause 85, wherein the fitting of the second probability distribution function is an iterative process comprising:
(a) obtaining the combined distribution of the fitted first probability distribution function and the second probability distribution function;
(b) determining, based on the combined distribution and keeping the values of parameters of the fitted first distribution fixed, the second log-likelihood metric using given values of the parameters of the second probability distribution function and;
(b) determining whether the second log-likelihood metric is maximized; and
(c) responsive to not maximized, adjusting, based on a gradient, the values of the parameters of the second probability distribution function, and performing steps (b)-(c),
wherein the gradient is a first derivative of the second log-likelihood metric with respect to the parameters of the second probability distribution function.

91. The non-transitory computer-readable media of any of clauses 85-90, wherein the first probability distribution function is a normal distribution characterized by a truncation value related to the physical characteristic, a first location parameter that describes a shift of the normal distribution and a first scale parameter that describes a spread of the normal distribution.

92. The non-transitory computer-readable media of any of clauses 85-91, wherein the second probability distribution function is a generalized extreme value (GEV) distribution characterized by a second location parameter (μ) that describes a shift in the GEV distribution, a second scale parameter (σ) that describes a spread of the GEV distribution, and a shape parameter (ξ) that describes a shape of GEV distribution.

93. The non-transitory computer-readable media of any of clauses 85-92, further cause operations comprising:
  imaging, via a patterning apparatus, a desired pattern comprising a plurality of features on a substrate;
  obtaining the after development image of the imaged pattern;
  executing the first and second probability distribution functions using the after development image to classify a fraction of features within ADI as defective after etching; and
  adjusting, based on the classified features, an etching condition such that the imaged pattern will not fail after etching.

94. The non-transitory computer-readable media of any of clauses 84-93, further cause operations comprising:
  tuning a lithographic process to reduce the failure rate of ADI features after etching, wherein the tuning comprises adjusting dose, focus, or both;
  determining whether extra filtering step for a resist layer should be performed to reduce the failure rate of the ADI features after etching;
  determining whether an extra descumming or punch through step should be should be performed to reduce the failure rate of the ADI features after etching; or
  inspecting, during high volume manufacturing, ADI features to determine whether a lithographic apparatus satisfies specified criteria of printing.

95. The non-transitory computer-readable media of any of clauses 83-93, wherein the physical characteristic is critical dimension (CD) of a feature, and the physical characteristic threshold value is a CD threshold value.

96. A method for determining a defect attribute of a feature in an after development image (ADI), the method comprising:
  exposing an ADI feature to a charged particle beam to produce a first image of the ADI feature, the ADI feature being a structure within a resist material;
  re-exposing the ADI feature to the charged particle beam to produce a second image of the ADI feature; and
  determining, based on data derived from the first image and the second image, the defect attribute of the ADI feature.

97. The method of clause 96, wherein the determining of the defect attribute comprises:
  extracting a first characteristic from the first image and a second characteristic from the second image;
  determining, based on a difference between the first characteristic and the second characteristic, whether a defect metric is breached; and
  responsive to the defect metric being breached, classifying the ADI feature as defective.

98. The method of clause 97, wherein the derived data is a physical characteristic comprising a critical dimension, or pixel intensity.

99. The method of clause 98, wherein the defect metric is a function of a first physical characteristic of the ADI feature in the first image and a second physical characteristic of the ADI feature in the second image.

100. The method of any of clauses 97-99, wherein the defect metric is a multi variate function, a bilinear function, a trained machine learning model, or a second or higher order polynomial.

101. The method of clause 100, wherein the trained machine learning model is obtained by:
  training a machine learning model using a training data set comprising: (i) a plurality of image pairs, each image pair comprising a first image and a second image of a plurality of ADI features, and (ii) after etch images (AEI) of a substrate corresponding to the ADI features.

102. The method of clause 101, wherein the training step is an iterative process comprising:
  (a) adjusting parameters of the machine learning model such that the model determines the defect attribute of a given ADI feature based on a comparison between the first image and the second image;
  (b) determining whether the model determined defect attribute within a specified range of a defect attribute of the AEI feature corresponding to the given ADI feature; and
  (c) responsive to not in the specified range, performing steps (a) and (b).

103. The method of any of clauses 96-102, wherein the electron beam is generated via a scanning electron microscope (SEM), and the first image and the second images are SEM images.

104. The method of any of clauses 96-103, wherein the defect attribute is whether the ADI feature is defective or not defective, or a probability of failure associated with the ADI feature.

105. The method of any of clauses 96-104, wherein the first image comprises a plurality of frames obtained from the first exposure, and the second image comprises a plurality of frames obtained from the re-exposure of the ADI feature.

106. The method of clause 105, wherein the determining comprises:
  determining the difference between the physical characteristic associated with one or more frames of the first image and a corresponding one or more frames of the second images.

107. The method of any of clauses 96-106, wherein the charged particle beam is an electron-beam.

108. A method for developing a model to determine failure rates of features in an after development image, the method comprising:
  obtaining, via metrology tool, (i) a first measurement data associated with an after development image (ADI) of a substrate, the ADI comprising a plurality of features, and (ii) a second measurement data associated with the same ADI, the second measurement data obtained subsequent to the first measurement; and
  generating, based on the first measurement data and the second measurement data, the model to determine failure rates of the features of the ADI, the generating comprising:
    adjusting values of one or more model parameters such that a metric associated with the model is improved compared to the metric associated with initial values of the model parameters.

109. The method of clause 108, further comprising determining, based on the model, a process window of a patterning process based on the failure rates of features predicted by the models for a given first measurement of a given ADI, and a second measurement of the given ADI.

110. The method of clause 108, wherein the generating of the model comprises:

fitting, using the first measurement data and the second measurement data, a first probability density function (PDF) associated with a failure rate parameter, and a second probability density function (PDF) associated with a complement of the failure rate parameter by maximizing a log-likelihood metric of the model.

111. The method of clause 110, wherein fitting the first probability density function comprises:
determining values of each model parameters associated with the first PDF and the second PDF by maximizing the log-likelihood metric of the model.

112. The method of clause 111, wherein the model comprises:
the first PDF characterized by a combined distribution of a first physical characteristic and a second physical characteristic, and a first set of model parameters, the first physical characteristic being associated with the first measurement data and the second physical characteristic being associated with the second measurement data of the ADI; and
the second PDF characterized by another combined distribution of the first physical characteristic and the second physical characteristic, and a second set of model parameters.

113. The method of clause 110, wherein the first PDF is a multivariate distribution characterized by:
a first location parameter and a second location parameter that describes a shift of the multivariate distribution; and
a first scale parameter and a second location parameter that describes a spread of the multivariate distribution.

114. The method of clause 110, wherein the second PDF is a generalized extreme value (GEV) distribution characterized by:
a third location parameter and a fourth location parameter that describes a shift in the GEV distribution,
a third scale parameter and a fourth scale parameter that describes a spread of the GEV distribution, and
a shape parameter ($\xi$) that describes a shape of GEV distribution.

115. The method of any of clauses 108-114, wherein the metrology tool is a scanning electron microscope (SEM).

116. The method of clause 115, wherein the first measurement data is a first SEM image of the ADI, and the second measurement data is a second SEM image of the ADI.

117. The method of clause 116, wherein the first measurement data comprises first physical characteristic values of features in a first SEM image of the ADI, and the second measurement data comprises second physical characteristic values of features in a second SEM image of the ADI.

118. The method of clause 117, wherein the generating of the model comprises:
fitting the first PDF based on the first physical characteristic values of the plurality of features in the first SEM image of the ADI; and
fitting the second PDF based on the second physical characteristic values of the plurality of features in the second SEM image of the ADI,
wherein both the first PDF and the second PDF are fitted simultaneously by maximizing the log-likelihood metric related to the model.

119. The method of clause 118, wherein the fitting of the first PDF and the second PDF is an iterative process comprising:
(a) determining the log-likelihood metric using given values of parameters of the first PDF and the second PDF;
(b) determining whether the log-likelihood metric is maximized; and
(c) responsive to not maximized, adjusting, based on a gradient, the values of the first set of model parameters of the first PDF and the values of the second set of model parameters, and the failure rate parameter, and performing steps (a)-(c),
wherein the gradient is a first derivative of the log-likelihood metric with respect to the first model parameters, the second model parameters, and the failure rate parameter.

120. The method of clause 118, wherein the fitting of the model is such that the value of the failure rate parameter associated with first PDF and the second PDF is the same.

121. The method of any of clauses 111-120, further comprising:
determining a relationship between one or more model parameters of the first set of model parameters and the second set of model parameters based on the first measurement data and the second measurement data;
modifying, based on a relationship, the first set of model parameters in terms of the second set of model parameters to reduce a number of the first set of model parameters or the second set of model parameters; and
generating, using the first measurement data and the second measurement data, the model based on the modified parameters.

122. The method of any of clauses 112-121, wherein the physical characteristic is critical dimension (CD) of a feature.

123. The method of any of clauses 112-122, wherein the physical characteristic is at least one of:
an average CD of a plurality of instances of a feature of interest in the ADI;
a directional CD of the feature of interest in the ADI;
a curvature variance of the feature of interest in the ADI; or
CD obtained at multiple metrology tool thresholds for each feature of interest.

124. The method of clause 123, wherein the directional CD is at least one of:
CD measured along the x-direction;
CD measured along the y-direction; or
CD measured along a desired angle.

125. The method of any of clauses 108-124, wherein the failure rate is indicative of a defect condition characterized by the physical characteristic of the ADI feature or the corresponding AEI feature, the defect condition comprising one or more of:
an omission of the feature;
a displacement range associated with the feature; or
a tolerance range associated with critical dimension of the feature.

126. A non-transitory computer-readable media comprising instructions stored therein that, when executed by one or more processors, cause operations comprising:
exposing an ADI feature to a charged particle beam to produce a first image of the ADI feature, the ADI feature being a structure within a resist material;
re-exposing the ADI feature to the charged particle beam to produce a second image of the ADI feature; and
determining, based on a physical characteristic associated with the first image and the second image, the defect attribute of the ADI feature.

127. The non-transitory computer-readable media of clause 125, wherein the determining of the defect attribute comprises:
extracting a first characteristic from the first image and a second characteristic from the second image;

determining, based on a difference between the first characteristic and the second characteristic, whether a defect metric is breached; and responsive to the defect metric being breached, classifying the ADI feature as defective.

128. The non-transitory computer-readable media of clause 127, wherein the physical characteristic is a critical dimension, or pixel intensity.

129. The non-transitory computer-readable media of clause 127, wherein the defect metric is a function of a first physical characteristic of the ADI feature in the first image and a second physical characteristic of the ADI feature in the second image.

130. The non-transitory computer-readable media of any of clauses 127-129, wherein the defect metric is a multi variate function, a bilinear function, a trained machine learning model, or a second or higher order polynomial.

131. The non-transitory computer-readable media of clause 130, wherein the trained machine learning model is obtained by:
training a machine learning model using a training data set comprising: (i) a plurality of image pairs, each image pair comprising a first image and a second image of a plurality of ADI features, and (ii) after etch images (AEI) of a substrate corresponding to the ADI features.

132. The non-transitory computer-readable media of clause 131, wherein the training step is an iterative process comprising:
(a) adjusting parameters of the machine learning model such that the model determines the defect attribute of a given ADI feature based on a comparison between the first image and the second image;
(b) determining whether the model determined defect attribute within a specified range of a defect attribute of the AEI feature corresponding to the given ADI feature; and
(c) responsive to not in the specified range, performing steps (a) and (b).

133. The non-transitory computer-readable media of any of clauses 126-132, wherein the electron beam is generated via a scanning electron microscope (SEM), and the first image and the second images are SEM images.

134. The non-transitory computer-readable media of any of clauses 126-133, wherein the defect attribute is whether the ADI feature is defective or not defective, or a probability of failure associated with the ADI feature.

135. The non-transitory computer-readable media of any of clauses 126-134, wherein the first image comprises a plurality of frames obtained from the first exposure, and the second image comprises a plurality of frames obtained from the re-exposure of the ADI feature.

136. The non-transitory computer-readable media of clause 135, wherein the determining comprises:
determining the difference between the physical characteristic associated with one or more frames of the first image and a corresponding one or more frames of the second images.

137. The non-transitory computer-readable media of any of clauses 128-135, wherein the charged particle beam is an electron-beam.

138. A non-transitory computer-readable media comprising instructions stored therein that, when executed by one or more processors, cause operations comprising:
obtaining, via metrology tool, (i) a first measurement data associated with an after development image (ADI) of a substrate, the ADI comprising a plurality of features, and (ii) a second measurement data associated with the same ADI, the second measurement data obtained subsequent to the first measurement; and
generating, based on the first measurement data and the second measurement data, a model to determine failure rates of the features of the ADI, the generating comprising:
adjusting values of one or more model parameters such that a metric associated with the model is improved compared to the metric associated with initial values of the model parameters.

139. The non-transitory computer-readable media of clause 138, further comprising determining, based on the model, a process window of a patterning process based on the failure rates of features predicted by the models for a given first measurement of a given ADI, and a second measurement of the given ADI.

140. The non-transitory computer-readable media of clause 138, wherein the generating of the model comprises:
fitting, using the first measurement data and the second measurement data, a first probability density function (PDF) associated with a failure rate parameter, and a second probability density function (PDF) associated with a complement of the failure rate parameter by maximizing a log-likelihood metric of the model.

141. The non-transitory computer-readable media of clause 140, wherein fitting the first probability density function comprises:
determining values of each model parameters associated with the first PDF and the second PDF by maximizing the log-likelihood metric of the model.

142. The non-transitory computer-readable media of clause 141, wherein the model comprises:
the first PDF characterized by a combined distribution of a first physical characteristic and a second physical characteristic, and a first set of model parameters, the first physical characteristic being associated with the first measurement data and the second physical characteristic being associated with the second measurement data of the ADI; and
the second PDF characterized by another combined distribution of the first physical characteristic and the second physical characteristic, and a second set of model parameters.

143. The non-transitory computer-readable media of clause 142, wherein the first PDF is a multivariate distribution characterized by:
a first location parameter and a second location parameter that describes a shift of the multivariate distribution; and
a first scale parameter and a second location parameter that describes a spread of the multivariate distribution.

144. The non-transitory computer-readable media of clause 143, wherein the second PDF is a generalized extreme value (GEV) distribution characterized by:
a third location parameter and a fourth location parameter that describes a shift in the GEV distribution,
a third scale parameter and a fourth scale parameter that describes a spread of the GEV distribution, and
a shape parameter ($\xi$) that describes a shape of GEV distribution.

145. The non-transitory computer-readable media of any of clauses 137-144, wherein the metrology tool is a scanning electron microscope (SEM).

146. The non-transitory computer-readable media of clause 145, wherein the first measurement data is a first SEM image of the ADI, and the second measurement data is a second SEM image of the ADI.

147. The non-transitory computer-readable media of clause 146, wherein the first measurement data comprises first physical characteristic values of features in a first SEM image of the ADI, and the second measurement data comprises second physical characteristic values of features in a second SEM image of the ADI.

148. The non-transitory computer-readable media of clause 147, wherein the generating of the model comprises:
fitting the first PDF based on the first physical characteristic values of the plurality of features in the first SEM image of the ADI; and
fitting the second PDF based on the second physical characteristic values of the plurality of features in the second SEM image of the ADI,
wherein both the first PDF and the second PDF are fitted simultaneously by maximizing the log-likelihood metric related to the model.

149. The non-transitory computer-readable media of clause 148, wherein the fitting of the first PDF and the second PDF is an iterative process comprising:
(a) determining the log-likelihood metric using given values of parameters of the first PDF and the second PDF;
(b) determining whether the log-likelihood metric is maximized; and
(c) responsive to not maximized, adjusting, based on a gradient, the values of the first set of model parameters of the first PDF and the values of the second set of model parameters, and the failure rate parameter, and performing steps (a)-(c),
wherein the gradient is a first derivative of the log-likelihood metric with respect to the first model parameters, the second model parameters, and the failure rate parameter.

150. The non-transitory computer-readable media of clause 149, wherein the fitting of the model is such that the value of the failure rate parameter associated with first PDF and the second PDF is the same.

151. The non-transitory computer-readable media of any of clauses 141-150, further comprising:
determining a relationship between one or more model parameters of the first set of model parameters and the second set of model parameters based on the first measurement data and the second measurement data;
modifying, based on a relationship, the first set of model parameters in terms of the second set of model parameters to reduce a number of the first set of model parameters or the second set of model parameters; and
generating, using the first measurement data and the second measurement data, the model based on the modified parameters.

152. The non-transitory computer-readable media of any of clauses 142-151, wherein the physical characteristic is critical dimension (CD) of a feature.

153. The non-transitory computer-readable media of any of clauses 142-152, wherein the physical characteristic is at least one of:
an average CD of a plurality of instances of a feature of interest in the ADI;
a directional CD of the feature of interest in the ADI;
a curvature variance of the feature of interest in the ADI; or
CD obtained at multiple metrology tool thresholds for each feature of interest.

154. The non-transitory computer-readable media of clause 153, wherein the directional CD is at least one of:
CD measured along the x-direction;
CD measured along the y-direction; or
CD measured along a desired angle.

155. The non-transitory computer-readable media of any of clauses 138-154, wherein the failure rate is indicative of a defect condition characterized by the physical characteristic of the ADI feature or the corresponding AEI feature, the defect condition comprising one or more of:
an omission of the feature;
a displacement range associated with the feature; or
a tolerance range associated with critical dimension of the feature.

156. A method of training a model configured to determine an after etch image (AEI) feature based on an after development image (ADI) feature, the method comprising:
obtaining (i) a measurement of an ADI feature imaged on a substrate, and (ii) a measurement of an after etch image (AEI) feature, corresponding to the measured ADI feature, on the substrate subjected to an etch process;
assigning a first set of variables to characterize the measured ADI feature and a second set of variables to characterize the measured AEI feature;
determining a correlation between a combination of the first set of variables of the measured ADI feature and a combination of the second set of variables of the measured AEI feature; and
training, based on the correlation, the model by including one or more sub-combinations of the first set of variables that have correlation values within a specified correlation threshold, the model being used to determine an AEI feature for an input ADI feature.

157. The method of clause 156, wherein the determining of the correlation comprises:
computing the correlation using given values of (i) a first set of parameters associated with the combination of the first set of variables, and (ii) a second set of parameters associated with the combination of the second set of variables;
determining whether the correlation is maximized; and
responsive to the correlation not being maximized, adjusting the given values of the first set of parameters, and the second set of parameters until the correlation is maximized.

158. The method of clause 157, wherein the adjusting of the given values of the first set of parameters and the second set of parameters is performed until the correlation is within a specified range.

159. The method of any of clauses 156-158, wherein the training of the model comprising:
(a) determining sub-combinations of the first and second set of variables and whether the correlation of the sub-combination is above a specified correlation threshold;
(b) responsive to the sub-combinations being above, including the sub-combination in the model; and
(c) responsive to the sub-combinations not being above, selecting another sub-combination of the first set of variables, and repeating step (a)-(c) for a specified number of iterations or until the sub-combination are exhausted.

160. The method of clause 159, wherein the specified correlation threshold is more than 0.01.

161. The method of any of clauses 156-160, wherein the combination or the one or more sub-combination of the first set of variables is a linear combination, a non-linear combination, or a machine learning model.

162. The method of clause 161, wherein the combination or the one or more sub-combination of the first set of variables is a weighted sum of the first set of variables, wherein the weights being positive values or negative values.

163. The method of any of clauses 156-162, wherein the combination or the one or more sub-combination of the second set of variables is a linear combination, a non-linear combination, or a machine learning model.

164. The method of clause 163, wherein the correlation is computed using following equation:

$$R^2 = \frac{\left(\overrightarrow{\alpha^T} \cdot <\vec{x}^T \otimes \vec{y}> \cdot \overrightarrow{\beta}\right)^2}{\left(\overrightarrow{\alpha^T} \cdot <\vec{x}^T \otimes \vec{x}> \cdot \overrightarrow{\alpha}\right)\left(\overrightarrow{\beta^T} \cdot <\vec{y}^T \otimes \vec{y}> \cdot \overrightarrow{\beta}\right)}$$

wherein $\vec{x}$ is a vector form of the first set of variables, $\vec{\alpha}$ correspond to the first set of parameters, $\vec{\alpha} \cdot \vec{x}$ comprises one or more combination of the first set of variables, $\vec{y}$ is a vector form of the second set of variables, $\vec{\beta}$ correspond to the second set of parameters, $\vec{\beta} \cdot \vec{y}$ comprises one or more combination of the second set of variables, a numerator of $R^2$ represents a covariance between $\vec{x}$ and $\vec{y}$, and a denominator represents a product of a variance of $\vec{x}$ and a variance of $\vec{y}$.

165. The method of any of clauses 156-164, wherein the first set of variables correspond to a set of location on an ADI contour of the measured ADI feature, and the second set of variables correspond to a set of location on an AEI contour of the measured AEI feature.

166. The method of any of clauses 156-165, wherein the one or more sub-combination characterize an amount of deformation of an ADI contour of the measured ADI feature caused by a process performed on the measured ADI feature.

167. The method of clause 166, wherein the amount of deformation is a different between a given location of the ADI contour and a corresponding location of the AEI contour.

168. The method of clause 167, wherein the amount of deformation is characterized by a linear combination of the first set of variables.

169. The method of any of clauses 156-168, wherein the one or more sub-combination characterizes one or more of:
   a translation, in a specified direction, of the measured ADI feature;
   a critical dimension of the measured ADI feature;
   an elongation, in a specified direction, of the measured ADI feature;
   a triangularity of the measured ADI feature; and
   a rotation of the measured ADI feature.

170. The method of any of clauses 156-169, wherein the determining of the correlation is based on a sparsity constraint, which excludes one or more variables in the first set of variables or the second set of variables, the one or more variables associated with correlation value less than 0.01.

171. The method of any of clauses 156-170, wherein the measured ADI and the measured AEI is obtained via a metrology tool or a simulation process configured to generate an ADI feature and an AEI feature for an input target feature.

172. The method of clause 171, wherein the metrology tool is a scanning electron microscope (SEM) configured to capture an ADI and AEI of the substrate, the ADI comprising the ADI feature and the AEI comprising the AEI feature.

173. The method of clause 171, wherein the ADI comprises images obtained from a first and a second SEM measurement of the ADI feature, and the AEI comprises images obtained from a first and a second SEM measurements of the AEI feature.

174. The method of any of clauses 156-173, wherein the ADI feature comprises a feature of interest and one or more neighboring features.

175. The method of clause 174, wherein the first set of variables comprises a first sub-set of variables associated with the feature of interest and a second sub-set of variables associated with the one or more neighboring features.

176. The method of clause 175, wherein the combination or the one or more sub-combination of is a weighted sum of the first sub-set of variables associated with the feature of interest and the second sub-set of variables associated with the one or more neighboring features, wherein the weights assigned to variables of a neighboring feature is relatively higher than to variables of another neighboring feature away from the feature of interest.

177. The method of any of clauses 156-176, further comprising:
   adjusting, based on the correlation, the metrology tool settings to cause the correlation to improve.

178. The method of clause 177, wherein the metrology tool setting comprises at least one of: an e-beam intensity, an angle of incidence, voltage contrast, a SEM threshold, a pixel size, a scan speed, or a number of frames.

179. The method of any of clauses 156-178, further comprising:
   adjusting, based on the correlation, one or more parameters associated with a contour extraction algorithm to cause the correlation to improve.

180. The method of any of clauses 156-179, further comprising:
   adjusting, via simulating a patterning process and the etch process using the correlation, parameters associated with a resist process or the etch process to cause a yield of the patterning process to be greater than a specified yield threshold.

181. The method of any of clauses 156-180, further comprising:
   adjusting, via simulating a patterning process using the correlation, parameters related to a lithographic process to cause a performance metric of a lithographic apparatus to be within a specified performance threshold.

182. The method of clause 181, wherein the parameter of the patterning process comprises: dose or focus conditions associated with the lithographic apparatus.

183. The method of any of clauses 156-182, further comprising:
   monitoring a process quality based on selected combination of the first set of variables of the ADI features and their sensitivity to focus and exposure conditions; and
   adjusting one or more process parameters to maintain the process quality in a specified range.

184. The method of clause 183, wherein the monitoring comprises measuring relevant ADI contour properties of tip-to-tip pattern; and
   adjusting, based on the measured sensitivity and the correlation, the one or more process parameters to improve the tip-to-tip transformation of the ADI feature into the AEI feature.

185. A metrology tool comprising:
   a beam generator configured to measure an ADI feature after imaging a substrate and an AEI feature after etching the substrate; and
   a processor configured to:
      obtain a correlation between the measured ADI feature, and the measured AEI feature corresponding to the measured ADI feature printed on a substrate subjected to an etch process, the correlation being based on a combination of variables characterizing how the measured ADI feature transforms to the AEI feature; and
      adjust, based on the correlation, the settings of the metrology tool to cause the correlation to improve, the settings being determined based on a derivative of the correlation with respect to each setting, the derivative indicative of an improvement in the correlation per setting of the metrology tool.

186. The metrology tool of clause 185, wherein the metrology tool is a scanning electron microscope (SEM).

187. The metrology tool of clause 186, wherein the settings of the metrology tool comprises values of at least one of: an e-beam intensity, an angle of incidence, voltage contrast, a SEM threshold, a pixel size, a scan speed, or a number of frames.

188. The metrology tool of clause 186, wherein the beam generator is an electron beam generator.

189. The metrology tool of any of clauses 185-188, wherein the processor is further configured to:
   adjust, based on the correlation, one or more parameters associated with a contour extraction algorithm to cause the correlation to improve.

190. The metrology tool of any of clauses 185-188, wherein the one or more sub-combination characterizes one or more of:
   a translation, in a specified direction, of the measured ADI feature;
   a critical dimension of the measured ADI feature;
   an elongation, in a specified direction, of the measured ADI feature;
   a triangularity of the measured ADI feature; or
   a rotation of the measured ADI feature.

191. The metrology tool of clause 185, wherein the processor is further configured to:
   vary one or more process parameters associated with a patterning process; and
   obtain ADI and AEI image of the substrate patterned using the varied process parameters.

192. The metrology tool of claim 191, wherein the varied parameters comprises at least one of:
   an overlay via shifting a feature of a mask pattern used for patterning the substrate;
   an average CD, via resizing the feature of the mask pattern used for patterning the substrate;
   focus of a patterning apparatus; or
   dose of the patterning apparatus.

193. A method of training a model configured to determine an after etch image (AEI) based on an after development image (ADI), the method comprising:
   obtaining (i) an ADI of an imaged substrate, and (ii) an after etch image (AEI) after etching the imaged substrate;
   determining a correlation between a combination of a first set of variables of the ADI and a combination of a second set of variables of AEI, the first set and the second set of variables being grey scale values of the ADI and AEI, respectively; and
   training, based on the correlation, the model by including one or more sub-combinations of the first set of variables that have correlation values within a specified correlation threshold, the model being used to determine an AEI for an input ADI.

194. The method of clause 193, wherein the determining of the correlation comprises:
   computing the correlation using given values of (i) a first set of parameters associated with the combination of the first set of variables, and (ii) a second set of parameters associated with the combination of the second set of variables;
   determining whether the correlation is maximized; and
   responsive to the correlation not being in the specified range, adjusting the given values of the first set of parameters, and the second set of parameters until the correlation is maximized.

195. The method of any of clauses 193-194, wherein the training of the model comprising:
   (a) determining a sub-combination of the first set of variables and whether the correlation of the sub-combination is above a specified correlation threshold;
   (b) responsive to the sub-combination being above, including the sub-combination in the model; and
   (c) responsive to the sub-combination not being above, selecting another sub-combination of the first set of variables, and repeating step (a)-(c) for a specified number of iterations or until the sub-combination are exhausted.

196. A non-transitory computer-readable media comprising instructions that, when executed by one or more processors, cause operations to train a model configured to determine an after etch image (AEI) feature based on an after development image (ADI) feature, the operations comprising:
   obtaining (i) a measurement of an ADI feature imaged on a substrate, and (ii) a measurement of an after etch image (AEI) feature, corresponding to the measured ADI feature, on the substrate subjected to an etch process;
   assigning a first set of variables to characterize the measured ADI feature and a second set of variables to characterize the measured AEI feature;
   determining a correlation between a combination of the first set of variables of the measured ADI feature and a combination of the second set of variables of the measured AEI feature; and
   training, based on the correlation, the model by including one or more sub-combinations of the first set of variables that have correlation values within a specified correlation threshold, the model configured to be used to determine an AEI feature for an input ADI feature.

197. The non-transitory computer-readable media of clause 196, wherein the determining of the correlation comprises:
   computing the correlation using given values of (i) a first set of parameters associated with the combination of the first set of variables, and (ii) a second set of parameters associated with the combination of the second set of variables;
   determining whether the correlation is maximized; and
   responsive to the correlation not being maximized, adjusting the given values of the first set of parameters, and the second set of parameters until the correlation is maximized.

198. The non-transitory computer-readable media of clause 197, wherein the adjusting of the given values of the first set of parameters and the second set of parameters is performed until the correlation is within a specified range.

199. The non-transitory computer-readable media of any of clauses 196-198, wherein the training of the model comprising:
(a) determining sub-combinations of the first and second set of variables and whether the correlation of the sub-combination is above a specified correlation threshold;
(b) responsive to the sub-combinations being above, including the sub-combination in the model; and
(c) responsive to the sub-combinations not being above, selecting another sub-combination of the first set of variables, and repeating step (a)-(c) for a specified number of iterations or until the sub-combinations are exhausted.

200. The non-transitory computer-readable media of clause 199, wherein the specified correlation threshold is more than 0.01.

201. The non-transitory computer-readable media of any of clauses 196-200, wherein the combination or the one or more sub-combination of the first set of variables is a linear combination, a non-linear combination, or a machine learning model.

202. The non-transitory computer-readable media of clause 201, wherein the combination or the one or more sub-combination of the first set of variables is a weighted sum of the first set of variables, wherein the weights being positive values or negative values.

203. The non-transitory computer-readable media of any of clauses 196-202, wherein the combination or the one or more sub-combination of the second set of variables is a linear combination, a non-linear combination, or a machine learning model.

204. The non-transitory computer-readable media of clause 203, wherein the correlation is computed using following equation:

$$R^2 = \frac{\left(\overrightarrow{\alpha^T} \cdot <\overrightarrow{x}^T \otimes \overrightarrow{y}> \cdot \overrightarrow{\beta}\right)^2}{\left(\overrightarrow{\alpha^T} \cdot <\overrightarrow{x}^T \otimes \overrightarrow{x}> \cdot \overrightarrow{\alpha}\right)\left(\overrightarrow{\beta^T} \cdot <\overrightarrow{y}^T \otimes \overrightarrow{y}> \cdot \overrightarrow{\beta}\right)}$$

wherein $\overrightarrow{x}$ is a vector form of the first set of variables, $\overrightarrow{\alpha}$ correspond to the first set of parameters, $\overrightarrow{\alpha} \cdot \overrightarrow{x}$ comprises one or more combination of the first set of variables, $\overrightarrow{y}$ is a vector form of the second set of variables, $\overrightarrow{\beta}$ correspond to the second set of parameters, $\overrightarrow{\beta} \cdot \overrightarrow{y}$ comprises one or more combination of the second set of variables, a numerator of $R^2$ represents a covariance between $\overrightarrow{x}$ and $\overrightarrow{y}$, and a denominator represents a product of a variance of $\overrightarrow{x}$ and a variance of $\overrightarrow{y}$.

205. The non-transitory computer-readable media of any of clauses 196-204, wherein the first set of variables correspond to a set of location on an ADI contour of the measured ADI feature, and the second set of variables correspond to a set of location on an AEI contour of the measured AEI feature.

206. The non-transitory computer-readable media of any of clauses 196-205, wherein the one or more sub-combination characterize an amount of deformation of an ADI contour of the measured ADI feature caused by a process performed on the measured ADI feature.

207. The non-transitory computer-readable media of clause 206, wherein the amount of deformation is a different between a given location of the ADI contour and a corresponding location of the AEI contour.

208. The non-transitory computer-readable media of clause 207, wherein the amount of deformation is characterized by a linear combination of the first set of variables.

209. The non-transitory computer-readable media of any of clauses 196-208, wherein the one or more sub-combination characterizes one or more of: a translation, in a specified direction, of the measured ADI feature; a critical dimension of the measured ADI feature; an elongation, in a specified direction, of the measured ADI feature; a triangularity of the measured ADI feature; or a rotation of the measured ADI feature.

210. The non-transitory computer-readable media of any of clauses 196-209, wherein the determining of the correlation is based on a sparsity constraint, which excludes one or more variables in the first set of variables or the second set of variables, the one or more variables associated with correlation value less than 0.01.

211. The non-transitory computer-readable media of any of clauses 196-210, wherein the measured ADI and the measured AEI is obtained via a metrology tool or a simulation process configured to generate an ADI feature and an AEI feature for an input target feature.

212. The non-transitory computer-readable media of clause 211, wherein the metrology tool is a scanning electron microscope (SEM) configured to capture an ADI and AEI of the substrate, the ADI comprising the ADI feature and the AEI comprising the AEI feature.

213. The non-transitory computer-readable media of clause 212, wherein the ADI comprises images obtained from a first and a second SEM measurement of the ADI feature, and the AEI comprises images obtained from a first and a second SEM measurements of the AEI feature.

214. The non-transitory computer-readable media of any of clauses 196-213, wherein the ADI feature comprises a feature of interest and one or more neighboring features.

215. The non-transitory computer-readable media of clause 214, wherein the first set of variables comprises a first sub-set of variables associated with the feature of interest and a second sub-set of variables associated with the one or more neighboring features.

216. The non-transitory computer-readable media of clause 215, wherein the combination or the one or more sub-combination of is a weighted sum of the first sub-set of variables associated with the feature of interest and the second sub-set of variables associated with the one or more neighboring features, wherein the weights assigned to variables of a neighboring feature is relatively higher than to variables of another neighboring feature away from the feature of interest.

217. The non-transitory computer-readable media of any of clauses 196-216, further comprising:
adjusting, based on the correlation, the metrology tool settings to cause the correlation to improve.

218. The non-transitory computer-readable media of clause 217, wherein the metrology tool setting comprises at least one of: an e-beam intensity, an angle of incidence, voltage contrast, a SEM threshold, a pixel size, a scan speed, or a number of frames.

219. The non-transitory computer-readable media of any of clauses 196-218, further comprising:
adjusting, based on the correlation, one or more parameters associated with a contour extraction algorithm to cause the correlation to improve.

220. The non-transitory computer-readable media of any of clauses 196-219, further comprising:
  adjusting, via simulating a patterning process and the etch process using the correlation, parameters associated with a resist process or the etch process to cause a yield of the patterning process to be greater than a specified yield threshold.
221. The non-transitory computer-readable media of any of clauses 196-220, further comprising:
  adjusting, via simulating a patterning process using the correlation, parameters related to a lithographic process to cause a performance metric of a lithographic apparatus to be within a specified performance threshold.
222. The non-transitory computer-readable media of clause 221, wherein the parameter of the patterning process comprises: dose or focus conditions associated with the lithographic apparatus.
223. The non-transitory computer-readable media of any of clauses 196-222, further comprising:
  monitoring a process quality based on selected combination of the first set of variables of the ADI features and their sensitivity to focus and exposure conditions; and
  adjusting one or more process parameters to maintain the process quality in a specified range.
224. The non-transitory computer-readable media of clause 223, wherein the monitoring comprises measuring relevant ADI contour properties of tip-to-tip pattern; and
  adjusting, based on the measured sensitivity and the correlation, the one or more process parameters to improve the tip-to-tip transformation of the ADI feature into the AEI feature.
225. A non-transitory computer-readable media comprising instructions that, when executed by one or more processors, cause operations to train a model configured to determine an after etch image (AEI) based on an after development image (ADI), the operations comprising:
  obtaining (i) an ADI of an imaged substrate, and (ii) an after etch image (AEI) after etching the imaged substrate;
  determining a correlation between a combination of a first set of variables of the ADI and a combination of a second set of variables of AEI, the first set and the second set of variables being grey scale values of the ADI and AEI, respectively; and
  training, based on the correlation, the model by including one or more sub-combinations of the first set of variables that have correlation values within a specified correlation threshold, the model configured to be used to determine an AEI for an input ADI.
226. The non-transitory computer-readable media of clause 225, wherein the determining of the correlation comprises:
  computing the correlation using given values of (i) a first set of parameters associated with the combination of the first set of variables, and (ii) a second set of parameters associated with the combination of the second set of variables;
  determining whether the correlation is maximized; and
  responsive to the correlation not being in the specified range, adjusting the given values of the first set of parameters, and the second set of parameters until the correlation is maximized.
227. The non-transitory computer-readable media of any of clauses 225-226, wherein the training of the model comprising:
  (a) determining a sub-combination of the first set of variables and whether the correlation of the sub-combination is above a specified correlation threshold;
  (b) responsive to the sub-combination being above, including the sub-combination in the model; and
  (c) responsive to the sub-combination not being above, selecting another sub-combination of the first set of variables, and repeating step (a)-(c) for a specified number of iterations or until the sub-combination are exhausted.
228. A method for determining an after etch image (AEI) based on an after development image (ADI), the method comprising:
  obtaining an ADI of a substrate; and
  determining, via a trained model, an AEI by inputting the ADI to the trained model and outputting the ADI, the trained model being trained based on a correlation between a combination of a first set of variables of a measured ADI and a combination of a second set of variables of a measured AEI, the correlation being within a specified correlation threshold.
229. The method of clause 228, wherein the correlation is determined by
  computing the correlation using given values of (i) a first set of parameters associated with the combination of the first set of variables, and (ii) a second set of parameters associated with the combination of the second set of variables;
  determining whether the correlation is maximized; and
  responsive to the correlation not being maximized, adjusting the given values of the first set of parameters, and the second set of parameters until the correlation is maximized.
230. The method of any of clauses 228-229, wherein the trained model is obtained by:
  (a) determining sub-combinations of the first and second set of variables and whether the correlation of the sub-combination is above the specified correlation threshold;
  (b) responsive to the sub-combinations being above, including the sub-combination in a model; and
  (c) responsive to the sub-combinations not being above, selecting another sub-combination of the first set of variables, and repeating step (a)-(c) for a specified number of iterations or until the sub-combination are exhausted.
231. The method of any of clauses 228-230, wherein the combination or the one or more sub-combination of the first set of variables is a linear combination, a non-linear combination, or a machine learning model.
232. The method of clause 231, wherein the combination of the first set of variables is a weighted sum of the first set of variables, wherein the weights being positive values or negative values.
233. The method of any of clauses 228-232, wherein the combination of the second set of variables is a linear combination, a non-linear combination, or a machine learning model.
234. The method of any of clauses 228-233, wherein the ADI comprises an ADI feature, and the AEI comprises an AEI feature corresponding to the ADI feature, the AEI feature being determined via the trained model.
235. The method of any of clauses 228-233, wherein the trained model determines one or more of:
  a translation of a feature of the ADI in a specified direction;
  a critical dimension of the feature of the ADI;
  an elongation of the feature of the ADI in a specified direction;

a triangularity of the feature of the ADI; or
a rotation of the feature of the ADI.

236. A non-transitory computer-readable media comprising instructions that, when executed by one or more processors, cause operations to determine an after etch image (AEI) feature based on an after development image (ADI) feature, the operations comprising:
obtaining an ADI of a substrate; and
determining, via a trained model, an AEI by inputting the ADI to the trained model and outputting the ADI, the trained model being trained based on a correlation between a combination of a first set of variables of a measured ADI and a combination of a second set of variables of a measured AEI, the correlation being within a specified correlation threshold.

237. The non-transitory computer-readable media of clause 236, wherein the correlation is determined by
computing the correlation using given values of (i) a first set of parameters associated with the combination of the first set of variables, and (ii) a second set of parameters associated with the combination of the second set of variables;
determining whether the correlation is maximized; and
responsive to the correlation not being maximized, adjusting the given values of the first set of parameters, and the second set of parameters until the correlation is maximized.

238. The non-transitory computer-readable media of any of clauses 236-237, wherein the trained model is obtained by:
(a) determining sub-combinations of the first and second set of variables and whether the correlation of the sub-combination is above the specified correlation threshold;
(b) responsive to the sub-combinations being above, including the sub-combination in a model; and
(c) responsive to the sub-combinations not being above, selecting another sub-combination of the first set of variables, and repeating step (a)-(c) for a specified number of iterations or until the sub-combination are exhausted.

239. The non-transitory computer-readable media of any of clauses 236-238, wherein the combination or the one or more sub-combination of the first set of variables is a linear combination, a non-linear combination, or a machine learning model.

240. The non-transitory computer-readable media of clause 237, wherein the combination of the first set of variables is a weighted sum of the first set of variables, wherein the weights being positive values or negative values.

241. The non-transitory computer-readable media of any of clauses 236-240, wherein the combination of the second set of variables is a linear combination, a non-linear combination, or a machine learning model.

242. The non-transitory computer-readable media of any of clauses 236-241, wherein the ADI comprises an ADI feature, and the AEI comprises an AEI feature corresponding to the ADI feature, the AEI feature being determined via the trained model.

243. The non-transitory computer-readable media of any of clauses 236-242, wherein the trained model determines one or more of:
a translation of a feature of the ADI in a specified direction;
a critical dimension of the feature of the ADI;
an elongation of the feature of the ADI in a specified direction;
a triangularity of the feature of the ADI; or
a rotation of the feature of the ADI.

244. A method of determining an interpretation model associated with defectiveness of an after development image, the method comprising:
obtaining, via a metrology tool, (i) the after development image (ADI) of the imaged substrate at a given location, and (ii) an after etch image (AEI) of the imaged substrate at the given location; and
determining, based on the ADI and AEI, an interpretation model configured to identify portions of the ADI that explain defectiveness of a feature in the ADI.

245. The method of clause 244, wherein the determining the interpretation model comprises:
applying a local interpretable model-agnostic explanation approach to determine the interpretation model, the interpretation model using the ADI as input to generate an interpretation map that explains the defectiveness of the feature of the ADI.

246. The method of clause 244, wherein the determining the interpretation model comprises:
determining correlation data between the ADI and AEI; and
performing, using the correlation data, a principal component analysis, or discriminant analysis to determine eigenvectors whose eigenvalues are above a specified threshold.

247. The method of clause 246, further comprising:
projecting, the ADI, on the eigenvectors to compute a classification value; and
responsive to the classification value exceeds a specified threshold, identifying the portion of the input ADI as explaining the defectiveness of the feature within the input ADI.

248. A non-transitory computer readable media for determining portions of an after development image related to defectiveness of a feature, comprising instructions that, when executed by one or more processors, cause operations comprising:
receiving an after development image (ADI) of a patterned substrate;
inputting the ADI into an interpretation model, wherein the interpretation model is trained determine portions of the ADI that explain defectiveness of a feature of the ADI; and
generating, via the interpretation model, data associated with one or more portions of the ADI that explain defectiveness of a feature of the ADI.

249. A system for determining portions of an after development image explaining defectiveness of a feature, the system comprising:
storage circuitry configured to store an interpretation model, wherein the interpretation model is trained to determine portions explaining defectiveness of a feature based on a set of training data comprising an after development image (ADI) and an after etch image (AEI) of a pattern;
control circuitry configured to:
receive an ADI of a patterned substrate;
input the ADI into the interpretation model;
generate, via the interpretation model, data associated with one or more portions of the ADI that explain defectiveness of a feature of the ADI; and
input/output circuitry configured to display on a display device the generated data.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

The descriptions above are intended to be illustrative, not limiting. Thus, it will be apparent to one skilled in the art that modifications may be made as described without departing from the scope of the claims set out below.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

The invention claimed is:

1. A method of training a model configured to predict whether a feature associated with an imaged substrate will be defective after etching of the imaged substrate, the method comprising:
obtaining, via a metrology tool, (i) an after development image of the imaged substrate at a given location, the after development image including a plurality of features, and (ii) an after etch image of the imaged substrate at the given location, the after etch image including etched features corresponding to the plurality of features; and
training, using the after development image and the after etch image, the model configured to determine defectiveness of a given feature of the plurality of features in the after development image,
wherein the determining of defectiveness is based on comparing the given feature in the after development image with a corresponding etch feature in the after etch image.

2. The method of claim 1, wherein the model is an empirical model or a machine learning model, wherein the empirical model is a function of a physical characteristic of the feature associated with the imaged substrate.

3. The method of claim 1, wherein the obtaining of the after development image comprises:
imaging, via a patterning apparatus, a mask pattern on a substrate;
obtaining a developed substrate of the imaged substrate;
aligning the metrology tool to the developed substrate at a given location; and
capturing an image of the developed substrate.

4. The method of claim 1, wherein the obtaining of the after etch image comprises:
etching, via an etch process with specified etch conditions, the imaged substrate;
aligning the metrology tool to the etched substrate at the given location; and
capturing the after etch image of the etched substrate.

5. The method of claim 4, wherein the etch conditions include etchant composition, plasma gas parameters, etching rate, electro-magnetic fields, a plasma potential, an inductive or a capacitive type of etching, a temperature of the substrate, ion energy distribution, ion angular distribution, sputtering and redeposition rates, or a combination thereof.

6. The method of claim 1, wherein the training comprises:
aligning, based on the plurality of features, the after development image and the after etch image;
comparing each of the features of the plurality of features in the after development image with a corresponding feature of etched features in the after etch image;
determining, based on the comparison, whether a given etched feature in the after etch image satisfy a defect condition;

responsive to not satisfying the defect condition, classifying the given etched feature as defective; and
adjusting a model parameter value of the model based on the defectiveness of the given etched feature.

7. The method of claim 6, wherein the adjusting of the model parameter value includes adjusting values of a plurality of model parameters.

8. The method of claim 6, wherein the defective condition is a physical characteristic of the given etched feature in the after etch image.

9. The method of claim 8, wherein the physical characteristic is at least one of:
   a critical dimension of the given etched feature; or
   a displacement of the given etched feature with respect to the given feature of the after development image.

10. The method of claim 1, wherein the defectiveness is characterized by at least one of:
    a binary determination of defective or not defective; or
    a probability of the given feature being defective.

11. The method of claim 2, wherein the machine learning model is a convolution neural network.

12. The method of claim 11, wherein a plurality of model parameters are weights or biases associated with one or more layers of the machine learning model.

13. The method of claim 12, wherein the plurality of model parameters being weights or biases includes the model parameters being weights and biases.

14. The method of claim 1, wherein the metrology tool is an optical microscope or an electron beam microscope.

15. A system for determining a fraction of features that will fail after etching, the system comprises:
    a metrology tool for capturing an after development image (ADI) of a substrate at a given location, the after development image including a plurality of features; and
    a processor configured to:
        execute a model for determining failure rates of the plurality of features of ADI that will fail after etching,
    wherein the model is a combination of (i) a first probability distribution function configured to estimate a distribution of physical characteristic values for non-failing holes, and (ii) a second probability function configured to determine failure rates based on physical characteristic values of all the plurality of features of the ADI.

* * * * *